United States Patent [19]

Laplace, Jr. et al.

[11] Patent Number: 4,612,617

[45] Date of Patent: Sep. 16, 1986

[54] METHOD AND APPARATUS FOR MONITORING INSTANTANEOUS ELECTRICAL PARAMETERS OF A POWER DISTRIBUTION SYSTEM

[75] Inventors: Carl J. Laplace, Jr., Covington; Conrad F. Williams, New Orleans, both of La.

[73] Assignee: Siemens-Allis, Inc., Atlanta, Ga.

[21] Appl. No.: 471,302

[22] Filed: Mar. 2, 1983

[51] Int. Cl.[4] .............................................. G06F 15/56
[52] U.S. Cl. ...................................... 364/483; 364/492
[58] Field of Search ............... 364/492, 493, 483, 481; 323/256, 260; 324/76 R

[56] References Cited

U.S. PATENT DOCUMENTS

| | | | |
|---|---|---|---|
| 4,006,413 | 2/1977 | Silberberg | 364/483 X |
| 4,041,288 | 8/1977 | Conway et al. | 364/483 |
| 4,298,939 | 11/1981 | Fluegel | 364/492 X |
| 4,346,346 | 8/1982 | Silberberg | 364/483 X |
| 4,388,611 | 6/1983 | Haferd | 364/483 X |
| 4,389,708 | 6/1983 | Baldock | 364/483 X |
| 4,396,986 | 8/1983 | Salesky | 364/483 |
| 4,403,292 | 9/1983 | Ejzak et al. | 364/492 |
| 4,419,619 | 12/1983 | Jindrick et al. | 364/483 X |

Primary Examiner—Edward J. Wise
Attorney, Agent, or Firm—F. W. Powers; J. L. James

[57] ABSTRACT

A method and a device for monitoring instantaneous electrical parameters of a power distribution system under load utilizing digital control means. An analog signal equivalent to such a parameter is sensed and rated down for processing by solid state components. This signal is converted into a binary coded digital signal having n digits. A plurality of digital signals is sampled and squared values with a format of 2n digits are derived from each sample. The squared values of one sampling period are accumulated to a sum value composed of 2n+m digits and the square root comprising n+k digits of the sum is taken. This value is rescaled to a true root mean square value by performing k left shifts as an accurate measurement result. The core of such device is represented by a microcomputer with built-in analog-to-digital converter.

23 Claims, 15 Drawing Figures

METHOD AND APPARATUS FOR MONITORING INSTANTANEOUS ELECTRICAL PARAMETERS OF A POWER DISTRIBUTION SYSTEM

BACKGROUND OF INVENTION

The invention is related to a method for measuring instantaneous electrical parameters of power distribution systems utilizing digital control means and to a programable control apparatus performing such method.

The power source of a typical distribution system is a generator producing a large quantity of power at medium voltage level. The power is stepped up by a transformer and sent over a transmission line. At the other end of the transmission line a step-down transformer is provided for transforming the power down to a sub A transmission level for distributing it to widely scattered distribution substations. In the individual substation the power is again stepped down and fed out onto distribution feeders which include distribution transformers for transforming the feeder power to 120/240 volts eventually supplied to individual customers.

The entire function of such a distribution system is to deliver power to the end user at a voltage within acceptable limits; this is easily understood when considering that all electrical appliances are designed for optimum performance if supplied by power of a specific voltage level and a fixed frequency.

The frequency is here of less concern, since it can be kept a constant solely by regulating the power source, whereas it is one of the basic constraints of a power distribution system to supply a rated voltage to each individual customer. Within the system, measurements are taken for evaluating instantaneous load conditions and for adjusting accordingly the operation characteristics of the distribution system in order to supply such rated voltage to the individual customer independent from changing load conditions of the system.

Large distribution systems do not solely rely upon generator regulators for such purpose, more often additional measures are taken for correcting the voltage at various locations throughout the system. A variety of measures are conventionally utilized for such voltage regulation controlling the output voltage at specific points of the distribution system based upon the current line resistances and reactances and the instantaneous load condition. Voltage regulators are primarily used at sub-transmission level or on distribution feeders between the substations and the consumer.

Merely for the purpose of illustration, a well known type of voltage regulator, the single- or three-phase auto-transformer with voltage regulating tabs in one of the windings and including a motor driven tab-changing mechanism may be mentioned. The auto-transformer basically is a transformer in which primary and secondary windings are coupled both mechanically and electrically for producing a regulated step-up or step-down voltage. Since sudden boosts in voltage on a circuit would have adverse effects, a fine regulation of conventionally 32 voltage steps within a range from 10% below to 10% above normal voltage are provided. Since a manually controlled regulator would have little utility, it is imperative to have the tab position of the regulator controlled automatically by a control device that is sensitive to the output voltage of the regulator. For this reason, the regulator adjustment mechanism typically includes self-positioning, spring driven contacts loosely coupled to a driving motor or electrically positioned contacts directly geared to this motor. The operation of the motor drive is controlled by a control unit that evaluates the output characteristics of the regulator in order to raise or lower the same to a predetermined level.

Conventionally, such control units are designed as analog electronic devices which include electrical circuits for sensing the output voltage of the regulator, for compensating a line voltage drop, and for providing a time delay function. The voltage censing circuit is connected to the output circuit of the auto-transformer through a scaling potential transformer and evaluates the instantaneous output voltage with respect to a predetermined voltage in order to derive an output signal governing the motor of the tab changing mechamism. Since regulators are usually located remotely from the load center, even a constant output voltage cannot prevent the load current flowing through the line from the regulator to the load center to cause an additional drop in voltage. This voltage drop is proportional to the changing load current, however the voltage regulator can be adjusted to correct for this drop in voltage between the regulator and load center by an appropriately set line drop compensator circuit. A current proportional to the line current is circulated through the line drop compensator by means of a current transformer inserted into the load circuit.

The initiation of a raising control action and a lowering control action, are spaced apart by a voltage zone which is known as the voltage bandwidth. This bandwidth must be higher than the minimum correction obtainable through the regulator, or hunting of the regulator will result. Furthermore, hunting of the regulator is limited by the time delay circuit which purpose is to withhold a tap-changing signal for a certain period of time even when the output voltage is outside of the voltage limit. The delay time is usually adjustable and may be set in intervals of seconds in a range of 10 to 120 seconds.

The conventional analog control devices may have additional features such as voltage reduction to cause the set voltage point to be lowered, or limiting the maximum output voltage for protecting users near the transformer, or measures for operation under reverse flow condition. Optional features usually require additional circuitry.

Such conventional analog control devices have been proven reliable and cost effective for a plurality of applications, however, since any analog circuit just can serve a special purpose, desirable optional features of such a control unit necessitate additional circuitry which more often compel a complete redesign of the basic unit. Therefore, conventional analog control units very often are constructed to fulfill just basic requirements. This may be illustrated by means of some examples. Even though line voltage and current information is made available in the control unit necessarily, such data is not accessable to an operator without additional circuitry or metering equipment. With line current and voltage information available, other power system data could be derived including real power, reactive power, and power factor. The conventional analog control unit does not include the means to easily visualize such parameters. Furthermore, analog control units are not general purpose units, they are designed for a specific purpose and not easily adjustable for different applications. This shows that the conventional analog control units have limitations and disadvantages.

For this reason, more recently digital control units including a programable processing unit have been proposed. One of the major advantages of digital control units is that such units can be designed more generically. Digital control devices may include basic features which can be utilized in a variety of applications for sensing, measuring and processing of a plurality of electrical parameters within power distribution systems and can provide a complete series of tools for monitoring and controlling the performance of a power distribution system. The generalized hardware structure of such a control unit is a powerful means for lowering the cost for many applications without requiring a redesign and even more expensive special purpose devices may become superfluous.

Such a digital control unit has been disclosed in a conference paper "Microprocessor-Based Control of Transformer Tap Changing" presented by J. Jindrick and N. Nohria at the Pacific Coast Electrical Association Engineering and Operating Conference, San Francisco, March 1982. A reprint was published by McGraw-Edison Company, Pittsburgh, Pa. The article outlines concepts of possible approaches for a digital control unit based upon either a single-chip micro-computer, a single-board computer, or a bus-oriented computer system and evaluates such different design concepts. The single-chip micro computer approach is believed to have limited flexibility and is, therefore, not to favored despite the lowest possible cost. On the other hand, the bus-oriented computer approach having various functional modules is believed to provide a virtually unlimited amount of flexibility with the constraint of higher cost. Accordingly, from the authors point of view the single-board computer concept has been selected as the most feasible design concept. The control unit includes a data-acquisition section which provides a data base for the microprocessor calculating desired power system information. The data acquisition section includes a 12 bit successive approximation analog-to-digital converter which is used to translate analog line voltage and current values obtained from the distribution system into digital information. A sample-and-hold circuit freezes the data during conversion. The obtained samples are then processed using a fast fourier transform (FFT) to determine the real and imaginary values of an input signal. An 8-channel multiplexer is provided to select up to eight channels of analog information which is scaled to values the multiplexer, the sample-and-hold circuit and the analog-to-digital converter can accept. Also, a timer is included which determines the precise instant when new data is to be acquired.

A number of other inputs and outputs to the computer are implemented including outputs to the tap-changing mechanism for use with either electric mechanical relays or solid-state relays. There are also provisions for inputs and outputs to other utility equipment such as an over/under frequency output for breaker or switch control in cogeneration applications.

The key to the flexibility of the proposed digital control unit is the ability of the microprocessor system to multiplex its hardware resources among several tasks. From the authors point of view, it is necessary to supply sophisticated software to support basic system operations, such as input/output timing, communications and data management. This software includes a data acquisition module governing the sampling of three analog input signals such as output voltage, output current and the differential voltage between input and output of the regulating transformer. The core of the software is a regulating module which processes all input information from every source to determine corresponding output signal. The input information to this module includes the described analog information and control parameters, such as rated voltage, bandwidth, line-drop compensation and time-delay values. An output software module supplies the proper signals to start a tap change; this module may also monitors the motor current to determine that the tap change in fact took place. Various other software modules are included for calculating desired power system information and from the authors point of view the software of a microprocessor regulating control will continue to evolve as additional features are defined and added to the control. Therefore, it is believed that the module approach is the most feasible approach to easily add new features.

While the proposed digital control represents a first step for replacing conventional analog electro-mechanical control units by programmable units in order to obtain a higher flexibility, further steps have to be taken to make the most efficient use of this digital technology. The flexibility of a microprocessor based control unit is but one advantage; certainly the cost factor is also of importance, but considering the remote installation of such control unit reliability is the most decisive factor. For this reason, a virtually unlimited amount of flexibility is less important than a simple, dependable hardware structure aiming at straight forward solutions of design objectives and still offering possibilities for including optional features which may enhance the power of such a tool. It may be emphasized that in contrast to quite a variety of applications of sophisticated digital equipment which accordingly needs more and more maintenance, digital equipment for this group of applications in rugged surroundings is required to be dependable in a wide temperature range almost without any maintenance. Furthermore, such digital equipment for use with power distribution systems should have at least some self-testing capabilities for eliminating basic souces of error which could cause the power distribution system to run out of control.

SUMMARY OF THE INVENTION

It is therefore a main object of the present invention to provide an improved method for monitoring instantaneous electrical parameters being present in an electrical circuit of a power distribution system under load by utilizing digital control means adapted to be connected to such electrical circuit.

A further object of the present invention is to provide a device suitable for performing such method and being designed for high reliability without the need of continuous maintenance.

Another object of the present invention is to provide such device utilizing digital technology and thereby achieving a high system flexibility.

A further object of the present invention is to provide such a method and a device for performing the same which make use of digital techniques and corresponding integrated components in a most efficient manner for achieving both low cost and simplicity of the circuit design yielding high performance reliability.

Another object of the present invention is to provide such monitoring device based upon a small microcomputer together with built-in hardware circuitry which design allows to achieve the desired flexibility by programming, however avoids undue software overhead by relying on hardware features whenever applicable within the concept of the hardware-software-system.

Still another object of the present invention is to implement such method and the corresponding device such that the novel equipment represents a direct replacement of existing control devices and still offers the possibility of adding optional features if desirable without redesign and undue burden on the basic implementation.

These objects, as well as other objects which will become apparent from the description which follows, are achieved by an improved method for monitoring instantaneous electrical parameters being present in an electrical circuit of a power distribution system under load and utilizing digital control means adapted to be connected to the electrical circuit, wherein such method includes sensing of the present load condition of the electrical circuit and deriving an equivalent analog signal constituting one electrical characteristic of the electro-motive power present in the circuit. This analog signal is rated down to a range suitable for processing by an integrated electronic circuit and converted into a binary coded digital signal comprising a value of n digits. A plurality of subsequent binary digital signals is sampled during a sampling period and from each of the sampled digital signals a respective squared value with a format of 2n digits is derived. The squared values obtained during one sampling period are accumulated to a sum value composed of $2n+m$ digits. A square root value is formed of the sum value, wherein the square root value comprises $n+k$ digits. Finally the square root value is rescaled to a true root mean square value by performing k left shifts on the square root value and the true root means square value is stored.

The equivalent analog signal maybe either the magnitude of the voltage present at test points of such an electrical circuit or the instantaneous electrical current flowing through such circuit. In both cases the method is designed for measuring the true square root value of such signals. The method is specifically designed for being performed by means of a small microcomputer, such microcomputers normally have just an 8 bit bus structure. The limited format of an 8 bit word means a limitation in terms of accuracy, as can easily be illustrated. An 8 bit format allows for encoding 256 different values. If such format is utilized to represent the magnitude of a voltage of 120 V nominal, it can be easily understood that the difference between subsequent steps of an 8 bit format represents 0.5 V. Such pattern of subsequent 0.5 V steps is much to coarse to suffice the normal accuracy requirements for measuring electrical characteristics in power distribution applications. In general, an accuracy of 0.1 V is required and is reached by conventional monitoring devices.

The novel method in accordance with the present invention includes specific measures to overcome this limitation by extending the format to more than 8 bits even if the hardware structure of the digital control means implemented by an 8 bit microcomputer does not easily comply with such accuracy requirements. In this manner, the method in accordance with the present invention allows to derive a true root mean square value of the sensed analog signal having more than eight bits and is nevertheless designed for use with just an inexpensive small microcomputer.

The characteristic of the present invention will become more apparent from a preferred embodiment wherein the digital signal which represents a converted form of the sensed analog signal is provided in a format of an 8 bit word and accordingly the values derived therefrom are based on an 8 bit format. The variable n thus equals the number 8 and variables k and m are integers smaller than n. Under these assumptions the sum value representing the accumulation of the squared values obtained during one sampling period is extended to a full word format by means of multiplying this sum value in order to achieve an extended sum value with variable n equaling 8 and correspondingly variable k of the square root value equaling 4. What is practically achieved thereby as that the limitation of a small microcomputer with an 8 bit bus structure is overcome to yield the accuracy requirements for monitoring electrical parameters in power distribution system.

In accordance with another preferred embodiment of the present invention this monitoring method is especially powerful for use with voltage regulator means of a power distribution system wherein the electrical circuit includes a step-change voltage regulator feeding a distribution line. This voltage regulator has control inputs for receiving control signals for readjusting the magnitude of the actual output voltage to a predetermined nominal value. For this reason the stored value constituting the magnitude of the actual output voltage is compared with the predetermined nominal output value. Respective control signals are derived from this comparison for stepwise lowering the magnitude of the output voltage by means of the voltage regulator, if the actual output voltage is above the nominal value and for stepwise raising the magnitude of the output voltage, respectively if the actual output voltage is below said nominal value. In this application, the monitoring method in accordance with the present invention is utilized for actually measuring the instantaneous load conditions of the distribution line and for controlling changes of this line in accordance with predetermined parameters to maintain nominal characteristics on the line.

Another preferred embodiment of the present invention constitutes an electronic device for performing the method wherein for converting the rated analog signal into a binary coded digital signal, for sampling a plurality of such digital signals during a sampling period, for deriving from such digital signals respective squared value, for forming the square root value and for rescaling this square root value an 8 bit microcomputer is utilized which has an analog input and outputs. The analog input is connected to receive the rated analog signal and an analog to digital converter is integrated into the microcomputer and connected to this analog input. The use of such a microcomputer has the advantage of being able to process analog signals which just have to be rated in accordance with the range of voltages suitable for such a solid state circuit. In this manner, the discrete networks forming interfaces of the microcomputer to the monitored electrical circuit can be of a very simple and straight-forward design; which is of major importance if the monitoring device is utilized at remote locations in the field and continuous maintenance is not justified because of high cost. The only limitation is that the built-in analog-to-digital converter is specifically designed for the 8 bit bus structure of the microcomputer and therefore is of just limited accuracy. This accuracy problem however is overcome by the under-lying concept of the method as outlined above.

In summary, the present invention does not only provide a microcomputer based monitoring an control device for use with power distribution systems but is specifically tailored to such an application in order to make the most efficient use of the limited hardware and software capabilities of such a microcomputer. The monitoring device can be used as a direct replacement of corresponding conventional devices and offers, in addition, a flexibility of a microcomputer based design for a plurality of optional features which could not be as easily implemented by a discrete hardware structure.

BRIEF DESCRIPTION OF THE DRAWINGS

A better understanding of the invention may be had by reference to the following description of perferred embodiments in conjunction with the accompanying drawings, in which.

DESCRIPTION OF PREFERRED EMBODIMENTS

Figure 1:
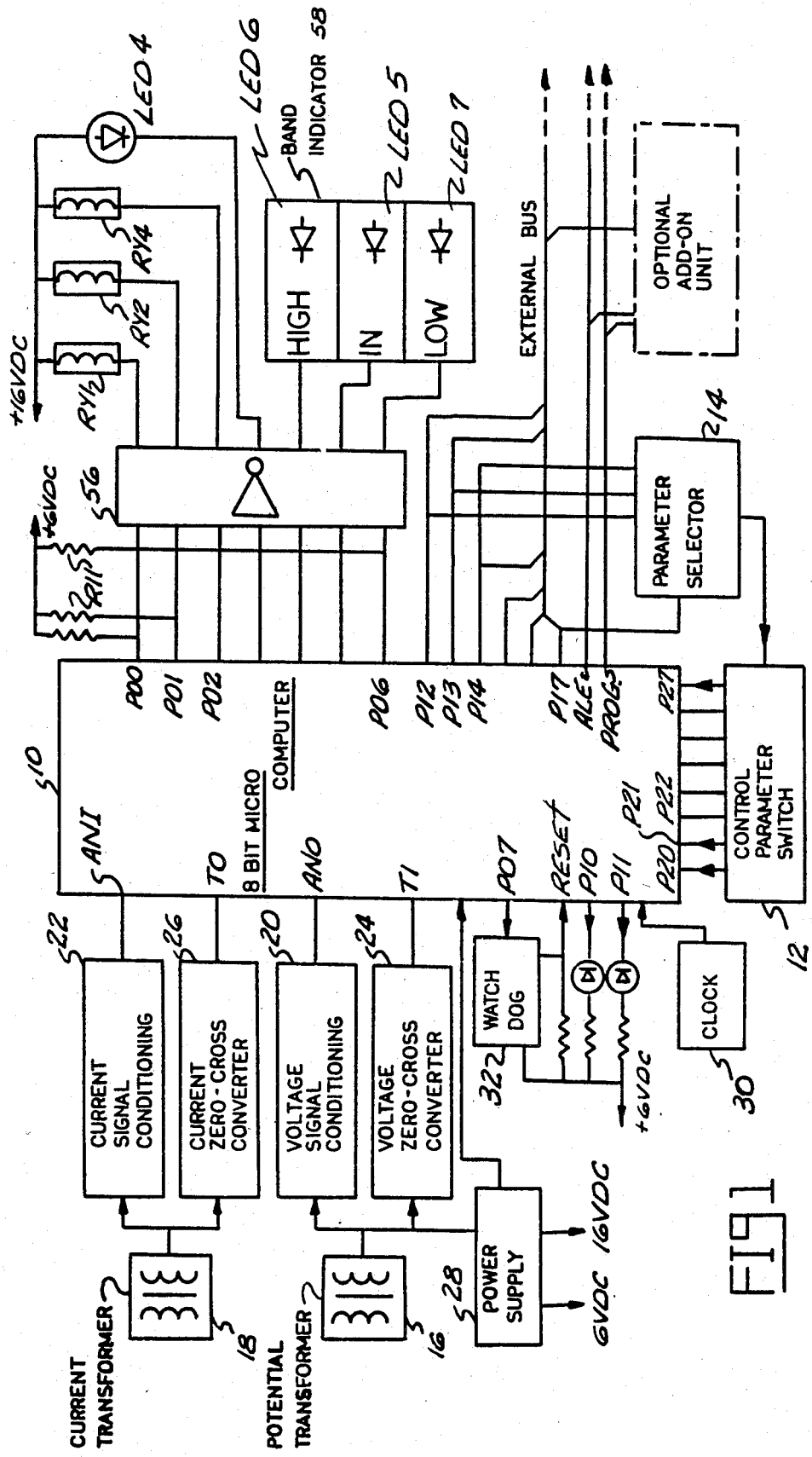
FIG. 1 shows a block diagram schematically representing a control unit including a microcomputer with analog inputs, the microcomputer providing the main control functions and representing input/output interface units of the same to a power distribution system.

A control unit designed for measuring instantaneous values of the electrical characteristics of a power distribution sytem, and for processing such values to derive corresponding output signals is represented in FIG. 1 together with the necessary interface units. The core of the control unit is a single-chip microcomputer 10. Several suitable micrcomputers are commercially available; the chosen microcomputer 8022 which is one of the members of the Intel MCS-48 mcirocomputer family has sufficient memory capacity, includes a built-in analog-to-digital converter, zero-cross detection capability and has a powerful input/output system. However, similar microcomputers with corresponding capabilities are available and could replace this microcomputer. Furthermore, Intel provides sufficient documentation such a user manuals and application notes for the design engineer such that a separate detailed description of the microcomputer as such is deemed not to be necessary. For this reason details of the structure and the operation of the microcomputer will be given in the following only to the extent necessary for a better understanding of the present invention.

The microcomputer has a three input/output ports P0, P1, and P2, respectively. Each of these input/output ports is schematically illustrated in the block diagram of FIG. 1 by correspondingly referenced pins; in this manner pins P00 through P07 represent the eight inputs-/outputs of port P0; pins P10 through P17 depict the bidirectional inputs and outputs of port P1 and the pins P20 through P27 illustrate the third port P2. In the present application the first port P0 is used to supply output control signals as will be described later in more detail. The second port P1 is utilized internally for selecting predetermined control input parameters governing the operation of the control unit. In addition, the port P1 may form an external data and address bus if optional features are added to the control unit which optional features are implemented on a separate printed circuit board.

The mentioned control input parameters are represented by the setting of various multi-connector switches 12 schematically shown in FIG. 1 which will be described later in more detail. For the present overview it may be sufficient to outline that a parameter selector 14 which may be implemented as 3-to-8 decoder decodes address information transmitted through the input/output port P2 into a select signal for a corresponding one of the control parameter switches 12. The coded setting of the selected switch is then furnished to the microprocessor through the third input/output port P2.

In addition, the microcomputer 10 has two analog inputs AN0, AN1 respectively and two test inputs T0 and T1, respectively. Each of these analog inputs receives an individual analog input signal corresponding to the instantaneous output voltage and the output current, respectively of a voltage regulator installed within a power distribution system. As schematically indicated, a signal proportional to the output voltage is furnished by a conventional potential transformer 16 installed in the output line of a voltage regulator, not shown. Correspondingly a current transformer 18 supplies an input signal corresponding to the instantaneous value of the load current flowing in the output line of such voltage regulator.

These two signals both representing the current load condition at the output side of the voltage regulator comprise the basic input information to the control unit. The potential signal and the current signal each are supplied through a respective one of signal conditioning circuits 20 and 22, to a corresponding one of the two analog inputs AN0 and AN1 of the microcomputer 10. The analog inputs are internally connected to a analog-to-digital converter implemented in hardware within the microcomputer 10 and not separately illustrated. This converter is designed for successive approximation to covert the analog input signal into a corresponding binary signal.

In addition, each of these scaled analog input signals is supplied through a corresponding conditioning network designated as zero-cross converter 24 and 26, respectively to a respective one of the test pins T0 and T1. This latter circuit arrangement provides a zero-cross signal path to be described later in more detail.

Furthermore, FIG. 1 illustrates schematically several other circuits which are necessary for the desired operation of the microcomputer 10. These circuits include a power supply network 28 which is connected to receive AC voltage from the potential transformer 16 and furnishes the direct current voltages necessary for operating the control unit as schematically indicated. The timing of the operation of the microcomputer 10 is based upon an external clock circuit 30; and self-starting capabilities of the control unit are represented by a watchdog circuit 32.

After this outline of the structure of the control unit a more detailed description of the hardware circuits surrounding the microcomputer 10 will be more easily apprehended.

Figure 2:
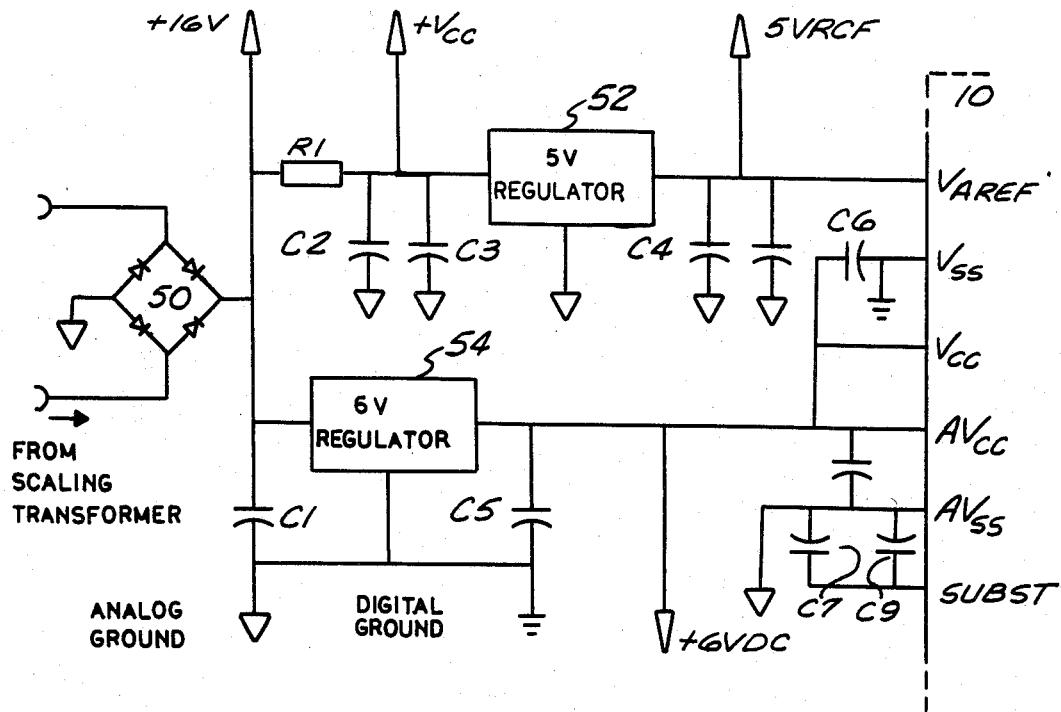
FIG. 2 represents a circuit diagram of a power supply network for use with the control unit of FIG. 1.

In order to render the control unit operable, as mentioned, the power supply network 28 is provided which is designed to receive AC voltage from the potential transformer 16 in order to furnish the necessary DC voltages for the control unit as shown in more detail in a circuit diagram of FIG. 2. The secondary voltage of the potential transformer 16 —shown in FIG. 1—is received at two inputs of a rectifier bridges 50 having an output connected to ground through a filter capacitor C1. Under normal operating conditions the primary winding of the potential transformer may receive an unregulated voltage varying from 90 to 145 V. In accordance with the winding ratio of the potential transformer 16 this variation will then result in an approximate 12 to 20 VDC minimum to maximum swing at the output of the rectifier bridge 50 accordingly designated as nominal +16 VDC.

It may be noted that this unregulated voltage provides the main supply voltage for various subsections of the control unit, such as the voltage signal conditioning circuit 20 and the current signal conditioning circuit 22 which derive the power from this voltage source through the RC circuit composed of resistor R1 and another filer capacitor C2 connected to ground. This RC circuit provides additional filtering and decoupling of the supply voltage designated $V_{cc}$ and furnished at a connector tap of this RC circuit.

A 5 V reference source including a conventional 5 V regulator 52 and further filter capacitors C3 and C4, respectively is connected to this connector tap to satisfy the analog/digital reference requirements of microcomputer 10. A calibration of this voltage source is not required since its initial accuracy obtained from any suitable commercially available voltage regulator will be sufficient. In accordance with the manufacturer's pin assignment of the microcomputer 10 the output of this reference voltage source is designated $V_{AREF}$.

In a similar manner, the unregulated +16 VDC voltage source is connected to an input of a further voltage regulator, a 6 V regulator 54 having an output connected to digital ground through a further filter capacitor C5 providing additional filtering. This is the main +6 VDC supply source. Under most conditions the load of this voltage source may be rather high and appropriate measures have to be taken for providing proper heat sink characteristics whenever the 6 V regulator 54 is under full load. Finally, the power supply circuitry includes further capacitor C6, C7, C8 and C9 which provide the necessary power supply by-passing for both the analog and digital power inputs of the microcomputer 10. The corresponding outputs of the power supply network are again designated with reference symbols in accordance with the manufacturer's pin assignment of the microcomputer 10.

Figure 3:
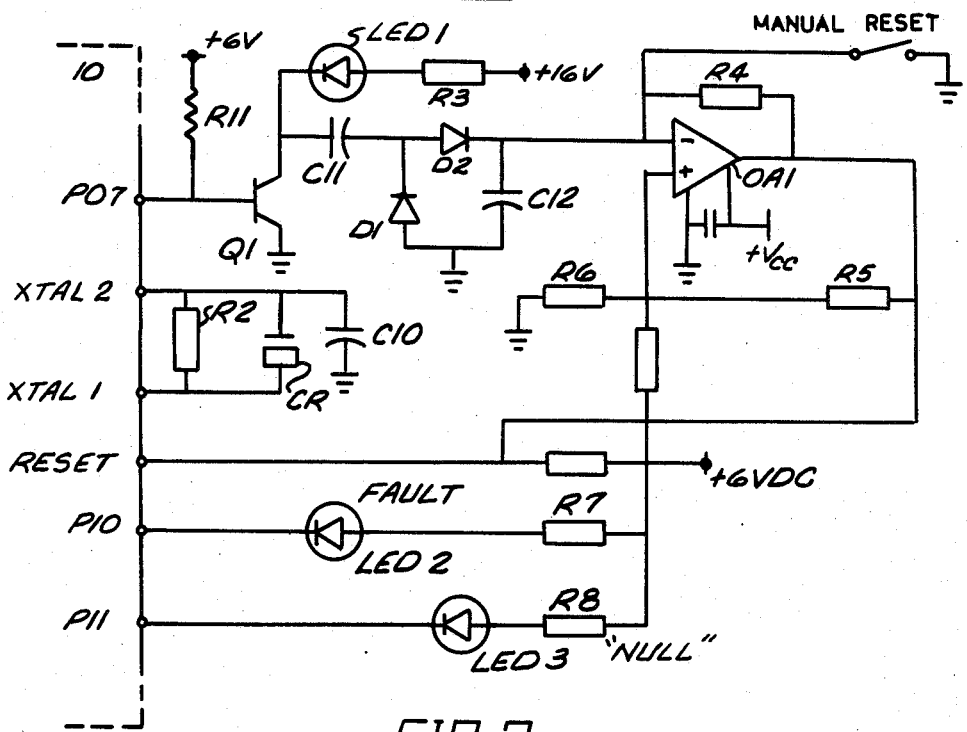
FIG. 3 shows a circuit diagram of control logic circuitry for the control unit of FIG. 1 including a timing network and a watchdog circuit.

A timing control citcuit referenced as clock circuit 30 and the watchdog circuit 32 both shown schematically in FIG. 1 are illustrated in more detail in FIG. 3 in conjunction with the respective input section of the microcomputer 10. The chosen microcomputer contains clock and oscillator circuitry and requires only one external timing control element to generate all internal timing signals. The microcomputer 10 has two clock inputs referenced as XTAL1 and XTAL2, respectively. In accordance with the manufacturer's instruction, a parallel circuit comprising a further resistor R2 and a crystal CR isconnected to these two inputs. In addition, a further capacitor arranged between the second clock input XTAL2 and digital ground is provided to increase the immunity of the microprocessor 10 to line transient noise or other unwanted signals which may find their way into the control unit. An oscillator frequency of 3.00 MHz is chosen in accordance with the manufacturer's instruction, thereby designating an internal instruction cycle time of 10 microseconds. This timing allows for maximum operating speed of the selected microcomputer 10 over the desired temperature range for industrial use. The internal timer of the microcomputer 10 is an 8-bit counter and accordingly an overflow occurs after 8,192 counts which corresponds to a time interval of 81.9 milliseconds between two overflows. This timing scheme enables accurately monitoring of elapsed time and provides for a simple hardware replacement of software overhead, as will become a more apparent later.

The remaining circuitry shown in FIG. 3 comprises basically the watchdog circuit 32. For a better understanding of this function it may be recognized that bit 7 appearing at pin PO7 of the first input/output port P0 is designated as a watch dog timer flag bit which is complemented when the selected path task of the microcomputer 10 is complete. When the software structure is established in such a manner that normally each task of the microcomputer is finished within the mentioned overflow period of 82 milliseconds the path flag will normally be reset after completion of the task. As will be understood, this scheme results in a 6 Hz square wave supplied at pin PO7 under normal operating conditions. The output signal drives a transistor Q1 and appears correspondingly at its collector output. A light emitting diode LED1 and a load resistor R3 are connected in series between this collector and positive supply voltage +16 V which is generated as described above. Accordingly, in a normal operation condition the light emitting diode LED1 flashes with frequency of 6 Hz.

Furthermore, an operational amplifier OA1 is provided in the watchdog circuit and has a negative input connected to the collector of the transistor Q1 through the series connection of a further capacitor C11 and of a bias network comprising diodes D1, D2 and a further capacitor C12. The amplifier stage also includes a feedback resistor R4 arranged between the output of the operational amplifier OA1 and its negative input. A further resistor R5 is arranged between the output of the operational amplifier OA1 and its positive input; the same input, in addition, is connected to ground through a further resistor R6.

This circuit arrangement is designed such that the signal appearing at the collector of transistor Q1 will maintain a voltage level at the negative input of the operational amplifier OA1 which level is greater than the positive input voltage threshold. This is achieved under control of a charge pumping action of the bias network including diodes D1 and D2 and the capacitor C12. As a result, the output of the operational amplifier OA1 will be forced to a low level. The potential normally is maintained at the negative input of the operational amplifier OA1 by means of the charge of capacitor C12. This potential will decrease as a result of a discharge of capacitor C12 through the feedback resistor R4 to a voltage below the positive threshold value if the normal execution flow is disrupted. This causes the output of the operational amplifier OA1 to go high and resets the microcomputer 10. Should normal program execution fail to reoccur, capacitor C12 will then be recharged through the feedback resistor R4 and cause the negative input of operational amplifier OA1 to become higher than the threshold value. This feature allows the watchdog circuit to self-arm itself and to automatically reinitiate another reset. This action will continue indefinitely or until normal program execution is re-established.

The remaining circuitry shown in FIG. 3 uses the high current ouput pins P10 and P11 of the microcomputer 10 for indicating certain operating conditions of the control unit. Each output pin connects to an individual light emitting diode LED2 and LED3, respectively and through a respective one of two load resistors R7, R8 to positive supply voltage +6 VDC. As will become more apparent later, an output signal at high current output pin P10 indicates a fault condition whereas output pin P11 is utilized to drive a "null" indicator which may be used as a calibration aid.

In the general overview in conjunction with FIG. 1 it was indicated that the operation of the control unit is dependent upon various control parameters which may be individually set in accordance with requirements resulting from the installation of the control unit and the associated voltage regulator within a power distribution system and the type of regulator used, as well. Conventionally, measures are taken to enable an operator to explicity control the tap-change motor of the voltage regulator depending on the monitored regulator output voltage in a manual mode. Obviously, in such a mode the control unit will be used only as a monitoring unit and should not be enabled to effectively influence the rotation of the tap-change motor.

In contrast, in the automatic mode the control unit automatically generates output control signals for directly controlling the rotation of the tap-change motor. Without stressing this design detail, it may be easily understood that such modes of operation, as conventionally, are selectively activated by means of a mode select switch, not shown, which prevents the output control signals of the microcomputer 10 to become effective in the manual mode. In the following, the different input control parameter functions and their implementation will be described in more detail only in view of the automatic mode. This restriction is deemed to be sufficient for a full disclosure considering the fact that the automatic mode of operation utilizes all capabilities of the control unit also including the functions carried out by the control unit in the manual mode.

Figure 4:
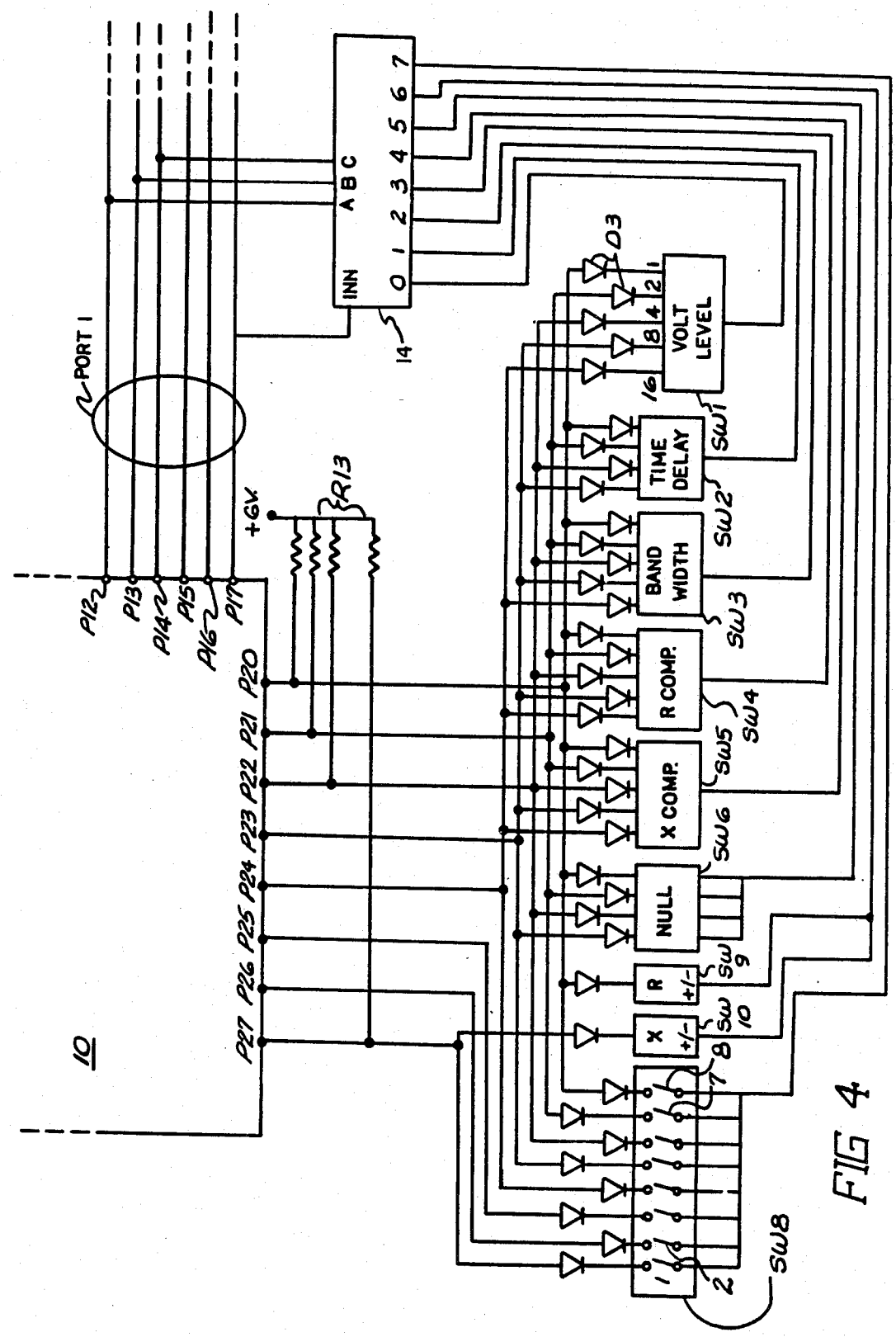
FIG. 4 illustrates schematically an arrangement of selectively preset multi-connector switches arranged for storing predetermined input control parameters of the control unit.

In summary, the operation of the control unit shall be such that the control of the tap-change motor shall depend on the monitored regulator output characteristics in comparison to various control parameters. Conventionally, step-voltage regulators are designed for operating in a range of ±10% of the nominal output voltage of 120 VAC with the understanding that this value is the root mean square (RMS) value of the line voltage. FIG. 4 illustrates the control input parameter switches and shows a first multi-connector switch SW1 which represents a voltage level setting switch. The switch is designed for 29 steps which design allows for covering a range of 106 V through 134 V assuming a step size of 1.0 V. The commercially available switch has coded outputs such that each of its settings specifies a respective one of hexa-decimal figures. This is indicated by a respective labeling of the five control parameter outputs of the voltage level setting switch SW1.

A conventional control unit also includes measures for delaying the response time of the control unit to monitored signals in order to avoid a hunting condition of the control. Accordingly, another multi-connector switch with coded outputs, the response time-delay switch SW2 is provided. Fifteen steps are implemented in this case and assuming a step size of 10 seconds, time delays ranging from 10 seconds to 150 seconds can be set. In accordance with this layout switch SW2 has only four outputs furnishing the coded signal.

The zone of voltage between the initiation of either a raising or a lowering control action is known as the voltage bandwidth. Again this bandwidth must be larger than the minimum correction obtainable through the regulator, or hunting of the regulator will result. In fulfillment of this requirement, a third parameter switch, the voltage bandwidth switch SW3 is provided to set the bandwidth in a range from 1.0 V through 6.0 V in 0.5 V steps which results in a number of 11 steps. consequently, also this switch has four parallel outputs.

Furthermore, even conventional analog controls for a step-change voltage regulator may include a line-drop compensation function which allows for precompensating the output voltage of the regulator in view of the load conditions on the output line when carrying full load. The line-drop compensation incorporates eight individual resistance and reactance sections and accordingly two further control input parameter switches SW4 and SW5 are provided for setting respective values. Both the resistance compensation switch SW4 and the reactance compensation switch SW5 in absolute values cover a range of 24 volts in 1.0 volt steps. This design corresponds to 25 steps and accordingly five outputs are provided for each switch furnishing the encoded setting information. Each of these compensation switches is associated with an individual direction switch SW9 and SW10, respectively utilized to assign a sign to the set resistance and reactance values. The combination of switches SW4 and SW9 allows for a full range of line-drop compensation from −24 V to +24 V; correspondingly the same range is made available for the reactance compensation by means of the switches SW5 and SW10.

A further switch, the calibration switch SW6 is provided for calibration adjustment. This switch is adjustable from −1.75 V to +1.75 V in 0.25 V steps in order to permit control calibration either at the factory or in the field. For calibration a potential representative of forward power flow conditions is applied to the control unit and the potential is read at two voltage meter test terminals, not shown, and the voltage level setting switch SW1 is set to the value of the voltage measured at these test terminals. Then the calibration adjustment switch SW6 is rotated until the described null indicator LED3 is illuminated. Incompliance with the 15 steps of the calibration adjustment switch SW6 four parallel outputs provides a hexa-decimal figure designating the set position.

TABLE 1

| SWITCH NO. | FUNCTION | CONDITION OPEN | CLOSED |
|---|---|---|---|
| 1 | 90° current transformer filter lag | Lag in | Lag out |
| 2 | Low current transformer inhibit | Disable inhibit | Enable inhibit |
| 3 | Spare | — | — |
| 4 | Sample mode | Average | RMS |
| 5 | WYE/Delta regulator configuration | DELTA | WYE |
| 6 | 30° Delta regulator configuration | Delta lead | Delta lag |
| 7 | Straight/inverted transformer winding | Inverted | Straight |
| 8 | Straight/inverted regulator | Inverted | Straight |

The switch panel still includes one further switch, the identification code switch SW8. This switch comprises eight individual stages specifying a specific configuration of the control unit. Table 1 furnishes the necessary information on the function of the eight stages of this identification code switch SW8. The left hand column specifies the individual switch stage by means of a reference symbol which is identical to the labeling of the identification code switch SW8 in FIG. 4; the center column describes the associated function in general and the two right hand columns are referred to the switch position. The contents of this table are self-explanatory to those skilled in the art and further discussion is deemed not be necessary.

This table shows that this identification code switch is a simple and effective means for adjusting the control unit to a given configuration of the voltage regulator and the conditions at the location of installation.

In addition, FIG. 4 shows the parallel connection of the individual outputs of each of these control input parameter switches to respective ones of the eight lines of the third input port P2 across individual decoupling diodes D3 which provide for the desired bus structure which is completed by a parallel arrangement of pull-up resistors R13 each connected to a respective one of the lines of the input/output port P2. Each of these switches is individually selected by means of the parameter selector 14 which is represented in FIG. 4 in more detail. In fact, the selector is a conventional 3-to-8 bit decoder having three select inputs A,B,C which are connected to respective ones of the pins P12, P13 and P14, respectively of the second input/output port P1.

The output signal furnished at pin P17 of the second input/output port provides for an inhibit signal of this parameter selector 14 in case that this port is utilized as a bi-directional port in an extended mode of operation of the control unit as indicated schematically in FIG. 1. In this mode connection can be made to optional features of the control unit which are implemented on a separate printed circuit board and receive data and control information through the extended input/output port P1.

Is now the time for a more detailed description of the networks utilized for conditioning the instantaneous input signals, i.e. networks which correspond to the circuits 20 through 26 schematically indicated in FIG. 1. It may be noted that the actual hook-up of the control unit onto the voltage regulator is implemented in a conventional manner by means of the indicated scaling transformers 16 and 18, respectively. These transformers can be fused and surge suppressed by metal oxide varistors. Also included in the transformer design may be correction windings to compensate for control voltage potential errors which may be calibrated out at the factor. However, these design details are of less concern with reference to the present invention and any other appropriate measures may be taken to furnish the necessary instantaneous values to the interfaces of the control unit. With this understanding the respective transformers are no longer illustrated in the detailed circuit diagrams of the conditioning networks.

Figure 5:
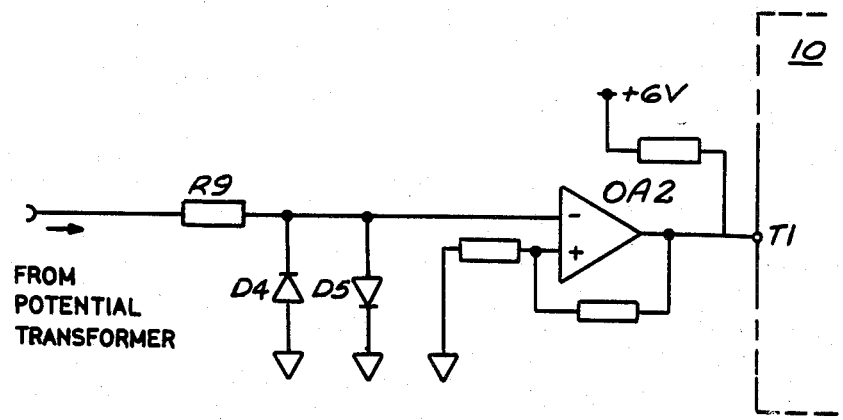
FIGS. 5 and 6 show circuit diagrams representing signal conditioning networks provided for conditioning analog input signals such as a scaled potential to be shaped into analog input signals acceptable by the microcomputer.

FIG. 5 shows a circuit diagram which corresponds to the voltage signal zero-cross converter 24 of FIG. 1. The voltage zero-cross signal is derived from one of the scanning transformers and routed through a current limiting resistor R9, plus/minus clamping diodes D4 and D5, respectively, and a zero-crossing detection comparator OA2. The clamping diodes D4, D5 limit the maximum input signal applied to the comparator's negative input to a range within ±1 V (peak-to-peak) over the entire operating voltage range of ±13 V through ±26 V (peak-to-peak) occurring at the outputs of the scaling transformer. As a result, this minimizes zero-cross phase error resulting from a ±5 mV threshold uncertainty of comparator OA2 by clamping the potential input signal, without scarificing its effective dv/dt value as the signal crosses zero. It may be easily understood that the phase error may be derived from the inverse of the sine value of a quantity determined by the ratio of peak-to-peak zero threshold uncertainty and the peak-to-peak input voltage. Accordingly, it may be computed for different applications that the absolute phase error even in a worst case condition is fairly below 0.03 degrees.

Figure 6:
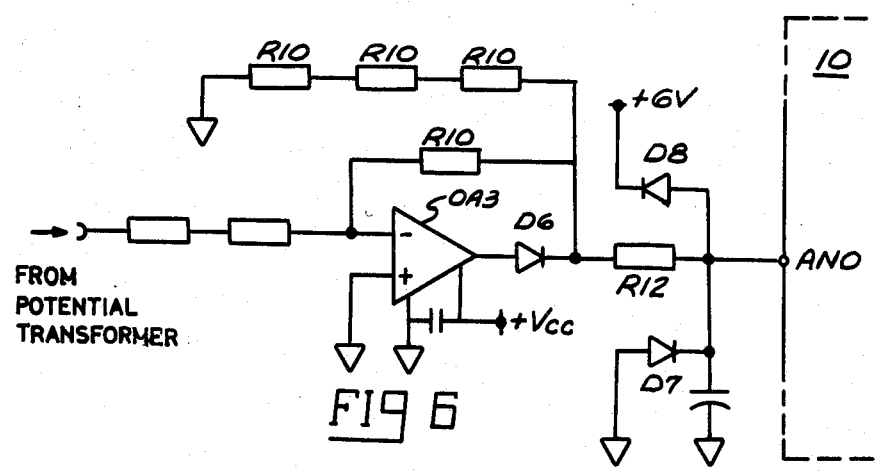

FIG. 6 shows another analog voltage processing path designed for conditioning a signal representing the magnitude of the potential transformer input voltage. This network corresponds to the voltage signal conditioning circuit 20 shown in FIG. 1. The input signal is obtained from the secondary winding of the potential transformer and routed through a precision full-bridge rectifier which is here implemented by means of resistors R10, an operational amplifier 0A3 and a further diode D6 connected to the output of this operational amplifier 0A3. It may be noted that resistors R10 are precision resistors of identical values and therefore have been labeled identically. In fact, these resistors R10 may be implemented as a resistor pack having a resistance tolerance of 0.1% which maintains a uniform gain for positive and negative input excursions. As easily derived, the overall gain of the rectifier circuit is −0.5. Assuming a turn ratio of the scaling transformer 16 of 5/128, the peak output of the absolute value rectifier should approach but not exceed the maximum input of 5 V at a maximum potential input of 180 V (RMS).

The output of this rectifier network is connected through a further resistor R11 to the analog input AN0 of the microcomputer 10. A clamping network including diodes D7 and D8 is provided for signal limiting. Resistor R11 and these clamping diodes thus protect the microcomputer 10 from permanent damage should the described input levels exceed normal operating limits.

It may be recalled that switch #4 of the identification code switch SW8 specifies a specific sampling mode of the microcomputer 10. In dependence upon the setting of this switch, the analog input signal applied to the first analog input AN0 of the microcomputer 10 will be very rapidly sampled over a 50 milli-second sampling period. During the sample period, depending on the setting of the associated switch stage of switch SW8 the digitized analog magnitude samples are either continuously integrated for deriving an average value or a continuous operation summing the squares of the instantaneous sample values is performed over the same period in order to obtain a true root mean square (RMS) value. At the end of the sampling period, the microcomputer 10 will contain a 16 bit count being either directly proportional to the true average value of the furnished magnitude signal or being directly proportional to the square of the RMS value of the incoming signal. Tests have shown that accuracies of at least 0.25% can be obtained over an input signal range of 92 to 145 V RMS.

Corresponding to the conditioning circuitry associated with the auxiliary potential transformer path, current signals are furnished to the microcomputer 10 through the conditioning circuits 22 and 26 respectively. The signal path for the current transformer magnitude signal is implemented in a similar manner corresponding to the potential magnitude signal path described above in conjunction with FIG. 6 the only difference being that the scaled secondary current of the current transformer is routed through a precision resistor circuit which converts this current into a voltage signal. This voltage signal is then converted by a rectifier of a design corresponding to the same of the full-bridge rectifier shown in FIG. 6.

It will now become more apparent why an active rectifier was selected and implemented by operational amplifier 0A3 as opposed to a diode type rectifier. This implementation reduces the cost and size requirements of the scaling current transformer 18 significantly, since a diode rectifier would create a basic problem at low current levels when a significant portion of the scaled secondary current may be lost through the magnetizing reactance of the current transformer 18 due to the blocking effect of the forward voltage drop of such diodes in a rectifier bridge. In order to minimize any error resulting from this schottky effect a current transformer must be designed with a large magnetizing reactance. Even low forward drop schottky diodes do not solve this problem in a sufficient manner. However, the use of an active rectifier eliminates this unwanted effect of a forward voltage drop and allows for greatly reducing the magnetizing reactance requirements of the current transformer 18.

Returning now to FIG. 1, the output section of the microcomputer 10, that is the function of the first input/output port P0 will be described in more detail. The input/output port P0 is associated with the basic output functions of the control unit. Each of the parallel output lines connected to a respective one of the pins P00 through P06 is connected to a respective one of identical pull up resistors R11 which, in turn, are commonly connected to the supply voltage +6 VDC. Furthermore, each of these output lines is connected to an integrated circuit 56 which furnishes for each connected line of the first input/output port P0 an individual Darlington driver stage in order to provide for a power output.

The output signals appearing at the outputs associated with the first input/output port P0 specify the output control conditions as follows. Bit 0 appearing at pin P00 is the tap motor direction select bit. In "off" condition a first relay RY1 will be activated in order to provide for a steering signal of the tap-change motor. The engaged relay RY1 controls a raising operation for increasing the output voltage of the voltage regulator if the present load condition determines a forward power factor situation. When a reverse power factor was found the engaged first relay RY1 will steer the tap-change motor to a lower voltage condition. However, if this bit 0 of port P0 is in "on" condition a second relay RY2 will be engaged which steers the tap-change motor in a direction opposite to the directions above with respect to the same conditions of forward or reverse power factor.

Bit 2 of the output port P0 appearing at pin P02 controls an auxiliary RY3. This relay is necessary for providing the proper potential to the control sensing circuitry, since the control unit is supposed to be operable for both states, that is both directions of power flow. Accordingly, an "on" condition of bit 2 supplied at pin P02 holds the relay RY3 engaged in case of forward power flow in combination with "straight" design of the associated voltage regulator.

Accordingly, relay RY3 is also engaged when the voltage regulator is of "inverted" design and reverse power flow is detected. Bit 2 of the first input/output port P0 is reset when relay RY3 must be deactivated upon occurrence of conditions reverse to those described above.

In this context, it may be noted that a further light emitting diode LED4 is activated by another one of the output signals of the first input/output port P0 in order to indicate the present state, that is the direction of the power flow. This display element will be in "on" condition if reverse power flow is detected, and consequently will be shut off if forward power flow exists.

The mentioned band indicator 58 includes three more LED elements which are provided for displaying a relative indication of the instantaneous voltage relative to the set point, i.e. an indication of "in band", "out of band, high" or "out of band, low" in each of these cases a respective one of further light emitting diodes LED5, LED6, and LED7, respectively is activated by means of the high condition of a corresponding one of the remaining bits of the first input/output port P0.

Finally, a further explanation of the function of the external bus forming an extension of the second input/output port P1, as schematically indicated in FIG. 1 may be now appropriate. The described hardware structure represented in FIGS. 1 through 6 may be implemented on one single printed circuit board. The hardware design allows for basic features of the control unit, however, the input signals and the processed information as such would allow for implementing some optional features without the need of additional input information and even without extensive further processing of signals. Such an optional feature may be a multi-purpose display unit which could be designed such that depending on the selection of incoming data, different values of the signals and characteristics derived by the microcomputer are selectively displayed. The external bus provides the interface means to possible add-on units, such as a separate display unit. Add-on units may be structured as slaves with respect to microcomputer 10 and may be implemented on separate printed circuit boards. This approach offers the flexibility desirable for a universal use of the described control unit. This flexible design concept includes add-on units implemented in hardware or even comprising another programmable sub-unit depending upon application requirements.

In a preferred embodiment, the control unit shall act as the controller for a step voltage regulator such as a tap-change auto transformer. Specifically, the control unit shall control the rotational direction of the tap-change motor that causes the average output of the regulator to rise or fall. The control function shall depend on the monitored regulator output voltage, the voltage level set point as determined by the first switch SW1, the response-time-delay set point determined by the setting of the second switch SW2, the bandwidth set point in accordance with the setting of switch SW3, the line drop compensation set points specified by switches SW4, SW9 and SW5, SW10, respectively, in conjunction with the monitored load power factor count and the state (direction) of power flow.

In the automatic mode, the operation of the control unit in general is as follows:

The output voltage of the regulator is monitored through a scaling transformer i.e., the potential transformer 16 or a utility winding. The control unit receives this voltage and compares it or a voltage as corrected by the sensing transformer, if necessary, to the voltage-level set point. If the difference between these two voltages is greater in magnitude than one-half of the bandwidth set point, a time-delay depending on the setting of the second switch SW2 will be initiated. Such delay occurs before the tap-change motor is energized to run in a raising or lowering direction. The determination of the rotation of this tap-change motor is based on the sign of the difference between the sensed voltage and the voltage level set point and the state of power flow through the regulator. If the load side voltage is below the voltage-level set point, the tap-change shall be in the direction to raise this voltage in order to reduce the voltage difference to a value which is less than one-half of the bandwidth. If the load side voltage is above the voltage-level set point, the tap-change motor is commanded to lower the output voltage thereby reducing the difference to a value of less than one-half the bandwidth.

As mentioned above, provision shall be made for delaying the tap-change motor actuation on the occurence of a bandwidth excursion. This is achieved by means of a response-delay counter which is implemented in the control logic of the control unit. This counter is capable of time increment and decrement and can be intermittently set and reset. More specifically, the response-delay counter shall begin (or continue) to accumulate time when the absolute value of the difference between the input voltage level sensed by the control unit and the voltage level set point is greater than one-half of the bandwidth, that is when the input voltage deviation changes from being within the bandwidth to being outside of the bandwidth. Provisions are made to prevent any accumulation of time above the time delay setting. On the other hand, the accumulation of counts stops and begins (or continues) to decrease when the absolute value of the difference between the sensed voltage and the voltage level set point is less than 75% of one-half the bandwidth. The rate of decrement preferably is 0.75 of the increment rate and count accumulation does not decrease below zero.

The accumulation of counts, as described above, continues to increment or to decrement, as was last commanded, when the absolute value of the difference between the sensed voltage and the voltage level set point is less than one-half the bandwidth, but is more than 75% of one-half the bandwidth. Eventually, the tap-changing mechanism of the voltage regulator is held actuated then, and only then, when the count accumulation is equal to the time delay setting.

The control unit has a capability for detecting forward power flow and reverse power flow. This is achieved by programming the microcomputer 10 such that it continuously monitors the sensed voltage and the load current received from the respective scaling transformers in order to calculate the present state of power flow. By means of the identification code switch SW8, the microcomputer 10 is enabled to recognize the existence of a "straight" or "inverted" regulator application and accordingly the microcomputer activates or deactivates the third relay RY3 to provide proper potential to control sensing circuitry considering those factors. When an inverted style regulator is employed it is conceivable that a reverse power flow condition will occur when no potential transformer is provided. Under such conditions, the control unit will measure 0 V, i.e. less than the 90 V minimum operating voltage as specified hereinbefore. Therefore, should the detector measure less than 64 V, the control unit must be enabled to recognize a special situation which prevents any attempt to raise voltage but rather disables the algorithm so that no further tap-changing is accomplished until forward power flow condition resumes.

Measures have to be taken for avoiding a hunting mode of the voltage regulator at lower power levels, that is a reverse power flow/forward power flow activation shall not occur precisely at zero current. Within a small range of generally ±2% rated load current a change of the direction is inhibited and operation continues based upon the characteristic parameters of the previous sensing state. Only if a current in excess of this range is monitored a switch operation from forward power flow to reverse power flow (and the opposite, if applicable) will be initiated.

Furthermore, it may be recognized that the various settings of the identification code switch SW8 provide means for recognizing WYE, delta-lead or delta-lag connected regulators. It is apparent to those skilled in the art that in a delta system the current wil lead (or lag) the potential by 30° at unity power factor, and appropriate privision must be taken in the microcomputer 10 in order to recognize this phase shift before determining a power flow direction. Eventually, when reverse power flow is detected, appropriate action is commanded by the microcomputer 10 by means of respective signals supplied through the first input/output port P0 in order to initiate a reversal of the tap-changing motor direction. The reverse power flow condition is visually indicated by a display element which is illuminated when reversed power flow exists.

Furthermore, the microcomputer 10 must be programmed to determine the system power factor in order to properly calculate for necessary line drop compensation. The power factor is determined by relating the relative zero crossings of the sensed voltage and the filtered current signals. Again for this computation measures must be taken to account for the ±30° phase shift which will occur in conjunction with delta systems.

The outlined functions of the control unit are achieved by means of the hardware structure described above in conjunction with FIGS. 1 through 6. The disclosed design concept of a microcomputer based control unit aims at minimizing hardware elements in order to reduce costs and even more in order to achieve high system reliability. The second factor is of great importance for applications where such control units are permanently installed at remote locations of a power distribution system and short maintenance periods are not acceptable. It may be recognized by those skilled in the art that the relatively complex control functions are achieved in a straight forward manner by minimized hardware utilizing only one large scale integrated circuit, the microcomputer 10 and a limited number of integrated and discrete elements comprising the interface circuitry for supplying input parameters and signals to the microcomputer 10 and output control signals to the voltage regulator, respectively.

However, this minimized hardware structure puts some constraints on the software for operating the microcomputer. It may be easily understood that the limited memory capacity, an 8-bit bus structure of the microcomputer 10 and its limited instruction set mean quite a burden for the software implementation in view of the time requirements which are inherent to real-time applications, in view of the amount of computation to be performed by a microcomputer with only a limited and less powerful instruction set available for such a microcomputer, and in view of the required high accuracy which is none the less necessary for such applications.

It can easily be concluded that these adverse factors require the use of appropriate algorithms in order to achieve a very economical use of memory with limited software overhead and specific measures to overcome the limitation of a microcomputer with an 8-bit bus structure. One of the major restraints may be apprehended by the illustration of one example. The utilized microcomputer 10 is provided with a built-in analog/digital converter which is utilized for converting the analog potential and current input signals into corresponding digitally encoded values. The depth of the 8-bit bus structure determines the exactness of the corresponding digital values. Any digital figure has a finite number of bits of accuracy, an 8-bit figure has a resolution of 256 discrete steps. The nominal value of the potential is 120 V AC and accordingly an 8-bit format has a resolution of 0.5 V. In a given application however, the present voltage-as previously described in conjunction with the voltage level set points-has to be determined at least as exactly as 0.1 V. It will be shown later that the limitation resulting from the hardware bus structure of the selected microcomputer and its analog/digital converter can be overcome by measures which efficiently utilize the microcomputers hardware characteristics and employ statistical interpolation techniques. This example illustrates but one of the concerns, other areas will become more apparent in conjunction with the following more detailed description of the functions of the microcomputer 10.

It has been previously pointed out that the selected external time control circuitry specifies an internal instruction cycle time of 10 microseconds. Based upon this value and the structure of the internal timer of the microcomputer 10, a time interval of 81.9 ms between two overflows and corresponding time interrupts results. This roughly 82 ms interval scheme is utilized to separate different functions of the microcomputer 10 which are performed sequentially.

Correspondingly, four different macro functions designated as "paths" are implemented. A first path, designated as path "A" covers the computing of frequency and phase counts. Sine and co-sine terms of the power factor phase angle are derived from these frequency and phase counts. In addition, path "A" also includes performing of all binary-to-BDC conversions and display control functions.

A second path designated as "B" processes the analog input signals received from the potential transformer through the conditioning circuitry. The selected analog/digital channel is sampled for 50 ms and the RMS value of the selected input wave form is derived. Two different algorithms may be selectively used. In accordance with one algorithm an average derived RMS value is computed in accordance with equation 1:

$$P.T._{avg} = \frac{\sum_{o}^{50 \text{ msec}} v(t)}{\text{\# samples}} \left( \frac{\pi}{2\sqrt{2}} \right)$$

The second possibility comprises a true RMS processing method which is performed in accordance with equation 2:

$$P.T._{rms} = \sqrt{\frac{\sum_{o}^{50 \text{ msec}} v(t)^2}{\text{\# samples}}}$$

Finally, path "B" also includes computing of the running average of the derived magnitude of the potential input signal.

A third module, designated as path "C" performs functions similar to those described above in conjunction with path "B" with regard to the input current signal. Two computation routines based on equations 1 and 2, respectively, will here be employed for deriving average RMS or true RMS values of the present load current.

Finally, the fourth module, designated as path "D" is provided for performing the calculation of a compensated voltage as specified by equation 3:

$$V_c^2 = V_s^2 + \left( \frac{I_s}{I_{fs}} \right)^2 [(I_{fs}R)^2 + (I_{fs}X)^2] - 2V_s \left( \frac{I_s}{I_{fs}} \right) [I_{fs}R\cos\phi_{P.F.} - I_{fs}X\sin\phi_{P.F.}]$$

where:

$V_c$ = computed compensated voltage
$V_s$ = sensed regulator voltage
$I_s$ = sensed regulator current
$I_{fs}$ = full scale current ratings of regulator that results in a 200 mA C.T. output current
$I_{fs}R$ = "R" line drop compensation set point
$I_{fs}X$ = "X" line drop compensation set point
COS $\phi_{P.F.}$ = cosine of P.F. phase angle
SIN $\phi_{P.F.}$ = sine of P.F. phase angle Furthermore, all other control functions based upon set point inputs and previously derived power factor, voltage and current measurements are carried out in order to eventually supply the computed control states and parameters via the input/outport ports P0 and P1.

Figure 7:
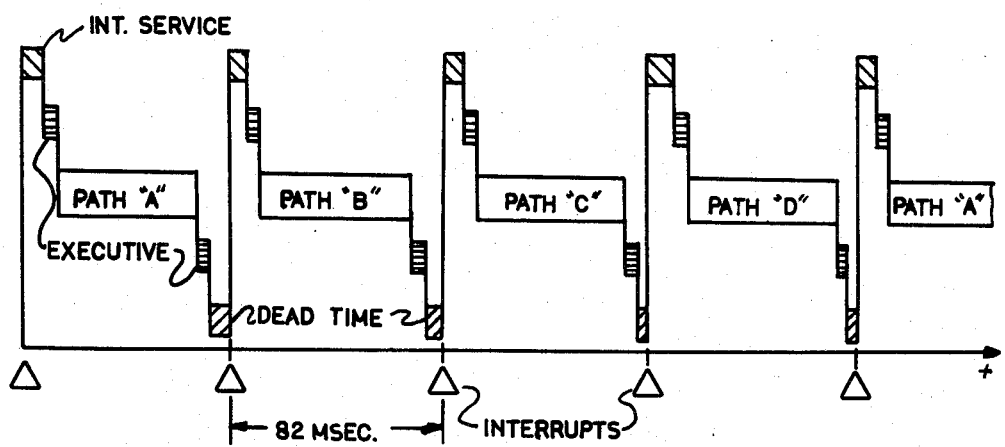
FIG. 7 represents a timing diagram illustrating the sequential execution of several control modules designated as path "A" through "D"

FIG. 7 shows a timing diagram which illustrates schematically the macro structure of the above outlined functions of the microcomputer 10. FIG. 7 shows a time axis t which is broken down into 82 ms time periods determined by subsequently generated time interrupts. At the beginning of each time period the pervious interrupt is serviced, an executive routine follows which leads to the computation of a respective one of the four paths "A" through "D". Subsequently, another executive routine is performed to complete the tasks the microcomputer 10 has to perform during one 82 ms time period. Accordingly, a dead time occurs until the next time interrupt is generated by means of an overflow of the timer counter of the microcomputer 10.

The timing diagram represented in FIG. 7 shows that the tasks of each of the four paths are executed in four subsequent 82 ms periods whereupon the same sequence starts a new and thus illustrates one of the basic characteristics of the microcomputer 10 forming the core of the control unit. In accordance with the present invention the different tasks have been broken down in such a manner that four different modules requiring essentially the same time for execution are established. The timing diagram of FIG. 7 which is out of scale nevertheless shall indicate that the remaining dead times are rather small as compared to the overall length of this period. Since the breakdown of tasks could be achieved in such an efficient manner, it was possible to utilize the timer interrupt for initiating the next task of the microcomputer instead of a software control mechanism which would have increased the software overhead.

After this outline of the timing concept a more detailed description of the operation of the control unit based upon the functions of the microcomputer 10 will be given in conjunction with more detailed flowcharts illustrated in the drawings beginning with FIG. 8. In addition, an Appendix is provided representing a complete source program including all information concerning memory allocation, register designation, definitions of program constants and input/output addresses for complete information regarding the software on the machine level. The listing as such is formatted in a conventional manner and lists the location LOC, an object code OBJ expressed in hexadecimal figures in accordance with the instructions of the manufacturer of the selected microcomputer INTEL 8022. The listing also includes a corresponding source statment of sufficient detail that one skilled in the art and familiar with such microcomputer systems of is enabled to fully appreciate their contents. However, caution may be exercised with respect to the definition of the different tasks "A" through "D" and respective tasks "A" through "G" in the source program. It may be noted that the embodiments described here in the specification and represented in the Appendix, respectively, differ from each other in so far that the overall timing diagram in accordance with FIG. 7 assumes that all tasks of the microcomputer can be executed in four different tasks as opposed to the representation in the Appendix employing seven different tasks. The following description will show that it is possible to provide all functions required by only utilizing four 82 ms time periods which is possible by chaining the various sub-routines in the most efficient and time saving manner.

Figure 8:
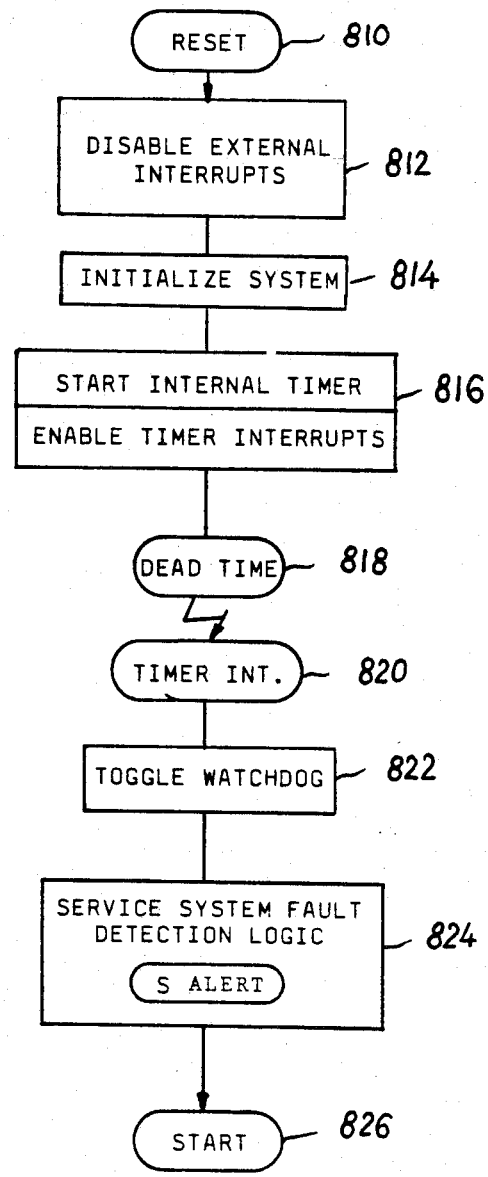
FIG. 8 represents a flow chart illustrating a power up, reset and system initialization routine of the microcomputer leading the same to a start condition.

The flow chart represented in FIG. 8 illustrates the operation of the microcomputer 10 performed for a power-up after a reset condition and the corresponding system initialization. The reset condition 810 reflects the situation which was regarded previously in conjunction with the description of FIG. 3. It may be noted that a reset condition activating the reset input of the microcomputer 10 automatically disables both the internal timer and external interrupts which is represented in block 812. Thereupon the system has to be initialized anew as block 814 depicts. This utilization includes clearing of the accumulator and the random access memory of the microcomputer, and the setting of the initial conditions of both input/output ports P0 and P1, respectively.

Thereupon, as indicated in block 816, the internal timer is started and the timer interrupts are enabled. A following dead time condition represented in block 818 holds the microcomputer 10 in a wait status until the first timer interrupt derived from an overflow of the internal timer occurs. Such overflow occurs every 81.9 ms, as described hereinbefore.

Upon such occurrence of the first timer interrupt, this condition is serviced as illustrated in block 820. This service excludes loading of the status of input/output port P0 into the accumulator of the microcomputer 10 in order to perform the toggle function of the watchdog, as indicated in block 812 whereupon the status of this input/output port P0 is updated.

A self-diagnostic routine "SALERT" is performed which basically tests if the previous task has been timely performed. When this test is successfully completed, the microcomputer 10 is in start condition as indicated in block 826. Looking back to FIG. 7 it may now be understood that the interrupt service occurring at the beginning of each 82 ms time period, as schematically indicated, is represented in more detail in the lower half of the flowchart shown in FIG. 8.

Figure 9:
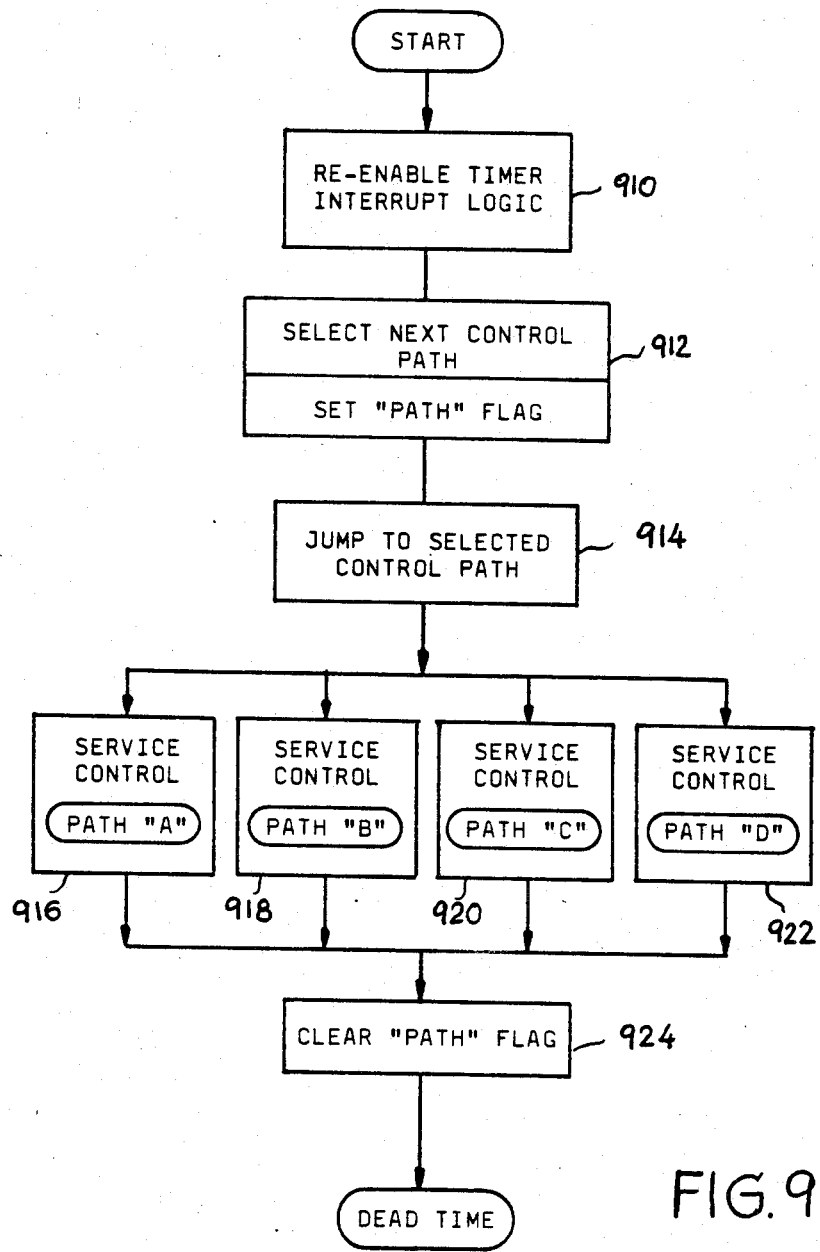
FIG. 9 shows another flow chart illustrating schematically the progress of the program execution of the microcomputer after such start condition and including a macro representation of the different control paths "A" through "D"

The flow chart shown in FIG. 9 illustrates the subsequent operation of the microcomputer 10. Obviously, the internal timer interrrput logic has to be re-enable otherwise the next overflow signal furnished by the internal timer would not be received. This condition is shown in block 910. By moving a number designating the previously serviced path into an internal register and by incrementing this register, the next control path can be selected, as illustrated in block 912. At this time a flag-bit designating the selection of a corresponding path is set which specifies that the computation of the currently selected path still incomplete.

Block 914 of FIG. 9, schematically indicates that the program execution now jumps to the selected control path. This may be easily achieved by loading the path number into the accumulator and adding a certain number in order to generate a sum which is only zero if all paths have been serviced; whereupon an automatic reset to path "A" is accomplished as indicated in block 916. Otherwise, processing will be continued with servicing a respective one of the remaining paths "B" through "D" as indicated in blocks 918 through 922.

It may be noted that the operations of the microcomputer 10 represented by blocks 910 through 914 corresponds to the executive portion occurring between an interrupt service and the computation of the respective path, as shown in FIG. 7. This figure also illustrates that the major portion of the respective 82 ms time period is used up for servicing one of the control modules designated as path. After completion of this computation, the previously mentioned path flag is cleared in accordance with block 924 in FIG. 9 in order to indicate that the respective control module has been completed timely and accordingly the path status is updated. These functions are represented in the timing diagram of FIG. 7 by the second executive portion. After completion of this routine, the microcomputer 10 again is set to a wait status while waiting for the next following timer interrupt. In the following a more detailed description of the four control paths "A" through "D" will be given in conjunction with corresponding flowcharts.

Figure 10:
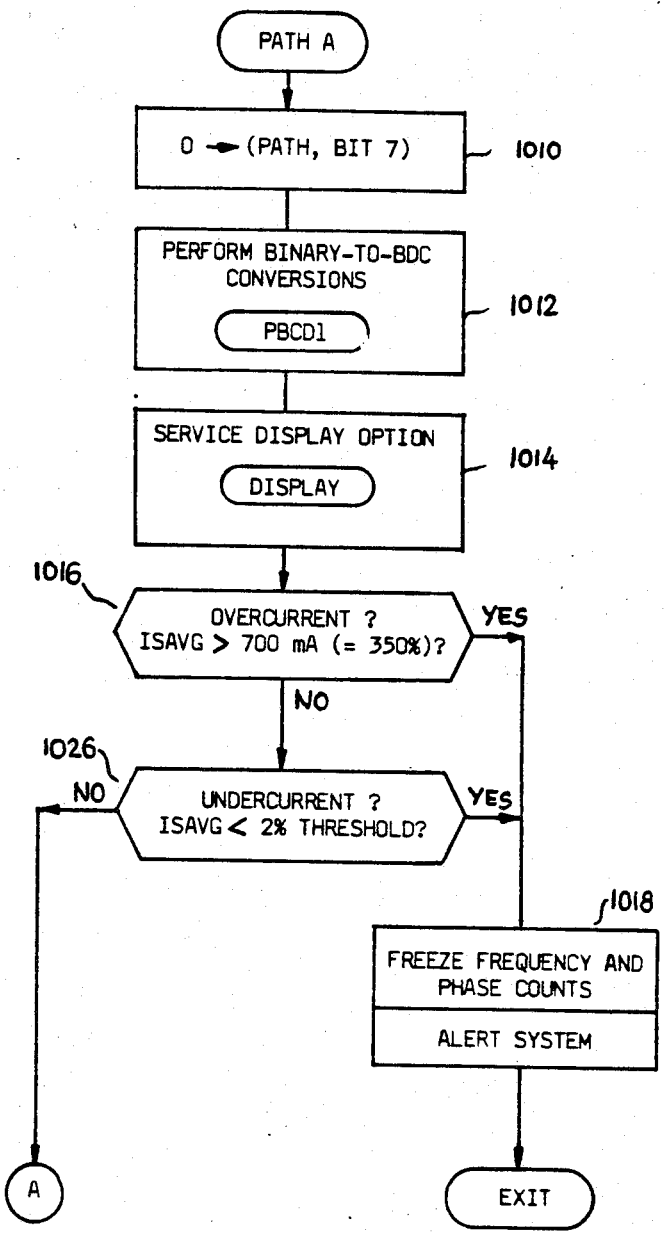
FIGS. 10 and 11 represent flow charts illustrating the program flow during the execution of control path "A"
Figure 11:
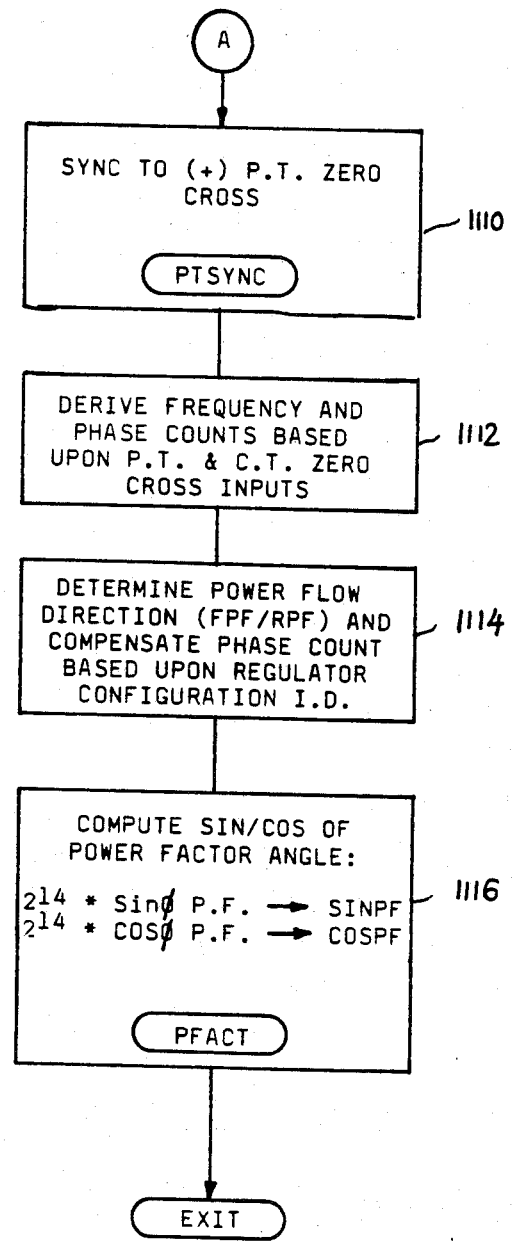

The flowcharts shown in FIGS. 10 and 11 represent the execution of the different functions comprising path "A". The execution starts with resetting the seventh bit of the path byte to zero, as indicated in block 1010, forming a part of the self-diagnostic features of the microcomputer 10. It was previously pointed out that the microcomputer 10 includes an internal analog/digital converter which derives binary values from the analog input signals representing a voltage or current equivalent. Such values have to be converted into a binary coded decimal figures. The conversions are standard features of the 822 microcomputer and are here merely illustrated by block 1012.

Block 1014 represents a further example of the allocation of different subroutines in the different paths in order to make the most efficient use of the fixed time span between the subsequent timer interrupts. This time it is an optional input/output service routine in order to transmit status information across the second input/output port P1 to an optional display unit as discussed above in conjunction with the description of FIG. 1.

The following operations illustrated in blocks 1016 through 1026 of FIG. 10 refer to the recognition of overcurrent or undercurrent conditions at the output of the voltage regulator. In general, a status byte is provided in the random access memory of the microcomputer 10 which byte includes a bit position for designating any load current condition being outside of a normal range determined by upper and lower limits. In addition, as indicated in block 1018 parameters of such an extreme condition are stored for diagnostic purposes.

If the currently sensed average current value ISAVG does not exceed the predetermined upper limit of 350% of the average current, normal operation continues and the presently selected current threshold is evaluated. It may be recalled from the description of the identification code switch SW8 in conjunction with table 1 that the closed switch #2 determines a low current transformer inhibit condition. This condition is stored in bit 6 of the configuration code byte by means of a zero value. Depending on this configuration a test for disabling tap change commands is performed. A 2% current transformer threshold will be loaded in order to determine the undercurrent condition illustrated in block 1026. If the sensed average current value ISAVG lies above the selected threshold, the execution of path "A" will be continued as illustrated in the block diagram shown in FIG. 11.

Zero crossings of the analog input signal corresponding to the output potential of the voltage regulator have to be synchronized with the internal timer in order to enable the microcomputer 10 to perform frequency and phase counts. This is achieved by means of a subroutine PTSYNC, as illustrated in block 1110 of FIG. 11. A corresponding subroutine is listed in more detail on page 16 of the Appendix which shows that the zero time is offset in order to determine the exact synchronization of the event of a zero crossing with the internal timer. The respective count of a zero count register is saved for computing of zero-cross time counts.

Thereupon corresponding frequency and phase counts based upon the conditions appearing at the two tests inputs T1 and T0 of the microcomputer 10 can be computed as illustrated in block 1112.

The execution of a path "A" is continued by determining the power flow direction and by compensating the phase count based upon the regulator configuration as determined by the identification code, i.e. the respective positions of the switches #5 through 8.

The last major subroutine of task "A" is the computation of the sine/cosine values of the power factor angle, as schematically indicated in block 1116. This subroutine consumes the most time within the computation of path "A". Pages 13 through 15 of the Appendix show both essential parts of this subroutine in full detail. In addition, the calculation of the sine and cosine values of the angle are carried out based upon a conventional algorithm which is known as the "Cordic" algorithm; the respective portion of the source program is listed on pages 52 through 54 of the Appendix.

Figure 12:
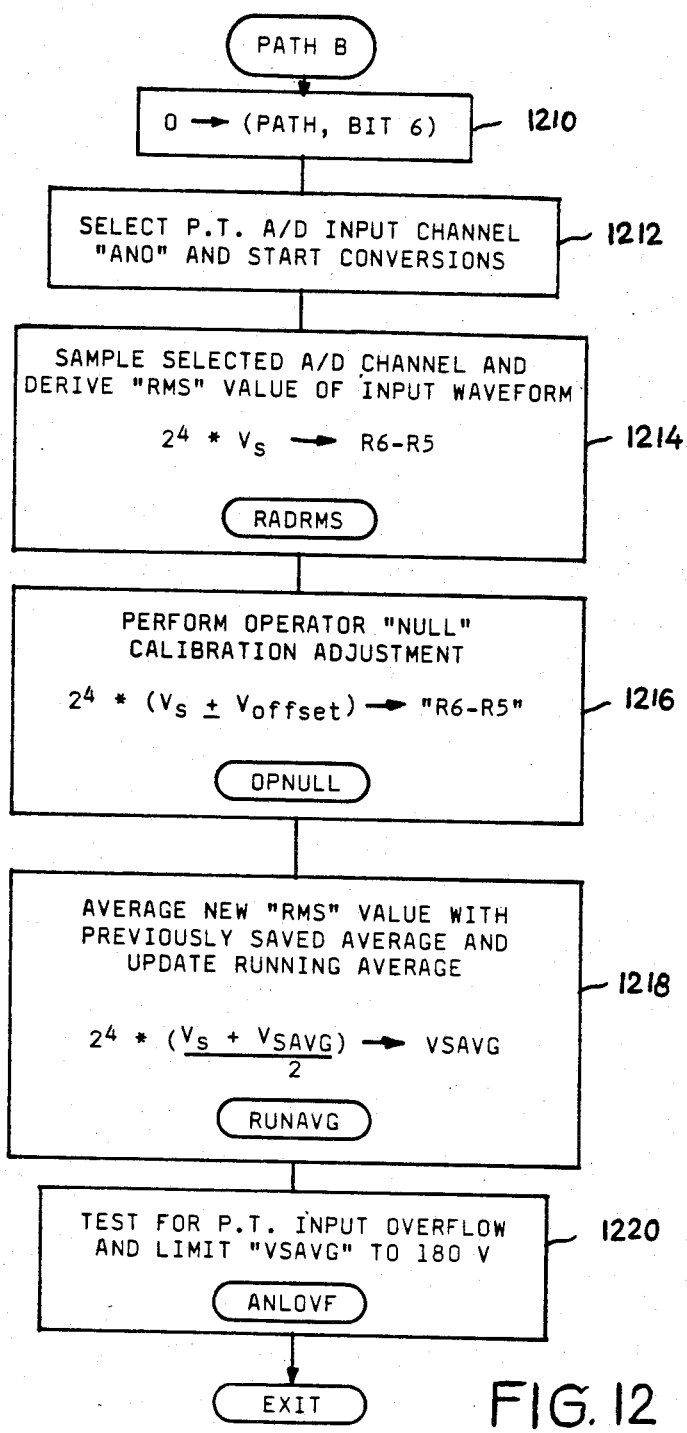
FIG. 12 shows a corresponding flow chart for the execution of control path "B" provided for deriving a filtered RMS value of the magnitude of the instantaneous voltage.

The flow chart shown in FIG. 12 illustrates the program flow of path "B" which is of major importance to the performance of the control unit. The magnitude value of the current output voltage of the voltage regulator is hereby derived from the analog the input signal. Block 1210 illustrates in correspondence to block 1010 of FIG. 10 a first step wherein the corresponding bit of the path byte is reset. Thereafter, as indicated in block 1212 the first analog input AN0 and accordingly the first channel of the analog/digital converter of the microcomputer 10 is selected in order to receive the scaled and conditioned voltage signal from the respective conditioning circuitry described above.

Block 1214 of FIG. 12 represents a sub-routine designated as RADRMS which derives a root mean square (RMS) value from the input wave form. This routine being one of the most interesting sub-routines of the program of the microcomputer 10, is shown in more detail in FIG. 13. It may be noted that corresponding parts of the source program are listed on pages 22 through 24 of the Appendix. The first step of this subroutine illustrated in block 1310 sets the starting conditions. It may be recalled from the description of FIG. 4 that the identification code switch SW8 includes one stage designated switch #4 which specifies selectively one out of two sampling modes, an average mode or a true RMS mode. The corresponding bit of the configuration byte is read in order to determine the selected sampling mode. In addition, for the starting condition several working registers used for temporarily storing sum values are cleared.

As indicated in block 1312 a test is performed which leads in dependence upon the condition of the mentioned configuration bit to one of two branches of this sub-routine controlling either the average sampling mode or the true RMS sampling mode. In the following the latter sampling mode will be discussed in more detail since this mode is preferably utilized unless the average sampling mode has to be selected because of certain conditions on the distribution line.

Having in mind that the entire path "B" has to be performed during one 82 micro-seconds period, a 50 milli-second sampling window is determined which allows for sampling 64 samples in the RMS sampling mode as indicated in block 1314. This means that the following steps represented by blocks 1316 through 1324 are sequentially carried out in a sampling loop which takes 780 micro-seconds and if repeated 64 times a sampling window of 49.92 micro-seconds as determined.

The output signal of the analog/digital converter is an 8 bit word which is moved into the accumulator of the microcomputer 10 as indicated in block 1316. Thereafter, in accordance with block 1318 a squared value of this sample is computed. It may be noted that this is achieved by means of a further sub-routine which is listed in the Appendix on pages 41 and 42. As can easily be derived from the format of the input signal, the resulting squared value will be a two byte word. This result will be added to the sum of squared samples which was accumulated in previous loops. This new sum value obtained in accordance with block 1320 is saved for further accumulation during the following loop period. Thereafter, in accordance with block 1322, the sample count is decremented. This decremented value is tested for a zero value in accordance with block 1324 and a jump back to block 1316 is performed if this value is not zero. A zero value indicates that the 50 mili-second sampling window has passed and thereafter the final sum value is obtained.

Briefly referring to the sampling loop of the average sampling mode illustrated in blocks 1316' through 1324', it may be noted that this loop comprises similar steps except for computing a squared value of a sample. The mentioned fast 8×8 square sub-routine takes an execution time of 55 cycles which time is spared in the average sampling mode. Therefore, the loop time of this mode is shorter and the same sampling window which allows for taking 256 samples instead of only 64 samples. The larger number of samples offsets to some extent the limited approximation of the average algorithm. In addition, it may be recognized that the sample numbers as such have been selected in accordance with the binary number scheme to allow for easier computation in order to save software overhead.

The final processing of the RMS sum is illustrated in blocks 1326 and 1328. As mentioned above, the squared value of a sample is a 16 bit number and accordingly the RMS sum corresponds to a 22 bit number when taking into account that 64 samples have been accumulated. The rescaling of the RMS sum as indicated in block 1326 simply means an extension of this 22 bit word to a full three byte word of 24 bits by multiplying this sum value by four. In accordance with the formula for deriving a true RMS value the square root of this value has to be taken, as indicated in block 1328. The resulting number is a 12 bit number which is 16 times the average value of the voltage.

Figure 13:
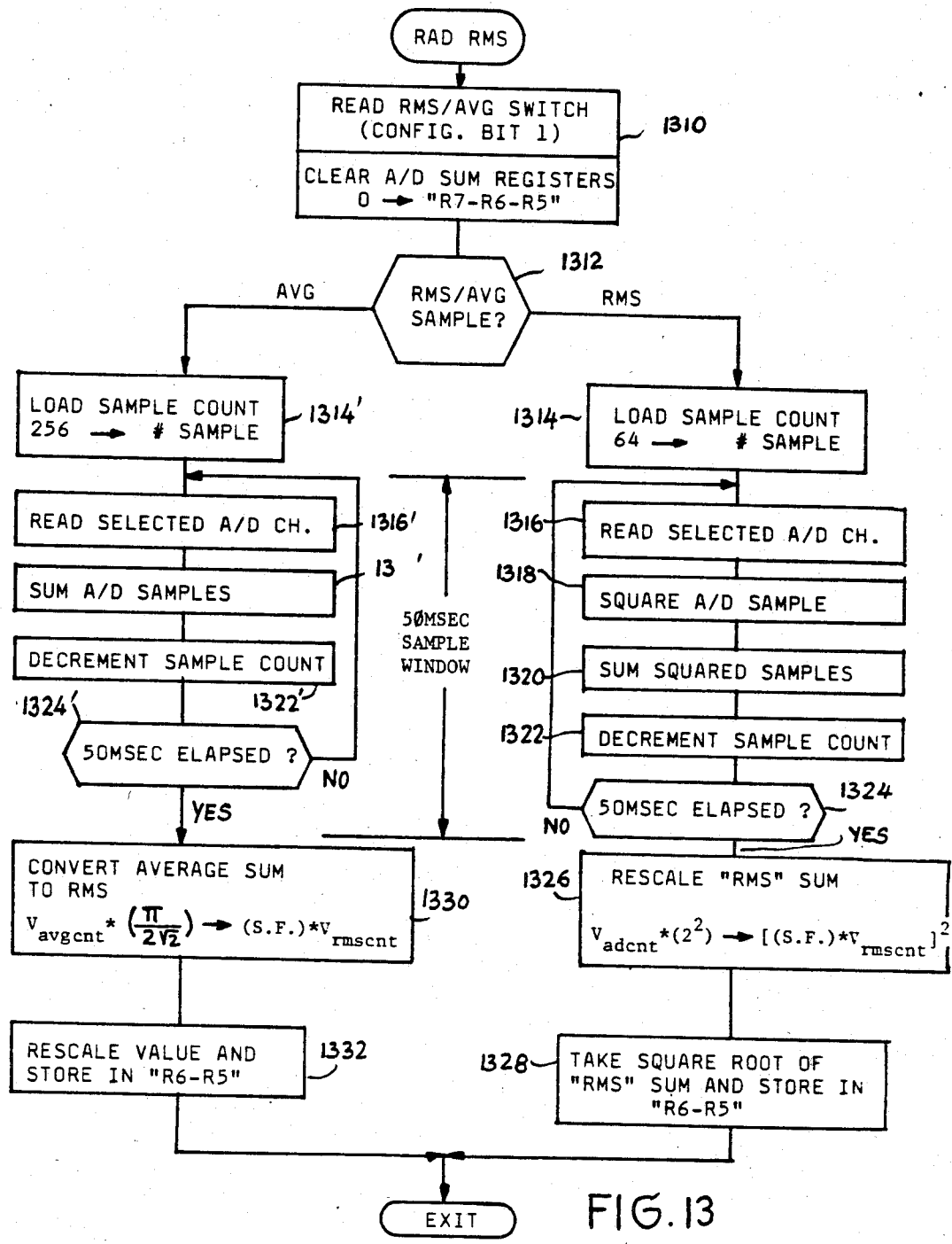
FIG. 13 illustrates by means of another flow chart a sub-routine utilized for deriving route mean square (RMS) values of analog input signals.

Similar final processing has to be executed for the average sum value as indicated in blocks 1330 and 1332 of FIG. 13. Since the result has to be expressed in the same format for both sampling modes in order to achieve easier further processing of such values, again a corresponding rescaling of the obtained average value to an average "RMS" value has to be performed. In this manner a 12 bit word is finally stored in two designated working registers of the microcomputer 10 for further processing.

The above described routine for deriving a true RMS value of the sensed voltage should be briefly evaluated prior to returning to the final steps of path "A" execution. One has to realize that the computation started out from a binary coded decimal figure representing one sample of the magnitude of the sensed voltage and expressed in an 8 bit word. The result is now a 12 bit word which is capable of expressing 16 times the number of steps of the originally sensed value. This does not necessarily mean that the accuracy of this value is 16 times better than of an 8-bit sample value. However, tests have been verified that at least the upper three of the four least significant bits are useful and accurate in the given application.

The output voltage of a voltage regulator, under normal operating conditions while being a relatively slowly changing value as compared to the narrow sampling window of 50 mili-seconds nevertheless represents an analog wave form. What is achieved by means of the described sub-routine is that a plurality of samples are taken wherein each sample value is an individual digital approximation of the actually furnished analog signal. Furthermore, it can be assumed that the hardware circuitry of the utilized analog/digital converter is designed such that its resolution is at least as high as to achieve an accurate 8 bit result. In fact, what has been concluded from test results is that the accuracy of the analog/digital converter of the selected microcomputer 10 is much higher. The actual limitation within this microcomputer is the 8-bit structure.

It can now be derived from information theory that the information content of the output signals of the analog/digital converter is higher than the information of a single 8 bit word as such which can be retrieved if the converter is—for this purpose—regarded as an ideal circuit and a plurality of samples are taken. Without actually trying to provide such theoretical findings, actual tests have shown that this is sufficiently true under the given conditions. It is of special advantage that the selected microcomputer comprises an analog/digital converter which actual implementation to a sufficient extent fulfills the different requirements of an ideal circuit. Only one ambiguity remains in form of an undesired offset drift which can be eliminated as will be described in the following. In summary, this derivation of the true RMS value overcomes the system-inherent limitation of an 8-bit microcomputer which evenutally made it possible to utilize such a microcomputer for executing the control functions of the control unit in accordance with the present invention.

Returning now to FIG. 12 and the remaining steps of path "B", in block 1216 it is indicated that the next step of the routine takes care of the mentioned offset problem. It may be recalled from the previous description that a "NULL" calibration adjustment feature is provided for the control unit. This feature here is again utilized for deriving an offset value which is then added with a proper sign to the calculated RMS value. A refined RMS value is obtained and restored into the designated working registers of the microcomputer 10. The following step is an averaging step for further refinement by forming the average of a previously saved average magnitude value and the new RMS value. In this manner, as indicated in block 1218, eventually the new average value of the magnitude of the sensed voltage is obtained. The execution of path "B" terminates after a test for an over flow condition of the sensed output voltage of the voltage regulator which test is performed to the alert control unit of a hazard condition and to limit the finally obtained average magnitude value to a value smaller than 180 V. This test is indicated in block 1220.

These last three steps of the path "B" routine, in fact, are performed by means of further sub-routines as indicated in FIG. 12 and corresponding sections of the source program are found on pages 26, 21, and 25, respectively of the Appendix.

Figure 14:
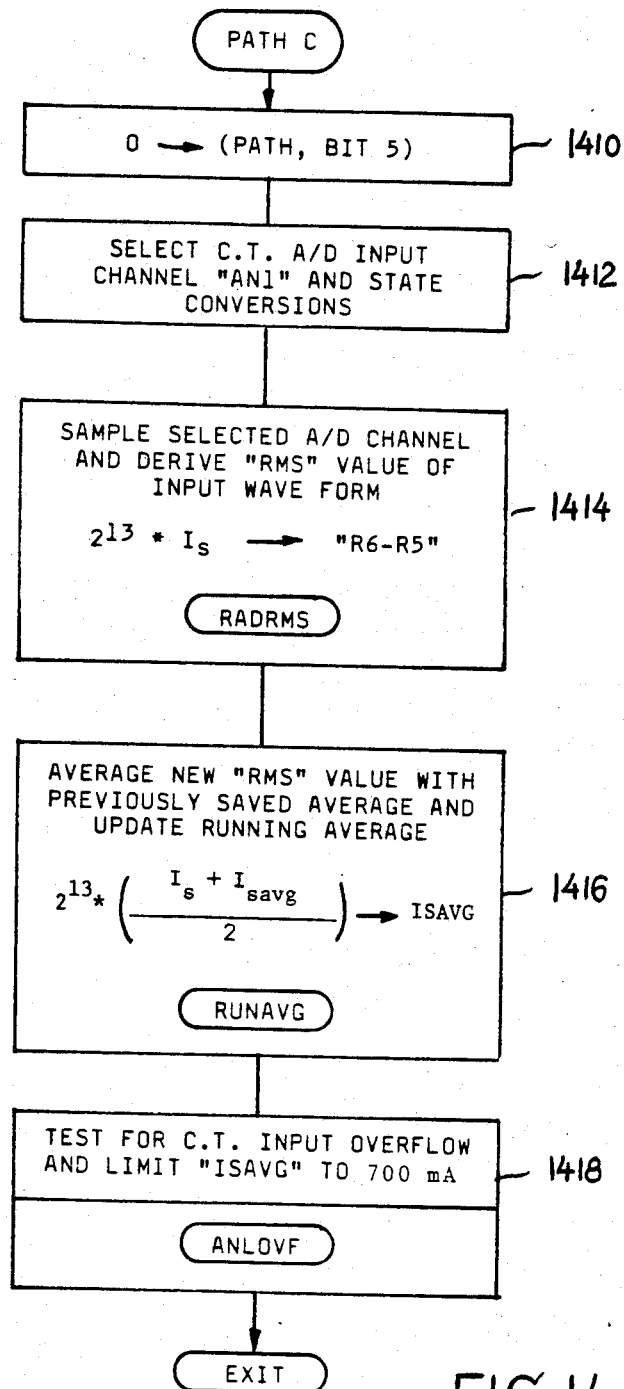
FIG. 14 illustrates an flow chart the execution of the part of the program of the microcomputer representing control path "C" provided for computing a filtered RMS value of the load current.

FIG. 14 illustrates path "C" which is provided for computing the magnitude value of the input signal corresponding to the sensed load current. From a comparison of FIGS. 12 and 14 it can be easily derived that this computation is carried out in quite a similar manner and is based upon the same principles utilized for deriving the potential magnitude value; a summarizing description is therefore deemed to be sufficent.

The setting of the path bit as indicated in block 1410 has the same purpose as corresponding steps previously described with respective paths. For calculating the magnitude of the current the second channel of the analog/digital converter including the associated second analog input AN1 of the microcomputer 10 is selected, as illustrated in block 1412. Block 1414 shows that the same sub-routine RADRMS as described in conjunction with FIG. 13 is utilized with one exección that the scaling of the current magnitude value is adjusted to the magnitude of the input signal which results in a different scaling of this value. Correspondingly, in block 1416 the same different scaling appears again when the final average magnitude value of the current is derived. Finally, block 1418 corresponds to block 1220 of FIG. 12 with the execption that the upper limit of the current value is set to 700 mA, that is 350% overcurrent.

Nevertheless, it may be obtained from this brief outline of the execution of path "C" that the same time extensive and above all memory consuming sub-routines for calculating magnitude values are utilized. This gives another example for the organization of the software and the macro timing of the control functions of the control unit.

Figure 15:
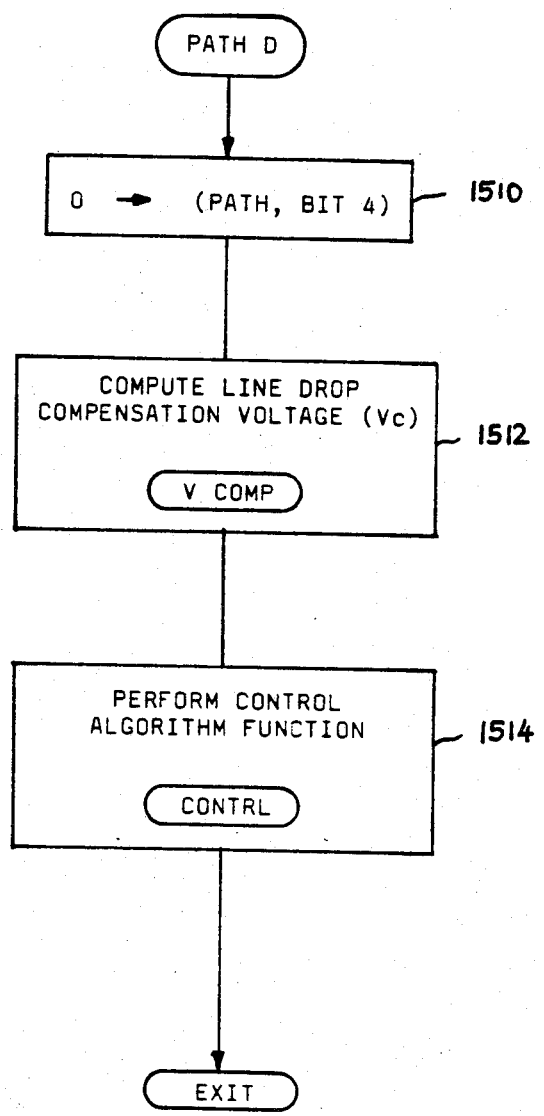
FIG. 15 shows another flow chart illustrating the program flow when executing control path "D" which covers general control routines of the microcomputer and a derivation of a value controlling a line-drop compensation.

The fourth path, path "D" is illustrated in FIG. 15. The execution of this path again starts by setting the corresponding path bit similar to the start of the previously described paths. Block 1512 schematically represents an extensive sub-routine VCOMP for computing the line drop compensation voltage. The corresponding formula forming the algorithm for this computation has been given in equation 3. As can be seen from this equation time consuming computation has to be performed especially in view of the fact that sine and cosine values have to be calculated, values have to be squared and eventually square roots have to be taken. A plurality of sub-routines necessary for this computation have already been outlined previously. Other sub-routines of more conventional design can be obtained from a review of the Appendix where the computation of the line-drop compensated voltage VC is listed starting at page 27.

The final block 1514 of path "D" schematically represents general control functions to be performed by the microcomputer 10 which comprise a number of diagnostic routines and further control routines as may be obtained from the source program listing starting on page 30 of the Appendix.

There has thus been shown and described a novel method for measuring instantaneous electrical parameters of power distribution systems utilizing digital control means and a programable control apparatus performing such method which fulfill all the objects and advantages sought therefor. Many changes, modification, variations and other uses in applications of the subject invention will, however, become apparent to those skilled in the art after considering the specification and the accompanying drawings which disclose preferred embodiments thereof. All such changes, modifications, variations and other uses in applications which do not depart from the spirit and scope of the invention are deemed to be covered by the invention which is limited only by the claims which follow.

```
ISIS-11 MCS-48/UPI-41 MACRO ASSEMBLER, V3.0
MJ-1A REGULATOR CONTROLLER

LOC   OBJ        LINE        SOURCE STATEMENT

1  $MOD22 XREF PRINT(:TO:)
                  2  $TITLE('MJ-1A REGULATOR CONTROLLER')
                  3
0000              4  ASM2      EQU     0         ;ANALOG VALUE RUNNING AVERAGE - 6 BYTES
                  5                              ; (0 = NO ASM, 1 = ASM)
                  6
                  7
                  8  ;*
                  9  ;*  VERSION  1.1       02-26-82    C. LAPLACE & C. WILLIAMS
                 10  ;*
                 11
                 12
                 13  ;************************************************
                 14  ;*
                 15  ;*   PROGRAM RAM ALLOCATION :
                 16  ;*
                 17  ;************************************************
                 18
0000             19  REG0      EQU     00
0001             20  REG1      EQU     01
0002             21  REG2      EQU     02
0003             22  REG3      EQU     03
0004             23  REG4      EQU     04
```

```
LOC   OBJ        LINE       SOURCE STATEMENT 0005              24 REG5     EQU    05
0006              25 REG6     EQU    06
0007              26 REG7     EQU    07
                  27
0008              28 STACK    EQU    08        ;RESERVE 16 BYTES FOR P.C. STACK
0017              29 STKEND   EQU    23        ;END OF STACK
                  30
                  31 ;***              USER RAM                              ***
                  32 ;***         (ORDER MUST BE PRESERVED)                  ***
                  33
0018              34 PAK      EQU    24        ;DATA/PAK BUFFER (31 BYTES)
0036              35 RA       EQU    54        ;TEMPORARY STORAGE REGISTERS (2 BYTES)
                  36
0037              37 RAMSD    EQU    55
0038              38 RB       EQU    56
0039              39 RBMSD    EQU    57
003A              40 RD       EQU    58        ;TEMPORARY STORAGE REGISTER (3 BYTES)
003B              41 RDMSD1   EQU    59
003C              42 RDMSD2   EQU    60
                  43
                  44 ;***    DATA/PAK TRANSMIT DATA BUFFER       ***
                  45 ;***        (ORDER MUST BE PRESERVED)       ***
                  46
0018              47 CFREQ    EQU    PAK+00    ;FREQUENCY COUNT LSD(S.F.=50000*SEC)
                  48                           ;  20 USEC = 0.36 DEG @ 50 HZ
                  49                           ;  20 USEC = 0.432 DEG @ 60 HZ
001A              50 CPHASE   EQU    PAK+02    ;PHASE COUNT LSD (S.F.=50000*SEC) - NORMALIZED
001C              51 VREG     EQU    PAK+04    ;REGULATING VOLTAGE (VSETP) - VRCXJ (S.F.=16*VOLTS)
001E              52 VRCOMP   EQU    PAK+06    ;"VR" LINE DROP (S.F.=256*IS*RC) - NOT SW. SETTING
0020              53 VXCOMP   EQU    PAK+08    ;"VX" LINE DROP (S.F.=256*IS*RX) - NOT SW. SETTING
0022              54 VRXPOL   EQU    PAK+10    ;"VR" AND "VX" POLARITY SETTINGS
                  55                           ; BIT 7 = 0 ("VX" TERM POSITIVE)
                  56                           ;       = 1 ("VX" TERM NEGATIVE)
                  57                           ; BIT 0 = 0 ("VR" TERM POSITIVE)
                  58                           ;       = 1 ("VR" TERM NEGATIVE)
0023              59 VSAVG    EQU    PAK+11    ;P.T. MAGNITUDE LSD(S.F.=16*VRMS)
0025              60 ISAVG    EQU    PAK+13    ;C.T. MAGNITUDE LSD(S.F.=4096*IRMS)
0027              61 SINPF    EQU    PAK+15    ;SINE OF P.F. ANGLE LSD(S.F.=2**14*SINPHI)
0029              62 COSPF    EQU    PAK+17    ;COSINE OF P.F. ANGLE LSD(S.F.=2**14*COSPHI)
002B              63 VC       EQU    PAK+19    ;COMPENSATED VOLTAGE LSD (S.F.=16*VRMS)
002D              64 STATUS   EQU    PAK+21    ;STATUS CODE:
                  65                           ; BIT 7 = 0 (FPF DETECTED - QUAD 4 OR 1)
                  66                           ;       = 1 (RPF DETECTED - QUAD 2 OR 3)
                  67                           ; BIT 6 = 0 (LAGGING P.F.--IND-QUAD 4 OR 2)
                  68                           ;       = 1 (LEADING P.F.--CAP-QUAD 1 OR 3)
                  69                           ; BIT 5 = SPARE
                  70                           ; BIT 4 = 1 (TIMER INCREMENTING)
                  71                           ;       = 0 (TIMER DECREMENTING OR NOT COUNTING)
                  72                           ; BIT 3 = 1 (C.T. OUTSIDE OVER/UNDER LIMITS)
                  73                           ;       = 0 (C.T. WITHIN OVER/UNDER LIMITS)
                  74                           ; BIT 2 = 1 (UPPER VLC PREVAILING)
                  75                           ;       = 0 (UPPER VLC NOT PREVAILING)
                  76                           ; BIT 1 = 1 (LOWER VLC PREVAILING)
                  77                           ;       = 0 (LOWER VLC NOT PREVAILING)
                  78                           ; BIT 0 = BAND INDICATOR HIGH/LOW HISTORY BIT
                  79                           ;       = 1 (PAST OUT-OF-BAND STATUS HIGH)
                  80                           ;       = 0 (PAST OUT-OF-BAND STATUS LOW)
                  81
002E              82 PFSTAT   EQU    PAK+22    ;POWER FLOW STATUS :
                  83                           ; BIT 7 = 1 (CONFIGURE FOR RPF)
                  84                           ;       = 0 (CONFIGURE FOR FPF)
                  85                           ; BIT 6 = SPARE
                  86                           ; BIT 5 = SPARE
                  87                           ; BIT 4 = 1 (MODE CHANGE TIME OUT)
                  88                           ;       = 0 (INHIBIT MODE CHANGE)
                  89                           ; BITS 3,2,1,0 = POWER FLOW MODE TIMER
                  90
002F              91 TALERT   EQU    PAK+23    ;ALERT TIMER/PATH FLAG :
                  92                           ; BIT 7 = 1 (PATH INCOMPLETE)
                  93                           ;       = 0 (PATH COMPLETE)
                  94                           ; BIT 6 = SPARE
                  95                           ; BIT 5 = SPARE
                  96                           ; BIT 4 = SPARE
                  97                           ; BIT 3 = SPARE
                  98                           ; BIT 2,1,0 = ALERT TIMER FLAG
                  99
```

```
LOC  OBJ        LINE      SOURCE STATEMENT
                100
0030            101 PORTO    EQU      PAK+24     ;PORT "O" OUTPUT STATUS:
                102                              ; BIT 7 = 1 (WATCHDOG LED ON)
                103                              ;       = 0 (WATCHDOG LED OFF)
                104                              ; BIT 6 = 1 ("RPF" LED ON )
                105                              ;       = 0 (   "    OFF)
                106                              ; BIT 5 = 1 ("LOW" LED ON )
                107                              ;       = 0 (   "    OFF)
                108                              ; BIT 4 = 1 ("IN" LED ON )
                109                              ;       = 0 (   "    OFF)
                110                              ; BIT 3 = 1 ("HIGH" LED ON )
                111                              ;       = 0 (   "    OFF)
                112                              ; BIT 2 = P.T. SOURCE/COMPENSATION RELAY SELECT
                113                              ;       = 1 (ENGAGED-FPF/STRAIGHT DESIGN)
                114                              ;         (    "   -RPF/INVERTED DESIGN)
                115                              ;       = 0 (DISENGAGED-FPF/INVERTED DESIGN)
                116                              ;         (    "      -RPF/STRAIGHT DESIGN)
                117                              ; BIT 1 = 1 (AUTO MODE MOTOR ENABLE)
                118                              ;       = 0 (AUTO MODE MOTOR DISABLE)
                119                              ; BIT 0 = MOTOR DIRECTION SELECT
                120                              ;       = 1 - "K" RELAY ENGAGED
                121                              ;           (LOWER VOLTAGE-FPF/STRAIGHT DESIGN)
                122                              ;           (    "        -FPF/INVERTED DESIGN)
                123                              ;           (RAISE VOLTAGE-RPF/STRAIGHT DESIGN)
                124                              ;           (    "        -RPF/INVERTED DESIGN)
                125                              ;       = 0 - "J" RELAY ENGAGED
                126                              ;           (RAISE VOLTAGE-FPF/STRAIGHT DESIGN)
                127                              ;           (    "        -FPF/INVERTED DESIGN)
                128                              ;           (LOWER VOLTAGE-RPF/STRAIGHT DESIGN)
                129                              ;           (    "        -RPF/INVERTED DESIGN)
                130
0031            131 IDCODE   EQU      PAK+25     ;CONFIGURATION I.D. SWITCH CODE
                132
0032            133 ALERT    EQU      PAK+26     ;ALERT CODE :
                134                              ; BIT 0 = VOLTAGE LEVEL SETTING SW.
                135                              ; BIT 1 = RESPONSE TIME DELAY SW.
                136                              ; BIT 2 = VOLTAGE BANDWIDTH SW.
                137                              ; BIT 3 = "R" COMP SW.
                138                              ; BIT 4 = "X" COMP SW.
                139                              ; BIT 5 = VRC SWITCH
                140                              ; BIT 6 = LOWER VLC SW.
                141                              ; BIT 7 = UPPER VLC SW.
                142                              ; BIT 8 = SPARE
                143                              ; BIT 9 = PORT "1"
                144                              ; BIT 10 = PORT "2"
                145                              ; BIT 11 = HIGH C.T. MAGNITUDE(OVERCURRENT > 350% C.T.)
                146                              ; BIT 12 = LOW C.T. MAGNITUDE(UNDERCURRENT < 2% C.T.)
                147                              ; BIT 13 = LOW P.T. MAGNITUDE(UNDERVOLTAGE < 64 VOLTS)
                148                              ; BIT 14 = PATH INCOMPLETE (NO C.T./P.T.)
                149                              ; BIT 15 = SPARE
                150
0034            151 TAPCMD   EQU      PAK+28     ;AUTO TAPCHANGE CMD FLAG :
                152                              ; (ZERO = INHIBIT TAPCHANGES)
                153                              ; *PREVAILING VLC AND/OR LOW C.T.(OPT:CONFIG,BIT6)
                154                              ; (NON-ZERO = ENABLE TAPCHANGES)
0035            155 VRCFLG   EQU      PAK+29     ;VRC OPTION STATUS FLAG :
                156                              ; 0 = VRC NOT ACTIVE
                157                              ; 1 = VRC ACTIVATED SINCE LAST PASS
                158                              ; 2 = VRC PREVIOUSLY ACTIVE
0036            159 SYNC     EQU      RA         ;XMIT EOB CHECKSUM
                160
                161 ;***     DATA/PAK 31 BYTE END-OF-BUFFER         ***
                162
003D            163 TIMER    EQU      61         ;RESPONSE TIMER LSD
003E            164 TIMMSN   EQU      62         ;RESPONSE TIMER MSN (LOWER - BITS)
003F            165 PATH     EQU      63         ;PATH STATUS :
                166                              ; BIT 7 = SPARE
                167                              ; BIT 6 = SPARE
                168                              ; BIT 5 = SPARE
                169                              ; BIT 4 = SPARE
                170                              ; BIT 3 = SPARE
                171                              ; BIT 2,1,0 = 000 ( RESET )
                172                              ;           = 001 (PATH "A")
                173                              ;           = 010 (PATH "B")
                174                              ;           = 011 (PATH "C")
                175                              ;           = 100 (PATH "D")
                176                              ;           = 101 (PATH "E")
```

```
LOC  OBJ        LINE         SOURCE STATEMENT

177                          ;             = 110 (PATH "F")
                178                          ;             = 111 (PATH "G")
                179
                180
                181  ;***********************************************
                182  ;*
                183  ;*     PROGRAM CONSTANTS :
                184  ;*
                185  ;***********************************************
                186
008E            187  PI2SQ2   EQU    142       ;AVG-TO-RMS - 2**7 * PI/(2*SQR2)
                188
                189
                190  ;***********************************************
                191  ;*
                192  ;*     PROGRAM I/O ADDRESSES :
                193  ;*
                194  ;***********************************************
                195
0080            196  VSETPT   EQU    80H       ;VOLTAGE LEVEL SETTING SW.
0084            197  TDELAY   EQU    84H       ;RESPONSE TIME DELAY SW.
0088            198  VBAND    EQU    88H       ;VOLTAGE BANDWIDTH SW.
008C            199  RCOMP    EQU    8CH       ;"R" COMPENSATION SW.
0090            200  XCOMP    EQU    90H       ;"X" COMPENSATION SW.
0094            201  VNULL    EQU    94H       ;OPERATOR NULL SW.
0098            202  RXSIGN   EQU    98H       ;"R" & "X" COMP. POLARITY SW.S
009C            203  CONFIG   EQU    9CH       ;CONFIGURATION I.D. DIP SW.
                204                          ; BIT 0 = 0 (SW8-CLOSED: STRAIGHT REG. DESIGN)
                205                          ;       = 1 (    -OPENED: INVERTED REG. DESIGN)
                206                          ; BIT 1 = 0 (SW7-CLOSED: STRAIGHT "U2")
                207                          ;       = 1 (    -OPENED: INVERTED "U2")
                208                          ; BIT 2 = 0 (SW6-CLOSED: 30 DEG DELTA LAG)
                209                          ;       = 1 (    -OPENED: 30 DEG DELTA LEAD)
                210                          ; BIT 3 = 0 (SW5-CLOSED: WYE )
                211                          ;       = 1 (    -OPENED: DELTA)
                212                          ; BIT 4 = 0 (SW4-CLOSED: RMS SAMPLE)
                213                          ;       = 1 (    -OPENED: AVERAGE SAMPLE)
                214                          ; BIT 5 = 0 (SW3-CLOSED: SPARE)
                215                          ;       = 1 (    -OPENED: SPARE)
                216                          ; BIT 6 = 0 (SW2-CLOSED: ENABLE LOW C.T. TAP INHIBIT)
                217                          ;       = 1 (    -OPENED: DISABLE LOW C.T. TAP INHIBIT)
                218                          ; BIT 7 = 0 (SW1-CLOSED: 90 DEG C.T. FILTER LAG OUT)
                219                          ;       = 1 (    -OPENED: 90 DEG C.T. FILTER LAG IN)
0040            220  DIXMIT   EQU    40H       ;SLAVE PROCESSOR DATA XMIT INTERRUPT
0044            221  VLCUP    EQU    44H       ;UPPER VLC SWITCH
0048            222  VLCLOW   EQU    48H       ;LOWER VLC SWITCH
004C            223  VLCOPT   EQU    4CH       ;VLC OPTION STATE
0050            224  OPTION   EQU    50H       ;VLC/VRC OPTION STATUS
0054            225  VRCSW    EQU    54H       ;VRC SWITCH
0058            226  VRCOPT   EQU    58H       ;VRC OPTION STATE
005C            227  IO7      EQU    5CH       ;SPARE
                228
                229
                230
                231  ;***********************************************
                232  ;*
                233  ;*     THE FOLLOWING PROGRAM REGISTER DESIGNATIONS ARE USED :
                234  ;*
                235
0002            236  XA       EQU    R2        ;"A" REGISTER EXTENSION
0003            237  COUNT    EQU    R3        ;OUTER LOOP COUNTER
0004            238  ICNT     EQU    R4        ;INNER LOOP COUNTER
0005            239  DEV      EQU    REG5      ;16 BIT WORD USED BY SQUARE ROOT
003A            240  SQ       EQU    RD        ;24 BIT WORD TO BE SQUARE ROOTED
0018            241  PAKBUF   EQU    CFREG     ;DATA/PAK XMIT DATA BUFFER
                242
                243  ;***********************************************
                244
                245
0000            246           ORG    000H
                247
```

```
LOC  OBJ        LINE      SOURCE STATEMENT

248  ;**********************************************
                249  ;*
                250  ;*   PERFORM POWER-UP/RESET SYSTEM INITIALIZATION :
                251  ;*
                252  ;*      NOTE: BOTH TIMER AND EXTERNAL INTERRUPTS ARE
                253  ;*            DISABLED AUTOMATICALLY UPON "RESET".
                254  ;*
                255  ;**********************************************
                256
0000 15         257  RESET:   DIS    I             ;DISABLE EXTERNAL INTERRUPTS
0001 1430       258           CALL   INITZ         ;INITIALIZE SYSTEM
0003 55         259           STRT   T             ;START TIMER
0004 25         260           EN     TCNTI         ;ENABLE TIMER INTERRUPTS
0005 0405       261  DEADTM:  JMP    DEADTM        ;WAIT FOR TIMER INTERRUPT
                262
                263  $EJECT
                264
                265  ;**********************************************
                266  ;*
                267  ;*   SERVICE TIMER INTERRUPT :
                268  ;*
                269  ;*      ENTRY CONDITION(S): NONE
                270  ;*      EXIT  CONDITION(S): NONE
                271  ;*
                272  ;*      NOTE:  TIMER INTERRUPTS OCCUR EVERY
                273  ;*             81.9 MSEC (3.00 MHZ CRYSTAL)
                274  ;*
                275  ;**********************************************
                276
0007 B830       277  TIMINT:  MOV    R0,#PORT0     ;LOAD PORT "0" STATUS
0009 F0         278           MOV    A,@R0
000A D380       279           XRL    A,#10000000B  ;TOGGLE WATCHDOG
000C 90         280           OUTL   P0,A
000D A0         281           MOV    @R0,A         ;UPDATE PORT "0" STATUS
                282
                283  ;***  ALERT DETECTION LOGIC  ***
                284
000E B82F       285  SALERT:  MOV    R0,#TALERT
0010 F0         286           MOV    A,@R0         ;SELECTED PATH COMPLETED ?
0011 F7         287           RLC    A
0012 E618       288           JNC    ALERTS        ;YES, JMP
0014 BC40       289           MOV    R4,#01000000B ;NO
0016 D4F6       290           CALL   ALERT1        ;PATH INCOMPLETE ALERT
0018 F0         291  ALERTS:  MOV    A,@R0
0019 4380       292           ORL    A,#10000000B  ;SET PATH FLAG
001B A0         293           MOV    @R0,A
001C 5307       294           ANL    A,#00000111B  ;ANY SYSTEM ALERTS DETECTED WITHIN
                295                                ;LAST 7 PASSES ?
001E C628       296           JZ     NOFLT         ;NO, JMP
0020 F0         297           MOV    A,@R0
0021 07         298           DEC    A             ;DECREMENT ALERT TIME OUT
0022 A0         299           MOV    @R0,A
0023 09         300           IN     A,P1          ;YES, LITE "ALERT" LED
0024 53FE       301           ANL    A,#11111110B
0026 042B       302           JMP    OUTFLT
0028 09         303  NOFLT:   IN     A,P1
0029 4301       304           ORL    A,#00000001B  ;TURN OFF "ALERT" LED
002B 39         305  OUTFLT:  OUTL   P1,A          ;UPDATE P1 OUTPUT STATUS
002C 14EF       306           CALL   P1TEST        ;VERIFY P1 OUTPUT
                307
002E 2416       308           JMP    START
                309
                310  $EJECT
                311
                312  ;**********************************************
                313  ;*
                314  ;*   INITIALIZE SYSTEM :
                315  ;*
                316  ;*      ENTRY CONDITION(S): NONE
                317  ;*      EXIT  CONDITION(S): NONE
                318  ;*
                319  ;**********************************************
                320
0030 27         321  INITZ:   CLR    A
0031 B928       322           MOV    R1,#40
0033 B818       323           MOV    R0,#STKEND+1  ;POINT TO FIRST USER RAM LOC.
```

```
LOC  OBJ      LINE         SOURCE STATEMENT

0035 A0       324 CLRRAM:  MOV   @R0,A        ;CLEAR SELECTED RAM (STATUS, PATH & PORTO INIT. HERE)
0036 18       325          INC   R0           ;SELECT NEXT LOC.
0037 E935     326          DJNZ  R1,CLRRAM    ;LOOP UNTIL FINISHED
0039 90       327          OUTL  P0,A         ;INITIALIZE PORT "0"(DISABLE "P0" LED'S & RELAYS)
003A 37       328          CPL   A
003B 39       329          OUTL  P1,A         ;INITIALIZE PORT "1"(DISABLE "P1" LED'S & SW.'S)
003C 83       330 PAGE0:   RET
              331
              332
              333
              334
              335 $EJECT
              336
              337
              338 ;****************************************************
              339 ;*
              340 ;*    MJ-1 MAIN PROGRAM CONTROL :
              341 ;*
              342 ;*        ENTRY CONDITION(S):  NONE
              343 ;*
              344 ;*        EXIT  CONDITION(S):  NONE
              345 ;*
              346 ;*        NOTE:  ASSEMBLER MUST BE "ORGED" TO BEGINNING OF
              347 ;*               PAGE FOR FOLLOWING CODE TO EXECUTE PROPERLY.
              348 ;*               "PATH" JUMP TABLE MUST NOT BE DISTURBED!!!
              349 ;*
              350 ;*               !!!   WARNING   !!!
              351 ;*
              352 ;*        DO NOT REMOVE "XRETI" FROM BEGINNING OF PAGE !!!
              353 ;*        THIS FORCES THE SECOND BYTE OF THE "CALL XRETI"
              354 ;*        TO A "00H" VALUE. THIS WILL THEN RESULT IN A
              355 ;*        "NOP" DEFAULTING ON THE "00H" VALUE WHICH WILL
              356 ;*        ALLOW THE "RETI" TO EXECUTE PROPERLY AFTER THE
              357 ;*        "CALL" INSTRUCTION SINCE "RETI" DOES NOT AUTO-
              358 ;*        MATICALLY INCREMENT THE P.C. BY 1 AS DOES A
              359 ;*        "RET".
              360 ;*
              361 ;****************************************************
              362
0100          363          ORG   100H
              364
0100 93       365 XRETI:   RETI               ;RE-ENABLE TIMER INTERRUPT LOGIC
              366
0101 08       367 PTABLE:  DB    LOW(PTA)     ; PATH "A" JUMP ADDRESS
0102 0A       368          DB    LOW(PTB)     ; PATH "B" JUMP ADDRESS
0103 0C       369          DB    LOW(PTC)     ; PATH "C" JUMP ADDRESS
0104 0E       370          DB    LOW(PTD)     ; PATH "D" JUMP ADDRESS
0105 10       371          DB    LOW(PTE)     ; PATH "E" JUMP ADDRESS
0106 12       372          DB    LOW(PTF)     ; PATH "F" JUMP ADDRESS
0107 14       373          DB    LOW(PTG)     ; PATH "G" JUMP ADDRESS
              374
0108 0451     375 PTA:     JMP   PATHA        ;VOLTAGE MAGNITUDE (75 MSEC)
010A 449A     376 PTB:     JMP   PATHB        ;CURRENT MAGNITUDE (75 MSEC)
010C 2423     377 PTC:     JMP   PATHC        ;FREQUENCY COUNT (40 MSEC)
010E 2439     378 PTD:     JMP   PATHD        ;PHASE COUNT (40 MSEC)
0110 2480     379 PTE:     JMP   PATHE        ;POWER FLOW/QUADRANT LOGIC & SIN/COS (47 MSEC)
0112 6403     380 PTF:     JMP   PATHF        ;"VC" COMPUTATION (60 MSEC)
0114 6482     381 PTG:     JMP   PATHG        ;MJ-1A CONTROL ALGORITHM & DATA/PAK OUT (40 MSEC)
              382
0116 3400     383 START:   CALL  XRETI        ;SET UP STACK FOR "RETI"
0118 B83F     384          MOV   R0,#PATH
011A 10       385          INC   @R0          ;SELECT NEXT PATH
011B F0       386          MOV   A,@R0
011C 5307     387          ANL   A,#00000111B ;ALL PATHS COMPLETED ?
011E 9622     388          JNZ   PAGE1        ;NO, JMP
0120 17       389          INC   A            ;YES, RESET PATH CODE TO PATH "A"
0121 A0       390          MOV   @R0,A
0122 B3       391 PAGE1:   JMPP  @A           ;JUMP TO SELECTED PATH
              392
              393
              394
003D          395          ORG   PAGE0+1      ;PAGE 0
              396
003D B82F     397 FINISH:  MOV   R0,#TALERT
003F F0       398          MOV   A,@R0
0040 537F     399          ANL   A,#01111111B ;CLEAR "PATH INCOMPLETE" FLAG
```

```
LOC  OBJ       LINE         SOURCE STATEMENT
0042 A0        400             MOV     @R0,A           ;UPDATE "PATH" STATUS
0043 0405      401 PAGEOA: JMP     DEADTM          ;DEADTIME
               402
               403 $EJECT
               404
0123           405             ORG     PAGE1+1         ;PAGE 1
               406
               407 ;****************************************************
               408 ;*
               409 ;*   PATH "C" - DERIVE FREQUENCY COUNT :
               410 ;*
               411 ;*      ENTRY CONDITION(S):   NONE
               412 ;*      EXIT CONDITION(S):    NONE
               413 ;*
               414 ;*      TIME:  40 MSEC @ 50 HZ
               415 ;*
               416 ;****************************************************
               417
0123 5441      418 PATHC:  CALL    PTSYNC          ;SYNC TO (-) P.T. ZERO CROSS
               419                                 ;WAIT FOR 2ND (-) P.T. ZERO CROSS
0125 5625      420 PTNEG2: JT1     PTNEG2          ;LOW ?
               421                                 ;YES
0127 5456      422             CALL    DELAY3          ;DEBOUNCE FALLING EDGE
0129 5625      423             JT1     PTNEG2          ;STILL LOW ?
               424                                 ;YES (GOOD LOW)
012B 462B      425 PTPOS2: JNT1    PTPOS2          ;HIGH ?
               426                                 ;YES
012D 5456      427             CALL    DELAY3          ;(305)DEBOUNCE RISING EDGE [OFFSETS ZERO TIME]
012F 462B      428             JNT1    PTPOS2          ;(307)STILL HIGH ?
               429                                 ;YES
0131 545B      430             CALL    ZCOUNT          ;DERIVE FREQUENCY COUNT
0133 B818      431             MOV     R0,#CFREQ
0135 1445      432             CALL    CPACK           ;PACK FREQ. COUNT
               433
0137 0430      434 XPATHC: JMP     FINISH
               435
               436 $EJECT
               437
               438 ;****************************************************
               439 ;*
               440 ;*   PATH "D" - DERIVE PHASE COUNT :
               441 ;*
               442 ;*      ENTRY CONDITION(S):   NONE
               443 ;*      EXIT CONDITION(S):    NONE
               444 ;*
               445 ;*      TIME:  40 MSEC @ 50 HZ
               446 ;*
               447 ;****************************************************
               448
0139 B925      449 PATHD:  MOV     R1,#ISAVG       ;TEST FOR OVERCURRENT
013B 1465      450             CALL    ANLOVF          ;ISAVG > 700MA ? (350%)
013D E645      451             JNC     CTLOW           ;NO, JMP
013F BC08      452             MOV     R4,#00001000B
0141 D4F6      453             CALL    ALERT1          ;HIGH C.T. ALERT
0143 2462      454             JMP     EXITD           ;YES, EXIT (FREEZE FREQ. & PHASE COUNTS
               455                                 ;AND POWER FLOW LOGIC)
0145 B925      456 CTLOW:  MOV     R1,#ISAVG
0147 B837      457             MOV     R0,#RA+1        ;LOAD 2% (4.0 MA)
0149 B000      458             MOV     @R0,#00H        ;  C.T. UNDERCURRENT
014B B836      459             MOV     R0,#RA          ;    THRESHOLD
014D B010      460             MOV     @R0,#10H
014F D467      461 CTHOLD: CALL    COMPDB  ; UNDERCURRENT (ISAVG < 2% [4 MA] THRESHOLD) ?
0151 F66A      462             JC      PTZERO  ;NO, JUMP
               463                                 ;YES (FREEZE PHASE/FREQ COUNTS & POWER FLOW LOGIC)
0153 BC10      464             MOV     R4,#00010000B
0155 D4F6      465             CALL    ALERT1          ;LOW C.T. ALERT
0157 B831      466             MOV     R0,#IDCODE
0159 F0        467             MOV     A,@R0           ;READ I.D. SW CODE
015A F7        468             RLC     A
015B F7        469             RLC     A               ;MIN C.T. TAPCHANGE INHIBIT SELECTED ?
015C F662      470             JC      EXITD           ;NO, JMP
015E B834      471             MOV     R0,#TAPCMD      ;YES
0160 B000      472             MOV     @R0,#00         ;DISABLE AUTO TAPCHANGES (0-> TAPCMD)
0162 B82D      473 EXITD:  MOV     R0,#STATUS
0164 F0        474             MOV     A,@R0           ;SET OVER/UNDER C.T. LIMIT
0165 4308      475             ORL     A,#00001000B
0167 A0        476             MOV     @R0,A           ;   PREVAILING FLAG
```

```
LOC  OBJ       LINE         SOURCE STATEMENT 0168 247E      477          JMP    XPATHD
               478
016A 5441      479 PTZERO:  CALL   PTSYNC          ;SYNC TO (-) P.T. ZERO CROSS
               480                                 ;SYNC TO (-) C.T. ZERO CROSS
016C 366C      481 CTNEG:   JTO    CTNEG           ;LOW ?
               482                                 ;YES
016E 5456      483          CALL   DELAY3          ;DEBOUNCE FALLING EDGE
0170 366C      484          JTO    CTNEG           ;STILL LOW ?
               485                                 ;YES (GOOD LOW)
0172 2672      486 CTPOS:   JNTO   CTPOS           ;HIGH ?
               487                                 ;YES
0174 5456      488          CALL   DELAY3          ;(305)DEBOUNCE RISING EDGE [OFFSETS ZERO TIME]
0176 2672      489          JNTO   CTPOS           ;(307)STILL HIGH ?
               490                                 ;YES (GOOD HIGH)
0178 545B      491          CALL   ZCOUNT          ;DERIVE PHASE COUNT
017A B81A      492          MOV    R0,#CPHASE
017C 1445      493          CALL   CPACK           ;PACK PHASE COUNT
               494
017E 043D      495 XPATHD:  JMP    FINISH
               496
               497 $EJECT
               498
               499 ;*****************************************
               500 ;*
               501 ;*    PATH "E"  -  POWER FLOW/QUADRANT LOGIC & SIN/COS
               502 ;*
               503 ;*        ENTRY CONDITION(S):     NONE
               504 ;*        EXIT  CONDITION(S):     NONE
               505 ;*
               506 ;*        TIME:   47 MSEC
               507 ;*
               508 ;*****************************************
               509
               510
0180 B92D      511 PATHE:   MOV    R1,#STATUS
0182 F1        512          MOV    A,@R1
0183 47        513          SWAP   A
0184 F7        514          RLC    A               ;OVER/UNDER C.T. PREVAILING ?
0185 E689      515          JNC    LOGIC0          ;PAGE BOUNDRY
0187 443F      516          JMP    XPATHE          ;YES, JMP
0189 B831      517 LOGIC0:  MOV    R0,#IDCODE      ;ZERO-CROSS LOGIC :
018B F0        518          MOV    A,@R0           ;READ I.D. SW CODE
018C AC        519          MOV    R4,A            ;SAVE I.D. -> "R4"
018D B818      520          MOV    R0,#CFREQ
018F B905      521          MOV    R1,#REG5
0191 F49C      522          CALL   MOVE2           ;MOVE "CFREQ" -> "R6-R5"
0193 27        523          CLR    A
0194 AF        524          MOV    R7,A
0195 B801      525          MOV    R0,#01
0197 14B8      526          CALL   RSHIFT          ;COMPUTE: (CFREQ/2) -> "R7-R6-R5"
0199 FC        527          MOV    A,R4
019A 67        528          RRC    A
019B F6A2      529          JC     U2180           ;JMP - INVERTED REG.
019D 67        530          RRC    A
019E E6A5      531          JNC    ADD180          ;JMP - STRAIGHT "U2"
01A0 24AB      532          JMP    X180
01A2 67        533 U2180:   RRC    A
01A3 E6AB      534          JNC    X180            ;JMP - STRAIGHT "U2"
01A5 B805      535 ADD180:  MOV    R0,#REG5        ;SHIFT PHASE COUNT BY 180 DEG
01A7 B91A      536          MOV    R1,#CPHASE      ; CPHASE + (CFREQ/2) -> "CPHASE"
01A9 D474      537          CALL   ADDD8
01AB B801      538 X180:    MOV    R0,#01
01AD 14B8      539          CALL   RSHIFT          ;COMPUTE: (CFREQ/4) -> "R7-R6-R5"
01AF B818      540          MOV    R0,#CFREQ
01B1 B91A      541          MOV    R1,#CPHASE      ;OFFSET PHASE CNT BY 360 DEG
01B3 D474      542          CALL   ADDD8           ;COMPUTE: CPHASE + CFREQ -> CPHASE
01B5 FC        543          MOV    A,R4
01B6 F7        544          RLC    A               ;NOTE: "A" IS NOT DESTROYED
01B7 E6BF      545          JNC    YDELTA          ;JMP - 90 DEG C.T. FILTER LAG OUT
01B9 B805      546          MOV    R0,#REG5
01BB B91A      547          MOV    R1,#CPHASE      ;OFFSET PHASE CNT BY 90 DEG
01BD D464      548          CALL   SUBD2S          ;COMPUTE: CPHASE - (CFREQ/4) -> CPHASE
01BF 47        549 YDELTA:  SWAP   A               ; A = SHIFTED I.D. CODE
01C0 67        550          RRC    A
01C1 E6E6      551          JNC    PRATIO          ;JMP - WYE REG. CONFIGURATION
01C3 B818      552          MOV    R0,#CFREQ       ;POINT TO DIVISOR
```

| LOC OBJ | LINE | | SOURCE STATEMENT | |
|---|---|---|---|---|
| 01C5 BE80 | 553 | MOV | R6,#80H | ;SET |
| 01C7 BF01 | 554 | MOV | R7,#01H | ; DIVIDEND = 12*(32) |
| 01C9 D431 | 555 | CALL | DIV2X2 | ;COMPUTE: (12/CFREQ)*2**15 -> "R6-R5" |
| 01CB D4EA | 556 | CALL | TR65RA | |
| 01CD B836 | 557 | MOV | R0,#RA | ;POINT TO (12/CFREQ)*2**15 |
| 01CF BE20 | 558 | MOV | R6,#32 | ;SET |
| 01D1 BF00 | 559 | MOV | R7,#00 | ; DIVIDEND = 1*(32) |
| 01D3 D431 | 560 | CALL | DIV2X2 | ;COMPUTE: (CFREQ/12) -> "R6-R5"[30DEG] |
| 01D5 B831 | 561 | MOV | R0,#IDCODE | |
| 01D7 F0 | 562 | MOV | A,@R0 | ;RESTORE I.D. |
| 01D8 5304 | 563 | ANL | A,#00000100B | |
| 01DA 96E0 | 564 | JNZ | LEAD30 | ;JMP - 30 DEG DELTA LEAD |
| 01DC B905 | 565 LAG30: | MOV | R1,#REG5 | |
| 01DE F446 | 566 | CALL | CMP2S | ;30 DEG DELTA LAG |
| 01E0 B805 | 567 LEAD30: | MOV | R0,#REG5 | |
| 01E2 B91A | 568 | MOV | R1,#CPHASE | |
| 01E4 D474 | 569 | CALL | ADDDB | ;COMPUTE: (CPHASE) +/- (30DEG) -> (CPHASE) |
| | 570 | | | |
| 01E6 B818 | 571 PRATIO: | MOV | R0,#CFREQ | |
| 01E8 B91A | 572 | MOV | R1,#CPHASE | |
| 01EA D467 | 573 | CALL | COMPDB | ;IS (CPHASE) <= (CFREQ) ? |
| 01EC E6F2 | 574 | JNC | FPART | ;YES, JMP |
| 01EE D4A4 | 575 | CALL | SUBD2S | ;NORMALIZE PHASE COUNT |
| 01F0 24E6 | 576 | JMP | PRATIO | |
| | 577 | | | |
| 01F2 F1 | 578 FPART: | MOV | A,@R1 | ;NOTE: R0 POINTS TO DIVISOR |
| 01F3 AE | 579 | MOV | R6,A | ;TRANSFER |
| 01F4 19 | 580 | INC | R1 | ; "CPHASE" TO |
| 01F5 F1 | 581 | MOV | A,@R1 | ; "R7-R6" [DIVIDEND] |
| 01F6 AF | 582 | MOV | R7,A | |
| 01F7 D431 | 583 | CALL | DIV2X2 | ;COMP. FRACTIONAL PART: (CPHASE/CFREQ)*2**15 |
| 01F9 B801 | 584 | MOV | R0,#01 | |
| 01FB D458 | 585 | CALL | LSHIFT | ;SCALE F.P.: (4*CPHASE/CFREQ)*2**14 -> R6-R5 |
| | 586 | | | |
| 01FD B92D | 587 | MOV | R1,#STATUS | |
| 01FF FE | 588 | MOV | A,R6 | ;DERIVE |
| 0200 E7 | 589 | RL | A | |
| 0201 5380 | 590 | ANL | A,#10000000B | ; QUADRANT INFO FROM |
| 0203 DE | 591 | XRL | A,R6 | |
| 0204 53C0 | 592 | ANL | A,#11000000B | ; FRACTIONAL PART (BITS 15-14) |
| 0206 AA | 593 | MOV | R2,A | ; 00 = QUAD 4 - FPF(LAG) |
| 0207 F1 | 594 | MOV | A,@R1 | ; 01 = QUAD 3 - RPF(LEAD) |
| 0208 533F | 595 | ANL | A,#00111111B | ; 10 = QUAD 2 - RPF(LAG) |
| 020A 4A | 596 | ORL | A,R2 | ; 11 = QUAD 1 - FPF(LEAD) |
| 020B A1 | 597 | MOV | @R1,A | ;SAVE QUADRANT STATUS |
| | 598 | | | |
| | 599 ;*** | POWER FLOW LOGIC | *** | |
| | 600 | | | |
| 020C B82E | 601 | MOV | R0,#PFSTAT | ;NOTE: R1 POINTS TO "STATUS" |
| | 602 | | | ; A = STATUS |
| 020E D0 | 603 | XRL | A,@R0 | |
| 020F F7 | 604 | RLC | A | ;MODE CHANGE DETECTED ? |
| 0210 E61E | 605 | JNC | TRESET | ;NO, JMP & RESET MODE TIMER |
| 0212 10 | 606 | INC | @R0 | ;YES, INCREMENT MODE TIMER |
| 0213 F0 | 607 | MOV | A,@R0 | |
| 0214 47 | 608 | SWAP | A | |
| 0215 F7 | 609 | RLC | A | ;MODE TIMER OVERFLOW (4.6 SEC) ? |
| 0216 E622 | 610 | JNC | LIMPF | ;NO, JMP |
| 0218 F1 | 611 | MOV | A,@R1 | ;YES |
| 0219 F7 | 612 | RLC | A | |
| 021A F0 | 613 | MOV | A,@R0 | ;RECONFIGURE "STATUS" |
| 021B E7 | 614 | RL | A | |
| 021C 67 | 615 | RRC | A | ; FOR DETECTED MODE |
| 021D A0 | 616 | MOV | @R0,A | |
| 021E F0 | 617 TRESET: | MOV | A,@R0 | |
| 021F 53E0 | 618 | ANL | A,#11100000B | ;CLEAR MODE TIMER |
| 0221 A0 | 619 | MOV | @R0,A | ;SAVE POWER FLOW STATUS |
| | 620 | | | |
| | 621 ;*** | | *** | |
| | 622 | | | |
| 0222 FE | 623 LIMPF: | MOV | A,R6 | |
| 0223 533F | 624 | ANL | A,#00111111B | ;LIMIT PHASE DIFF < 90 DEG |
| 0225 AE | 625 | MOV | R6,A | |
| 0226 D4EA | 626 | CALL | TR65RA | ;(CPHASE/90 DEG)*2**14 -> "RA" |
| | 627 | | | |
| 0228 F414 | 628 | CALL | SINCOS | ;COMPUTE SIN/COS OF P.F. ANGLE |
| 022A B92D | 629 | MOV | R1,#STATUS | |

```
LOC  OBJ        LINE        SOURCE STATEMENT

022C F1         630             MOV     A,@R1
022D F7         631             RLC     A
022E F7         632             RLC     A
022F E637       633             JNC     SAVEPF          ;JMP - LAGGING P.F.
0231 FC         634             MOV     A,R4
0232 2E         635             XCH     A,R6            ;SWAP
0233 4C         636             MOV     R4,A
0234 FD         637             MOV     A,R5            ;  SIN/COS
0235 2F         638             XCH     A,R7
0236 AD         639             MOV     R5,A            ;   FUNCTIONS
                640
0237 B804       641 SAVEPF: MOV R0,#REG4         ;TRANSFER
0239 B927       642             MOV     R1,#SINPF       ;  RESULT TO
023B BB04       643             MOV     R3,#04          ;   "SINPF" AND "COSPF"
023D F49E       644             CALL    MOVE
                645
023F 0430       646 XPATHE: JMP FINISH
                647
                648
                649 $EJECT
                650
                651 ;************************************************
                652 ;*
                653 ;*   SYNC TIMER TO (-) P.T. ZERO CROSS
                654 ;*   AND SAVE TIMER "PTZERO" VALUE :
                655 ;*
                656 ;*      ENTRY CONDITION(S):    NONE
                657 ;*
                658 ;*      EXIT  CONDITION(S):
                659 ;*          "R0" = "T" VALUE AT 1ST (-) P.T. ZERO CROSS
                660 ;*           R0  = 1 (1ST PASS FLAG)
                661 ;*
                662 ;************************************************
                663
0241 B93A       664 PTSYNC: MOV R1,#RD           ;POINT TO "PTZERO" COUNT REG.
0243 B801       665         MOV     R0,#01          ;SET "ZCOUNT" 1ST PASS FLAG
                666
                667                                 ;SYNC TO (-) P.T. ZERO CROSS
0245 5645       668 PTNEG:  JT1     PTNEG           ;LOW ?
                669                                 ;YES
0247 5456       670         CALL    DELAY3          ;DEBOUNCE FALLING EDGE
0249 5645       671         JT1     PTNEG           ;STILL LOW ?
                672                                 ;YES (GOOD LOW)
024B 464B       673 PTPOS:  JNT1    PTPOS           ;HIGH ?
                674                                 ;YES
024D 5456       675         CALL    DELAY3          ;(305)DEBOUNCE RISING EDGE [OFFSETS ZERO TIME]
024F 464B       676         JNT1    PTPOS           ;(307)STILL HIGH ?
                677                                 ;YES (GOOD HIGH)
0251 00         678         NOP                     ;(1) OFFSET FOR "CALL ZCOUNT"
0252 55         679         STRT    T               ;(2) SYNC PRESCALER: T = XXXXXXXX00000
0253 42         680         MOV     A,T             ;(3)
0254 A1         681         MOV     @R1,A           ;(4) SAVE "PTZERO" TIME COUNT
0255 83         682         RET                     ;(5)
                683
                684 ;************************************************
                685 ;*
                686 ;*   3 MSEC COMPARATOR DEBOUNCE DELAY :
                687 ;*
                688 ;************************************************
                689
0256 BA96       690 DELAY3: MOV R2,#150
0258 EA58       691 DELAYX: DJNZ R2,DELAYX          ;DELAY 3 MSEC'S
025A 83         692         RET
                693
                694
                695
                696 ;************************************************
                697 ;*
                698 ;*   READ TIMER, DERIVE PRESCALER VALUE, AND
                699 ;*   COMPUTE "ZERO-CROSS" TIME COUNT :
                700 ;*
                701 ;*      ENTRY CONDITION(S):
                702 ;*          "R0" = "T" VALUE AT 1ST (+) P.T. ZERO-CROSS(PTZERO)
                703 ;*          "R0" = 1 (ZCOUNT 1ST PASS FLAG)
                704 ;*
```

| LOC OBJ | LINE | SOURCE STATEMENT | | | |
|---|---|---|---|---|---|
| | 705 | ;* | EXIT CONDITIONS: | | |
| | 706 | ;* | | "R7" = PRESCALER VALUE/2 (LSN TIME COUNT) | |
| | 707 | ;* | | "R2" = ZERO-CROSS MSD + MSN TIME COUNT | |
| | 708 | ;* | | | |
| | 709 | ;************************************************ | | | |
| | 710 | | | | |
| 025B 42 | 711 | ZCOUNT: MOV | A,T | ;(1) READ TIMER 8 TIMES & SAVE | |
| 025C 29 | 712 | XCH | A,R1 | ;(2) SAVE "T" VALUE AT 2ND ZERO-CROSS | |
| 025D 42 | 713 | MOV | A,T | ;(3) TIMER | |
| 025E 2A | 714 | XCH | A,R2 | ;(4) | |
| 025F 42 | 715 | MOV | A,T | ;(5) PRESCALER | |
| 0260 2B | 716 | XCH | A,R3 | ;(6) | |
| 0261 42 | 717 | MOV | A,T | ;(7) INCREMENTED | |
| 0262 2C | 718 | XCH | A,R4 | ;(8) | |
| 0263 42 | 719 | MOV | A,T | ;(9) BY TWO | |
| 0264 2D | 720 | XCH | A,R5 | ;(10) | |
| 0265 42 | 721 | MOV | A,T | ;(11) EIGHT | |
| 0266 2E | 722 | XCH | A,R6 | ;(12) | |
| 0267 42 | 723 | MOV | A,T | ;(13) TIMES | |
| 0268 2F | 724 | XCH | A,R7 | ;(14) | |
| 0269 42 | 725 | MOV | A,T | ;(15) | |
| 026A 6F | 726 | ADD | A,R7 | ;(16) SUM SAVED "T" VALUES | |
| 026B 6E | 727 | ADD | A,R6 | ;(17) | |
| 026C 6D | 728 | ADD | A,R5 | ;(18) | |
| 026D 6C | 729 | ADD | A,R4 | ;(19) | |
| 026E 6B | 730 | ADD | A,R3 | ;(20) | |
| 026F 6A | 731 | ADD | A,R2 | ;(21) | |
| 0270 69 | 732 | ADD | A,R1 | ;(22) | |
| | 733 | | | | |
| 0271 5307 | 734 | ANL | A,#00000111B | ;(24) SELECT LOWER 3 BITS | |
| 0273 E883 | 735 | DJNZ | R0,PASS2 | ;(26) EXIT IF NOT 1ST PASS | |
| 0275 AF | 736 | MOV | R7,A | ;(27) SAVE TIME COUNT LSN | |
| 0276 F9 | 737 | MOV | A,R1 | ;(28) READ "T" VALUE AT 2ND ZERO-CROSS | |
| 0277 B93B | 738 | MOV | R1,#RDMSD1 | ;(30) POINT TO REG. D MSD1 | |
| 0279 A1 | 739 | MOV | @R1,A | ;(31) SAVE "T2ZERO" VALUE | |
| 027A FF | 740 | MOV | A,R7 | ;(32) RESTORE TIME COUNT LSN | |
| 027B 968E | 741 | JNZ | OVF | ;(34) JMP IF PRESCALER OVERFLOWED AND | |
| | 742 | | ; | COMPENSATE FOR 2ND PASS MISSED "ADDS" | |
| 027D BF05 | 743 | MOV | R7,#5 | ;(36) 48 CYCLE PRESCALER POSITION DELAY | |
| 027F EF7F | 744 | PDELAY: DJNZ | R7,PDELAY | ;(46) *POINT TO 2ND 16 CYCLE* | |
| 0281 445B | 745 | JMP | ZCOUNT | ;(48) *PRESCALER STATE COUNT* | |
| | 746 | | | | |
| 0283 9690 | 747 | PASS2: JNZ | XZCNT | ;JUMP IF PRESCALER COUNT NOT ZERO | |
| 0285 AF | 748 | MOV | R7,A | ;SAVE TIME COUNT LSN | |
| 0286 B83B | 749 | MOV | R0,#RDMSD1 | ;POINT TO "T" VALUE FOR 1ST 16 CYCLE COUNT | |
| 0288 F9 | 750 | MOV | A,R1 | ;LOAD "T" VALUE FOR 2ND 16 CYCLE COUNT | |
| 0289 D0 | 751 | XRL | A,@R0 | ;DID PRESCALER OVERFLOW TWICE ? | |
| 028A 67 | 752 | RRC | A | | |
| 028B FF | 753 | MOV | A,R7 | ;RESTORE TIME COUNT LSN | |
| 028C F690 | 754 | JC | XZCNT | ;* NO, JUMP | |
| | 755 | | | ;* YES, ADD EIGHT TO COMPENSATE | |
| | 756 | | | ;* FOR MISSED STATE COUNT | |
| | 757 | | | | |
| 028E 0308 | 758 | OVF: ADD | A,#8 | | |
| | 759 | | | | |
| 0290 AF | 760 | XZCNT: MOV | R7,A | ;SAVE TIME COUNT LSN | |
| 0291 B83A | 761 | MOV | R0,#RD | ;POINT TO 1ST ZERO-CROSS(PTZERO) | |
| 0293 F0 | 762 | MOV | A,@R0 | | |
| 0294 37 | 763 | CPL | A | ;2'S COMPLEMENT | |
| 0295 17 | 764 | INC | A | | |
| 0296 18 | 765 | INC | R0 | ;POINT TO 2ND ZERO-CROSS(T2ZERO) | |
| 0297 60 | 766 | ADD | A,@R0 | ;"A" = (T2ZERO - T1ZERO) | |
| 0298 AA | 767 | MOV | R2,A | ;MSD + MSN TIME COUNT | |
| 0299 83 | 768 | XCOUNT: RET | | | |
| | 769 | | | | |
| | 770 | $EJECT | | | |

```
LOC  OBJ          LINE       SOURCE STATEMENT 771
0045               772         ORG     PAGE0A+2              ;PAGE 0
                   773
                   774 ;****************************************
                   775 ;*
                   776 ;*   PACK COMPUTED "ZERO-CROSS" TIME COUNT :
                   777 ;*
                   778 ;*     ENTRY CONDITION(S):
                   779 ;*            "R0" = POINTS TO COUNT LSD STORAGE LOCATION
                   780 ;*            "R2" = TIME COUNT MSD + MSN
                   781 ;*            "R7" = TIME COUNT LSN
                   782 ;*
                   783 ;*     EXIT  CONDITION(S):
                   784 ;*            "R1" IS DESTROYED
                   785 ;*
                   786 ;****************************************
                   787
0045 B902          788 CPACK:  MOV     R1,WREG2
0047 FF            789         MOV     A,R7         ;LOAD TIME COUNT LSN
0048 31            790         XCHD    A,@R1        ;EXCHANGE LSN & MSDL
0049 47            791         SWAP    A            ;POSITION MSDL
004A 31            792         XCHD    A,@R1        ;POSITION LSN
004B A0            793         MOV     @R0,A        ;SAVE COUNT LSD
004C FA            794         MOV     A,R2
004D 47            795         SWAP    A            ;POSITION MSDH
004E 18            796         INC     R0
004F A0            797         MOV     @R0,A        ;SAVE COUNT MSD
0050 83            798         RET
                   799
                   800 $EJECT
                   801
                   802
                   803 ;****************************************
                   804 ;*
                   805 ;*   PATH "A"  -  COMPUTE P.T. INPUT MAGNITUDE :
                   806 ;*
                   807 ;*     ENTRY CONDITION(S):   NONE
                   808 ;*
                   809 ;*     EXIT  CONDITION(S):   NONE
                   810 ;*
                   811 ;*
                   812 ;*     TIME:    57 MSEC - AVERAGE SAMPLE (TYP)
                   813 ;*              75 MSEC - RMS SAMPLE (TYP)
                   814 ;*
                   815 ;****************************************
                   816
0051 85            817 PATHA:  SEL     AN0          ;SELECT P.T. A/D CH.
0052 54A3          818         CALL    RADRMS       ;COMPUTE P.T. RMS VALUE
0054 1475          819         CALL    OPNULL       ;OPERATOR "NULL" ADJUSTMENT
0056 B923          820         MOV     R1,WVSAVG    ;POINT TO PREVIOUS P.T. AVG
0058 145C          821         CALL    RUNAVG       ;COMPUTE NEW RUNNING AVERAGE
005A 0430          822 PAGE0B: JMP     FINISH       ;PATH "B" FINISHED
                   823
029A               824         ORG     XCOUNT+1     ;PAGE 2
                   825
                   826 ;****************************************
                   827 ;*
                   828 ;*   PATH "B"  -  COMPUTE C.T. INPUT MAGNITUDE :
                   829 ;*
                   830 ;*     ENTRY CONDITION(S):   NONE
                   831 ;*
                   832 ;*     EXIT  CONDITION(S):   NONE
                   833 ;*
                   834 ;*
                   835 ;*     TIME:    57 MSEC - AVERAGE SAMPLE (TYP)
                   836 ;*              75 MSEC - RMS SAMPLE (TYP)
                   837 ;*
                   838 ;****************************************
                   839
029A 95            840 PATHB:  SEL     AN1          ;SELECT C.T. A/D CH. & CONVERT
029B 54A3          841         CALL    RADRMS       ;COMPUTE C.T. RMS VALUE
029D B925          842         MOV     R1,WISAVG    ;POINT TO PREVIOUS C.T. AVG
029F 145C          843         CALL    RUNAVG       ;COMPUTE NEW RUNNING AVERAGE
02A1 0430          844 XPATHB: JMP     FINISH       ;PATH "C" FINISHED
                   845
                   846 $EJECT
```

```
LOC  OBJ        LINE        SOURCE STATEMENT 005C             847            ORG      PAGE0B+2         ;PAGE 0
                 848
                 849  ;************************************************
                 850  ;*
                 851  ;*    AVERAGE NEW "RMS" VALUE WITH PREVIOUSLY SAVED
                 852  ;*    AVERAGE AND UPDATE RUNNING AVERAGE :
                 853  ;*
                 854  ;*        ENTRY CONDITION(S):
                 855  ;*             "R1" = POINTS TO PREVIOUSLY SAVED AVERAGE
                 856  ;*             "RA" = CONTAINS "LSD" OF NEW "RMS" VALUE
                 857  ;*             "RAMSD" = CONTAINS "MSD" OF NEW "RMS" VALUE
                 858  ;*
                 859  ;*        EXIT  CONDITION(S):    NONE
                 860  ;*
                 861  ;************************************************
                 862
                 863            IF  ASM2 EQ 1
                 864
                 865  RUNAVG: MOV      R0,#RA
                 866            MOV      A,@R0           ;LOAD NEW "RMS" LSD
                 867            ADD      A,@R1           ;ADD LSD'S
                 868            MOV      @R0,A           ;
                 869            INC      R1              ;POINT TO AVG. MSD
                 870            INC      R0
                 871            MOV      A,@R0           ;LOAD NEW "RMS" MSD
                 872            ADDC     A,@R1           ;ADD MSD'S + CARRY FROM LSD ADD
                 873            RRC      A               ;DIVIDE MSD SUM BY 2
                 874            MOV      @R1,A           ;SAVE MSD AVERAGE
                 875            MOV      A,@R0
                 876            RRC      A               ;DIVIDE LSD SUM BY 2
                 877            DJNZ     R1,LSDAVG       ;POINT TO LSD AVERAGE
                 878  LSDAVG: MOV       @R1,A           ;SAVE LSD AVERAGE
                 879            CALL     ANALOG          ;TEST ANALOG VALUE FOR OVERFLOW
                 880                                     ; (VS > 179.25 VOLTS; IS > 700 MA)
                 881            RET
                 882
                 883            ELSE
                 884
005C F9          885  RUNAVG: MOV       A,R1            ;SAVE "RMSAVG" LSD ADDRESS
005D B836        886            MOV      R0,#RA
005F F49C        887            CALL     MOVE2           ;MOVE "RA" -> "RMSAVG"
0061 A9          888            MOV      R1,A            ;POINT TO "RMS" VALUE LSD
0062 1465        889            CALL     ANLOVF          ;TEST ANALOG VALUE FOR OVERFLOW & LIMIT :
                 890                                     ; (VS > 179.25 VOLTS; IS > 700 MA)
0064 83          891  PAGE0C: RET
                 892
                 893            ENDIF
                 894
                 895
                 896  $EJECT
02A3             897            ORG      XPATHB+2        ;PAGE 2
                 898
                 899  ;************************************************
                 900  ;*
                 901  ;*    INPUT SELECTED A/D CHANNEL AND DERIVE "RMS" VALUE OF
                 902  ;*    INPUT WAVEFORM THROUGH EITHER A TRUE "AVERAGE" OR
                 903  ;*    TRUE "RMS" SAMPLING TECHNIQUE :
                 904  ;*
                 905  ;*        ENTRY CONDITION(S):
                 906  ;*             A/D CHANNEL SELECTED
                 907  ;*                 1. AN0 = VOLTAGE
                 908  ;*                 2. AN1 = CURRENT
                 909  ;*
                 910  ;*        EXIT  CONDITION(S):
                 911  ;*             "RA" = LSD OF NEW "RMS" VALUE
                 912  ;*             "RAMSD" = MSD OF NEW "RMS" VALUE
                 913  ;*
                 914  ;*        NOTE:  "RMS" VALUE IS SCALED AS FOLLOWS  - NORMAL OPERATING RANGES:
                 915  ;*                 1. VOLTAGE(VSRMS)= 16 * VS       (90V<VS<145V)
                 916  ;*                 2. CURRENT(ISRMS)= 4096 * IS     (.004A<IS<.64A)
                 917  ;*
                 918  ;************************************************
                 919
                 920
02A3 BA9C        921  RADRMS: MOV       R2,#CONFIG      ;READ CONFIGURATION I.D. SW.
02A5 14C5        922            CALL     IOSEL
```

```
LOC  OBJ        LINE       SOURCE STATEMENT
02A7 BB31        923       MOV    R0,#IDCODE
02A9 A0          924       MOV    @R0,A           ;SAVE CONFIGURATION I.D. CODE
02AA 47          925       SWAP   A
02AB 67          926       RRC    A               ;SAVE RMS/AVG BIT STATUS IN "C" (SW4)
02AC 27          927       CLR    A               ;CLEAR A/D SUM REGISTERS
02AD AD          928       MOV    R5,A
02AE AE          929       MOV    R6,A
02AF AF          930       MOV    R7,A
02B0 E6E1        931       JNC    SELRMS          ;JMP - "RMS" SAMPLE SELECTED
                 932                              ;NO JMP - "AVG" SAMPLE SELECTED
                 933
                 934  ;**********************************************
                 935  ;*
                 936  ;*    TRUE "AVERAGE" SAMPLING ALGORITHM :
                 937  ;*
                 938  ;*        ENTRY CONDITION(S):
                 939  ;*            "A" IS CLEARED
                 940  ;*
                 941  ;**********************************************
                 942
02B2 AA          943  SELAVG: MOV  R2,A           ;SET UP 190/200USEC LOOP FLAG
02B3 AB          944          MOV  R3,A           ;SET UP 256 SAMPLE COUNT
                 945
                 946  ;***  SUM A/D 256 TIMES WITHIN A 50MSEC WINDOW       ***
                 947  ;***                                                 ***
                 948  ;***  NOTE: AN AVERAGE A/D SAMPLE LOOP TIME OF       ***
                 949  ;***        195USEC IS OBTAINED BY ALTERNATELY       ***
                 950  ;***        GENERATING 190USEC AND 200USEC LOOP      ***
                 951  ;***        TIMES. THIS WILL THEN RESULT IN A        ***
                 952  ;***        SAMPLE WINDOW TIME OF-                   ***
                 953  ;***                                                 ***
                 954  ;***        (256) * 195USEC = 49.92MSEC              ***
                 955
02B4 80          956  TAVG:   RAD                 ;(2) READ A/D
02B5 6E          957          ADD  A,R6           ;(3) ADD LSD OF A/D SUM
02B6 AE          958          MOV  R6,A           ;(4) SAVE LSD SUM
02B7 27          959          CLR  A              ;(5)
02B8 7F          960          ADDC A,R7           ;(6) ADD MSD + LSD SUM CARRY
02B9 AF          961          MOV  R7,A           ;(7)
02BA EBBE        962          DJNZ R3,ASYNC       ;(9) 256 SAMPLES TAKEN ?
02BC 44C9        963          JMP  FAVG           ;     YES, JMP FINISH AVG.
02BE FA          964  ASYNC:  MOV  A,R2           ;(10)
02BF D3FF        965          XRL  A,#0FFH        ;(12) TOGGLE 190/200USEC LOOP FLAG
02C1 AA          966          MOV  R2,A           ;(13)
02C2 96C5        967          JNZ  DLY90          ;(15) JMP - DELAY 190USEC
02C4 00          968  DLY100: NOP                 ;(X) NO JMP - DELAY 200USEC
02C5 00          969  DLY90:  NOP                 ;(16-17)
02C6 00          970          NOP                 ;(17-18)
02C7 44B4        971          JMP  TAVG           ;(19-20) 190/200USEC LOOP TIME
                 972
                 973  ;***                                                 ***
                 974
02C9 8936        975  FAVG:   MOV  R1,#RA
02CB FE          976          MOV  A,R6           ;LOAD LSD OF A/D SUM
02CC A1          977          MOV  @R1,A          ;STORE LSD
02CD 19          978          INC  R1
02CE FF          979          MOV  A,R7           ;LOAD MSD OF A/D SUM
02CF A1          980          MOV  @R1,A          ;STORE MSD OF MULTIPLICAND
02D0 BB3A        981          MOV  R0,#RD
02D2 B08E        982          MOV  @R0,#PI2SQ2    ;LOAD (2**7) * PI/(2*SQR 2) IN
                 983                              ;LSD OF MULTIPLIER
02D4 18          984          INC  R0
02D5 27          985          CLR  A              ;CLEAR MSD
02D6 A0          986          MOV  @R0,A          ;STORE MSD OF MULTIPLIER
02D7 D4C5        987          CALL MPY2X2         ;CONVERT TRUE "AVERAGE" VALUE TO "RMS"
02D9 BB03        988          MOV  R0,#3          ;DIVIDE "MPY2X2" RESULT BY 8
02DB 14BB        989          CALL RSHIFT
                 990                              ;"VSRMS" SCALED TO (16 * VS)
                 991                              ;"ISRMS" SCALED TO (4096 * IS)
02DD D4EA        992          CALL TR65RA
02DF 6402        993          JMP  XADRMS         ;EXIT (ANSWER: RA)
                 994
                 995
                 996  ;**********************************************
                 997  ;*
                 998  ;*    TRUE "RMS" SAMPLING ALGORITHM :
                 999  ;*
                 1000 ;**********************************************
```

| LOC OBJ | LINE | SOURCE STATEMENT |
|---|---|---|
| | 1001 | |
| 02E1 B940 | 1002 SELRMS: MOV | R1,#64 ;SET UP 64 SAMPLE COUNT |
| | 1003 | |
| | 1004 ;*** SQUARE & SUM A/D 64 TIMES WITHIN A 50MSEC WINDOW *** | |
| | 1005 ;*** *** | |
| | 1006 ;*** NOTE: AN A/D SAMPLE LOOP TIME OF 780USEC *** | |
| | 1007 ;*** IS GENERATED BY THE FOLLOWING CODE *** | |
| | 1008 ;*** THIS WILL RESULT IN A SAMPLE WINDOW *** | |
| | 1009 ;*** TIME OF- *** | |
| | 1010 ;*** *** | |
| | 1011 ;*** (64) * 780USEC = 49.92MSEC *** | |
| | 1012 | |
| 02E3 80 | 1013 TRMS: RAD | ;(2) READ A/D |
| 02E4 D410 | 1014 CALL | SQUARE ;(59) SQUARE A/D VALUE |
| 02E6 FA | 1015 MOV | A,R2 ;(60) LOAD SQUARE LSD |
| 02E7 6D | 1016 ADD | A,R5 ;(61) SUM LSD'S |
| 02E8 AD | 1017 MOV | R5,A ;(62) SAVE LSD SUM |
| 02E9 FB | 1018 MOV | A,R3 ;(63) LOAD SQUARE MSD |
| 02EA 7E | 1019 ADDC | A,R6 ;(64) SUM MSD'S |
| 02EB AE | 1020 MOV | R6,A ;(65) SAVE MSD SUM |
| 02EC 27 | 1021 CLR | A ;(66) |
| 02ED 7F | 1022 ADDC | A,R7 ;(67) ADD MSD CARRY |
| 02EE AF | 1023 MOV | R7,A ;(68)SAVE CARRY SUM |
| 02EF 2302 | 1024 MOV | A,#2 ;(70) |
| 02F1 07 | 1025 RSYNC: DEC | A ;(X) DELAY 6 |
| 02F2 96F1 | 1026 JNZ | RSYNC ;(X) CYCLES |
| 02F4 E9E3 | 1027 DJNZ | R1,TRMS ;(78) 780USEC LOOP TIME |
| | 1028 | |
| | 1029 ;*** *** | |
| | 1030 | |
| 02F6 D456 | 1031 FRMS: CALL | LSHFT2 ;MAKE SUM 24 BITS |
| | 1032 | ;MULTIPLY BY 4 |
| 02F8 BB03 | 1033 MOV | R3,#3 ;TAKE SQUARE ROOT |
| 02FA B805 | 1034 MOV | R0,#REG5 |
| 02FC B93A | 1035 MOV | R1,#SB ;MOVE 3 BYTE SUM TO "SB" |
| 02FE F49E | 1036 CALL | MOVE |
| 0300 F4B2 | 1037 CALL | SQRT ;TAKE SQUARE ROOT OF SUM |
| | 1038 | ;"VSRMS" SCALED TO (16 * VS) |
| | 1039 | ;"ISRMS" SCALED TO (4096 * IS) |
| 0302 83 | 1040 XADRMS: RET | ;EXIT - (ANSWER: RA) |
| | 1041 $EJECT | |
| | 1042 | |
| | 1043 | |
| | 1044 | |
| 0065 | 1045 ORG | PAGE0C+1 ;PAGE 0 |
| | 1046 | |
| | 1047 ;************************************************ | |
| | 1048 ;* | |
| | 1049 ;* ANALOG OVERFLOW ROUTINE : | |
| | 1050 ;* | |
| | 1051 ;* THIS ROUTINE TESTS FOR OVERFLOW CONDITIONS | |
| | 1052 ;* ON THE TWO ANALOG INPUT CHANNELS (AN0 & AN1). | |
| | 1053 ;* IF THE PEAK VALUE OF THE ANALOG INPUTS APPROACH | |
| | 1054 ;* +5.0 VOLTS, THE INPUT VALUES ARE CLAMPED TO THE | |
| | 1055 ;* FOLLOWING "VS" AND "IS" LIMITS. | |
| | 1056 ;* | |
| | 1057 ;* 1. VS > 179.25 VOLTS (VSAVG = 16*VS = 0B34H) | |
| | 1058 ;* | |
| | 1059 ;* 2. IS >.700 AMPS (ISAVG = 4096*IS = 0B34H) | |
| | 1060 ;* | |
| | 1061 ;* (V[A/D PEAK]/SQRT 2)*(256/5VREF)*(16) = 0B50H | |
| | 1062 ;* | |
| | 1063 ;* FOR: V[A/D PEAK] = 5 VOLTS | |
| | 1064 ;* | |
| | 1065 ;* ENTRY CONDITION(S): | |
| | 1066 ;* "R1" = POINTS TO LSD OF ANALOG VALUE TO BE TESTED | |
| | 1067 ;* | |
| | 1068 ;* EXIT CONDITION(S): | |
| | 1069 ;* CARRY SET = OVERFLOW | |
| | 1070 ;* CARRY CLEAR = NO OVERFLOW | |
| | 1071 ;* | |
| | 1072 ;* "R2-THRU-R7" ARE SAVED | |
| | 1073 ;* | |
| | 1074 ;* | |
| | 1075 ;* NOTE: ANALOG INPUT VALUES ARE CLAMPED TO LIMIT | |
| | 1076 ;* PLUS 1 BIT FOR CORRECT OPERATION OF "DSPOVF" | |
| | 1077 ;* ROUTINE. | |
| | 1078 ;* | |
| | 1079 ;************************************************ | |

```
LOC  OBJ        LINE       SOURCE STATEMENT
                1080
0065 B837       1081 ANLOVF: MOV    R0,#RA+1          ;SET UP
0067 B00B       1082         MOV    @R0,#0BH          ; OVERFLOW
0069 B836       1083         MOV    R0,#RA            ;  LIMIT
006B B034       1084         MOV    @R0,#34H
006D D467       1085         CALL   COMPDB            ;OVERFLOW ?
006F E674       1086         JNC    XANOVF            ;NO, EXIT
0071 10         1087         INC    @R0               ;CLAMP ANALOG VALUE TO (0AE1H + 1BIT)
0072 F49C       1088         CALL   MOVE2             ; -> "ANALOG VALUE"
0074 83         1089 XANOVF: RET
                1090
                1091
                1092 ;****************************************
                1093 ;*
                1094 ;*  OPERATOR "NULL" /CALIBRATION ADJUSTMENT :
                1095 ;*
                1096 ;*      RANGE:  +/-1.75 VOLTS IN 0.25 VOLT STEPS
                1097 ;*
                1098 ;*      ENTRY CONDITION(S):
                1099 ;*          "RA" = NEW 16 BIT "RMS" VALUE
                1100 ;*
                1101 ;*      EXIT CONDITION(S):
                1102 ;*          "RA" = NEW 16 BIT "RMS" VALUE + "NULL" OFFSET
                1103 ;*
                1104 ;*      NOTE:  OFFSETS VOLTAGE READING ONLY- NOT CURRENT.
                1105 ;*
                1106 ;****************************************
                1107
0075 BA94       1108 OPNULL: MOV    R2,#VNULL
0077 14C5       1109         CALL   IOSEL             ;READ NULL SW.
0079 AB         1110         MOV    R3,A              ;SAVE SWITCH CODE
007A 47         1111         SWAP   A                 ;TEST FOR SW. POLARITY
007B F7         1112         RLC    A                 ;IS POLARITY + ?
007C FB         1113         MOV    A,R3
007D F683       1114         JC     PNULL             ;YES, JMP
007F 17         1115         INC    A                 ;NO
0080 37         1116         CPL    A                 ;DERIVE ABSOLUTE VALUE
0081 43F8       1117         ORL    A,#11111000B
0083 BA04       1118 PNULL:  MOV    R2,#04            ;STEP WEIGHT(4 BITS/0.25 VOLTS)
0085 BD00       1119         MOV    R5,#00            ;MIN SETPOINT(0 VOLTS)
0087 14E4       1120         CALL   SWCODX            ;DERIVE SW. VALUE
0089 B805       1121         MOV    R0,#REG5          ;VNULL -> "R6-R5"
008B B936       1122         MOV    R1,#RA
008D FB         1123         MOV    A,R3
008E 47         1124         SWAP   A
008F F7         1125         RLC    A
0090 F696       1126         JC     PNULL1            ;JMP - SW. POLARITY +
0092 D485       1127         CALL   SUBDB             ;ABS VAL [VSAVG - VNULL] -> "RA"
0094 0498       1128         JMP    XPNULL
0096 D474       1129 PNULL1: CALL  ADDDB              ;[VSAVG + VNULL] -> "RA"
0098 83         1130 XPNULL: RET
                1131 $EJECT
                1132
0303            1133         ORG    XADRMS+1          ;PAGE 0
                1134
                1135 ;****************************************
                1136 ;*
                1137 ;*   PATH "F" - "VC" COMPUTATIONS:
                1138 ;*
                1139 ;*      ENTRY CONDITION(S):   NONE
                1140 ;*
                1141 ;*      EXIT CONDITION(S):    NONE
                1142 ;*
                1143 ;****************************************
                1144
                1145
                1146 ;****************************************
                1147 ;*
                1148 ;*   COMPUTE LINE-DROP COMPENSATED VOLTAGE-(VC) :
                1149 ;*
                1150 ;*
                1151 ;*      VC**2 = VS**2 + 2*VS(IS*XC*SINPHI - IS*RC*COSPHI) + (IS*RC)**2 + (IS*XC)**2
                1152 ;*
                1153 ;*      ENTRY CONDITION(S):   NONE
                1154 ;*
                1155 ;*      EXIT CONDITION(S):
```

```
1156 ;*                    "RA" = 2**4(VC)    16 BIT RESULT
1157 ;*
1158 ;************************************************
1159
0303 BABC    1160 PATHF:   MOV     R2,#RCOMP
0305 27      1161          CLR     A                ;SELECT RCOMP SWITCH
0306 BB08    1162          MOV     R3,#00001000B    ;RCOMP ALERT CODE
0308 B4BF    1163          CALL    LDCSW            ;READ RCOMP SW. - 2**8(IS*RC) -> VRCOMP
030A BA90    1164          MOV     R2,#XCOMP        ;XCOMP I/O ADDRESS
030C 27      1165          CLR     A
030D 37      1166          CPL     A                ;SELECT XCOMP SW.
030E BB10    1167          MOV     R3,#00010000B    ;XCOMP ALERT CODE
0310 B4BF    1168          CALL    LDCSW            ;READ XCOMP SW. - 2**8(IS*XC) -> VXCOMP
0312 B81F    1169          MOV     R0,#VRCOMP+1
0314 B91F    1170          MOV     R1,#VRCOMP+1
0316 D4C5    1171          CALL    MPY2X2
0318 BB05    1172          MOV     R0,#REG5         ;SQUARE 2**8(IS*RC) TERM
031A B93A    1173          MOV     R1,#RD
031C BB03    1174          MOV     R3,#03
031E F49E    1175          CALL    MOVE             ;MOVE 2**8(IS*RC)**2 TO "RD"
0320 B821    1176          MOV     R0,#VXCOMP+1
0322 B921    1177          MOV     R1,#VXCOMP+1
0324 D4C5    1178          CALL    MPY2X2           ;SQUARE 2**8(IS*XC) TERM
0326 B805    1179          MOV     R0,#REG5
0328 B93A    1180          MOV     R1,#RD
032A D470    1181          CALL    ADDTRI  ;2**8[(IS*RC)**2 + (IS*XC)**2] -> RD
             1182
             1183
032C B828    1184          MOV     R0,#SINPF+1      ;POINT TO "SINPHI" MSD
032E B921    1185          MOV     R1,#VXCOMP+1     ;POINT TO (IS*XC) TERM MSD
0330 D4C5    1186          CALL    MPY2X2
             1187                                   ;DIVIDE RESULT BY 2**7
0332 1486    1188          CALL    RSFT07           ;RESULT SCALED 2**6(2*IS*XC*SINPF)
0334 B838    1189          MOV     R0,#RB
0336 D4EC    1190          CALL    TR65RX           ;MOVE 2**6(2*IS*XC*SINPF) -> "RB"
0338 BA9B    1191          MOV     R2,#RXSIGN
033A 14C5    1192          CALL    IOSEL            ;READ R/X POLARITY
033C AC      1193          MOV     R4,A             ;SAVE POLARITY STATUS
033D B822    1194          MOV     R0,#VRXPOL
033F A0      1195          MOV     @R0,A            ;SAVE "VR" AND "VX" POLARITY
0340 B82A    1196          MOV     R0,#COSPF+1      ;POINT TO "COSPHI" MSD
0342 B91F    1197          MOV     R1,#VRCOMP+1     ;POINT TO (IS*RC) TERM MSD
0344 D4C5    1198          CALL    MPY2X2
             1199                                   ;DIVIDE RESULT BY 2**7
0346 1486    1200          CALL    RSFT07           ;RESULT SCALED 2**6(2*IS*RC*COSPF)
             1201                                   ;AND TEMPORARILY STORED IN R6-R5
0348 B82D    1202          MOV     R0,#STATUS
034A F0      1203          MOV     A,@R0
034B F7      1204          RLC     A
034C F7      1205          RLC     A                ;IS "SINPF" NEGATIVE(IND) ?
034D FC      1206          MOV     A,R4             ;RESTORE R/X POLARITY STATUS
034E E655    1207          JNC     SINNEG           ;YES, JMP - LAGGING P.F.
0350 F7      1208 SINPOS:  RLC     A                ;IS "XC" TERM NEGATIVE ?
0351 F658    1209          JC      XTNEG            ;YES, JMP
0353 645C    1210          JMP     XTPOS
0355 F7      1211 SINNEG:  RLC     A                ;IS "XC" TERM NEGATIVE ?
0356 F65C    1212          JC      XTPOS            ;YES, JMP
0358 B938    1213 XTNEG:   MOV     R1,#RB
035A F4A6    1214          CALL    CMP2S            ;2'S COMP 2**6(2*IS*XC*SINPF) TERM
035C FC      1215 XTPOS:   MOV     A,R4
035D 67      1216          RRC     A                ;IS "RC" TERM NEGATIVE ?
035E E664    1217          JNC     SUBRX            ;NO, JMP
0360 8905    1218          MOV     R1,#REG5
0362 F4A6    1219          CALL    CMP2S            ;2'S COMP 2**6(2*IS*RC*COSPF) TERM
0364 B805    1220 SUBRX:   MOV     R0,#REG5
0366 B938    1221          MOV     R1,#RB
0368 D4A4    1222          CALL    SUBD2S  ;2**6(2*IS*XC*SINPF - 2*IS*RC*COSPF) -> RB
036A B823    1223          MOV     R0,#VSAVG
036C 8905    1224          MOV     R1,#REG5         ;TRANSFER
036E F49C    1225          CALL    MOVE2            ;"VSAVG" -> "R6-R5"
0370 D456    1226          CALL    LSHFT2           ;RESCALE "VSAVG" TO 2**6(VS) -> "R6-R5"
0372 B805    1227          MOV     R0,#REG5
0374 B938    1228          MOV     R1,#RB
0376 D474    1229          CALL    ADDDB   ;2**6[VS + 2(IS*XC*SINPF - IS*RC*COSPF)] -> RB
0378 F1      1230          MOV     A,@R1
0379 AC      1231          MOV     R4,A             ;SAVE SIGN OF "RB" RESULT (R4,BIT7)
037A F7      1232          RLC     A                ;IS "RB" RESULT NEGATIVE ?
037B E681    1233          JNC     SHFTVS           ;NO, JMP
```

| LOC OBJ | LINE | | SOURCE STATEMENT | |
|---|---|---|---|---|
| 0370 8938 | 1234 | | MOV | R1,#RB |
| 037F F4A6 | 1235 | | CALL | CMP2S ;2'S COMPLEMENT "RB" RESULT |
| 0381 D456 | 1236 | SHFTVS: | CALL | LSHFT2 ;RESCALE "VSAVG" TO 2**B(VS) |
| 0383 D4EA | 1237 | | CALL | TR65RA ;TRANSFER "R6-R5" TO "RA" |
| 0385 8939 | 1238 | | MOV | R1,#RB+1 |
| 0387 D4C5 | 1239 | | CALL | MPY2X2 ;26[VS2 + 2*VS(IS*XC*SINPF - IS*RC*COSPF)] |
| | 1240 | | | ;STORE RESULT TEMP IN R7-R6-R5 |
| 0389 D456 | 1241 | | CALL | LSHFT2 ;RESCALE TO 2**B |
| 038B E698 | 1242 | | JNC | NOOVF ; OVERFLOW ? |
| 038D 27 | 1243 | CLOVER: | CLR | A ;YES ("RB" RESULT POSITIVE IF OVERFLOW) |
| 038E 37 | 1244 | | CPL | A |
| 038F 893A | 1245 | | MOV | R1,#RD |
| 0391 A1 | 1246 | | MOV | @R1,A ;CLAMP |
| 0392 19 | 1247 | | INC | R1 ;   RESULT (RD) |
| 0393 A1 | 1248 | | MOV | @R1,A ;     TO MAX TRIPLE PRECISION VALUE |
| 0394 19 | 1249 | | INC | R1 ;         (256 VOLTS)**2 |
| 0395 A1 | 1250 | | MOV | @R1,A |
| 0396 64A8 | 1251 | | JMP | SQRTVC |
| 0398 FC | 1252 | NOOVF: | MOV | A,R4 |
| 0399 F7 | 1253 | | RLC | A ;PREVIOUS "RB" RESULT NEGATIVE ? |
| 039A B805 | 1254 | | MOV | R0,#REG5 |
| 039C B93A | 1255 | | MOV | R1,#RD |
| 039E F6A6 | 1256 | | JC | SUBR5 ;YES, JMP |
| 03A0 D47D | 1257 | | CALL | ADDTRI ;2B[VS2 + 2*VS(IS*XC*SINPF - IS*RC*COSPF)] |
| | 1258 | | | ; + 2**B[(IS*RC)**2 + (IS*XC)**2] -> RD |
| 03A2 F68D | 1259 | | JC | CLOVER ;JMP IF OVERFLOW ! |
| 03A4 64A8 | 1260 | | JMP | SQRTVC |
| 03A6 D490 | 1261 | SUBR5: | CALL | SUBTRI ;-2B[VS2 + 2*VS(IS*XC*SINPF - IS*RC*COSPF)] |
| | 1262 | | | ; + 2**B[(IS*RC)**2 + (IS*XC)**2] -> RD |
| | 1263 | | | ; *** RESULT SHOULD ALWAYS BE POSITIVE *** |
| 03A8 F4B2 | 1264 | SQRTVC: | CALL | SQRT ;TAKE SQUARE ROOT OF 2B(VC2) |
| 03AA B836 | 1265 | | MOV | R0,#RA |
| 03AC B92B | 1266 | | MOV | R1,#VC |
| 03AE F49C | 1267 | | CALL | MOVE2 ;STORE RESULT IN "VC" |
| | 1268 | | | |
| 03B0 043D | 1269 | XPATHF: | JMP | FINISH |
| | 1270 | | | |
| | 1271 | $EJECT | | |
| | 1272 | | | |
| | 1273 | ;*********************************************** | | |
| | 1274 | ;* | | |
| | 1275 | ;*    PATH "G"  -  MJ-1 CONTROL ALGORITHM & DATA/PAK OUTPUT : | | |
| | 1276 | ;* | | |
| | 1277 | ;*       ENTRY CONDITION(S):   NONE | | |
| | 1278 | ;*       EXIT  CONDITION(S):   NONE | | |
| | 1279 | ;* | | |
| | 1280 | ;* | | |
| | 1281 | ;*********************************************** | | |
| | 1282 | | | |
| 03B2 B824 | 1283 | PATHG: | MOV | R0,#VSAVG+1 |
| 03B4 F0 | 1284 | | MOV | A,@R0 |
| 03B5 53FC | 1285 | | ANL | A,#11111100B ;IS VS < 64 VOLTS ? |
| 03B7 96C1 | 1286 | | JNZ | REGMJ1 ;NO, JMP (VS OK) |
| 03B9 BC20 | 1287 | | MOV | R4,#00100000B ;YES |
| 03BB D4F6 | 1288 | | CALL | ALERT1 ;SERVICE LOW P.T. ALERT |
| 03BD 14A9 | 1289 | | CALL | BCLEAR ;CLEAR BAND INDICATORS & TIMER |
| 03BF A478 | 1290 | | JMP | MSTOP |
| | 1291 | | | |
| 03C1 BA8D | 1292 | REGMJ1: | MOV | R2,#VSETPT |
| 03C3 14C5 | 1293 | | CALL | IOSEL ;READ VOLTAGE LEVEL SETTING SW. |
| 03C5 B91D | 1294 | | MOV | R1,#29 ;LEGAL LIMIT(29 POSITIONS) |
| 03C7 BC01 | 1295 | | MOV | R4,#00000001B ;ALERT CODE |
| 03C9 BA01 | 1296 | | MOV | R2,#01 ;STEP WEIGHT(1 BIT/VOLT) |
| 03CB BD6A | 1297 | | MOV | R5,#106 ;MIN SETPOINT(106 VOLTS) |
| 03CD 14E2 | 1298 | | CALL | SWCODE ;DERIVE SW. VALUE (DEFAULT - 106VOLTS) |
| 03CF B804 | 1299 | | MOV | R0,#04 |
| 03D1 D458 | 1300 | | CALL | LSHIFT ;MULTIPLY 2**4(SW. VALUE) -> "R6-R5" |
| 03D3 B81C | 1301 | | MOV | R0,#VREG |
| 03D5 D4EC | 1302 | | CALL | TR65RX ;TRANSFER "R6-R5" -> VREG |
| 03D7 D4EA | 1303 | | CALL | TR65RA ;TRANSFER "R6-R5" -> "RA" |
| 03D9 B823 | 1304 | | MOV | R0,#VSAVG |
| 03DB B905 | 1305 | | MOV | R1,#REG5 |
| 03DD D485 | 1306 | | CALL | SUBDB ;COMPUTE ABS[VSETPT - VSAVG] -> "R6-R5" |
| 03DF B905 | 1307 | | MOV | R1,#REG5 |
| 03E1 BB00 | 1308 | | MOV | R3,#00 ;SET UP +/-0.125 NULL WINDOW |
| 03E3 BA02 | 1309 | | MOV | R2,#02 |
| 03E5 BB02 | 1310 | | MOV | R0,#REG2 |

```
LOC   OBJ      LINE           SOURCE STATEMENT

03E7  D467     1311           CALL   COMPDB          ;ABS[VSETPT - VSAVG] <= 0.125 VOLTS ?
03E9  09       1312           IN     A,P1
03EA  53FD     1313           ANL    A,#11111101B    ;ANTICIPATE "NULL" ON
03EC  E6F0     1314           JNC    NULOUT          ;YES, JMP
03EE  4302     1315           ORL    A,#00000010B    ;NO, TURN "NULL" LED OFF
03F0  39       1316  NULOUT:  OUTL   P1,A
03F1  14EF     1317           CALL   P1TEST
               1318
03F3  BA50     1319  VRC:     MOV    R2,#OPTION
03F5  14C5     1320           CALL   IOSEL           ;READ OPTION STATUS
03F7  AB       1321           MOV    R3,A            ;SAVE STATUS
03F8  BA58     1322           MOV    R2,#VRCOPT
03FA  14C5     1323           CALL   IOSEL           ;ENABLE VRC OPTION LATCH
03FC  B835     1324           MOV    R0,#VRCFLG
03FE  FB       1325           MOV    A,R3
03FF  F7       1326           RLC    A               ;VRC ENGAGED ?
0400  F603     1327           JC     XVRC            ;NO, EXIT VRC
0402  F7       1328           RLC    A               ;ACTIVATE VRC ?
0403  27       1329  XVRC:    CLR    A
0404  3C       1330           MOVD   P4,A            ;TURN OFF "VRC" ACTIVE LED
0405  E60A     1331           JNC    VRSTAT          ;JMP - VRC ACTIVE
0407  A0       1332           MOV    @R0,A           ; (0 -> VRCFLG)
0408  843F     1333           JMP    VLC             ;EXIT VRC
040A  37       1334  VRSTAT:  CPL    A
040B  3C       1335           MOVD   P4,A            ;TURN ON "VRC" ACTIVE LED
040C  F0       1336           MOV    A,@R0           ;WAS VRC PREVIOUSLY ACTIVE ?
040D  9610     1337           JNZ    READVR          ;YES, JMP
040F  10       1338           INC    @R0             ;NO - (1 -> VRCFLG)
0410  BA54     1339  READVR:  MOV    R2,#VRCSW
0412  14C5     1340           CALL   IOSEL           ;READ VRC SW.
0414  B90B     1341           MOV    R1,#11          ;LEGAL LIMIT(11 POSITION)
0416  BC20     1342           MOV    R4,#00100000B   ;VRCSW ALERT NO.
0418  BA01     1343           MOV    R2,#01          ;STEP WEIGHT(1 BIT/%)
041A  BD00     1344           MOV    R5,#00          ;MIN SETPOINT(0%)
041C  14E2     1345           CALL   SWCODE          ;DERIVE SW. VALUE -> R5 (DEFAULT -0%)
041E  FD       1346           MOV    A,R5
041F  37       1347  VRCON:   CPL    A
0420  17       1348           INC    A               ;2'S COMPLEMENT "A"
0421  0364     1349           ADD    A,#100          ;(100% - VRC%) -> "A"
0423  AE       1350           MOV    R6,A            ;LOAD
0424  27       1351           CLR    A               ; 15 BIT
0425  AF       1352           MOV    R7,A            ;   DIVIDEND
0426  B83B     1353           MOV    R0,#RD+1        ;SET UP
0428  A0       1354           MOV    @R0,A           ;  15 BIT
0429  B83A     1355           MOV    R0,#RD          ;    DIVISOR = 100%
042B  B064     1356           MOV    @R0,#100
042D  D431     1357           CALL   DIV2X2          ; 2**15[(100% - VRC%)/100%] -> "R6-R5"
042F  B838     1358           MOV    R0,#RB          ;TRANSFER
0431  D4EC     1359           CALL   TR65RX          ; VRC VALUE TO "RB"
0433  B91D     1360           MOV    R1,#VREG+1      ;POINT TO "VREG" MSD
0435  D4C5     1361           CALL   MPY2X2          ;2**4(VSP)*2**15(VRC)/2**8 -> "R7-R6-R5"
0437  14B6     1362           CALL   RSFT07          ;2**11(VSP)*(VRC)/2**7 -> "R6-R5"
0439  B81C     1363           MOV    R0,#VREG
043B  D4EC     1364           CALL   TR65RX          ;TRANSFER 2**4(VSP) -> "VREG"
043D  D4EA     1365           CALL   TR65RA          ;TRANSFER 2**4(VSP) -> "RA"
               1366
043F  BA4C     1367  VLC:     MOV    R2,#VLCOPT
0441  14C5     1368           CALL   IOSEL           ;ENABLE VLC STATE LATCH(I/O3)
0443  27       1369           CLR    A
0444  3C       1370           MOVD   P4,A            ;TURN OFF UPPER & LOWER VLC LED'S
0445  BA50     1371           MOV    R2,#OPTION
0447  14C5     1372           CALL   IOSEL           ;READ OPTION STATUS (I/O4)
0449  67       1373           RRC    A               ;VLC ENGAGED ?
044A  F6B3     1374           JC     REGULT          ;NO, EXIT VLC
044C  67       1375           RRC    A               ;VLC TURNED ON ?
044D  F6B3     1376           JC     REGULT          ;NO, JMP
044F  BA44     1377  UPVLC:   MOV    R2,#VLCUP
0451  14C5     1378           CALL   IOSEL           ;READ UPPER VLC SW. (I/O1)
0453  BC80     1379           MOV    R4,#10000000B   ;ALERT CODE
0455  BD78     1380           MOV    R5,#120         ;MIN SETPOINT(120 VOLTS)
0457  84E5     1381           CALL   VLCSW           ;DERIVE SW. VALUE (DEFAULT - 120V)
0459  B923     1382           MOV    R1,#VSAVG
045B  B838     1383           MOV    R0,#RB
045D  D467     1384           CALL   COMPDB          ;IS VSAVG <= UPPER VLC ?
045F  E668     1385           JNC    UPPREV          ;YES, JMP
0461  2302     1386           MOV    A,#00000010B    ;NO - RUNBACK
```

| LOC | OBJ | LINE | | SOURCE STATEMENT | | |
|---|---|---|---|---|---|---|
| 0463 | 3C | 1387 | | MOVD | P4,A | ;TURN ON UPPER VLC LED |
| 0464 | 14A0 | 1388 | | CALL | MLOWER | ;LOWER VOLTAGE |
| 0466 | 8497 | 1389 | | JMP | VLCACT | |
| 0468 | 8905 | 1390 UPPREV: | MOV | R1,#REG5 | | |
| 046A | BDFD | 1391 | | MOV | R5,#0FDH | ;"R6-R5" = -1.0 VOLT(2'S COMP) |
| 046C | BEFF | 1392 | | MOV | R6,#0FFH | |
| 046E | D474 | 1393 | | CALL | ADDDB | ;"R6-R5" =[UPPER VLC - 1.0VOLT] |
| 0470 | B923 | 1394 | | MOV | R1,#VSAVG | |
| 0472 | B805 | 1395 | | MOV | R0,#REG5 | |
| 0474 | D467 | 1396 | | CALL | COMPDB | ;IS VSAVG <= UPPER VLC - 1.0VOLT ? |
| 0476 | E68D | 1397 | | JNC | LOWVLC | ;YES, JMP |
| 0478 | B82D | 1398 | | MOV | R0,#STATUS | |
| 047A | 2302 | 1399 | | MOV | A,#00000010B | |
| 047C | 3C | 1400 | | MOVD | P4,A | ;TURN ON UPPER VLC LED |
| 047D | E7 | 1401 | | RL | A | ;SETUP UPPER VLC FLAG MASK |
| 047E | 40 | 1402 | | ORL | A,@R0 | ;SET UPPER VLC FLAG(1 -> STATUS,BIT2) |
| 047F | A0 | 1403 | | MOV | @R0,A | |
| | | 1404 | | | | |
| 0480 | BA48 | 1405 LOWVLC: | MOV | R2,#VLCLOW | | |
| 0482 | 14C5 | 1406 | | CALL | IOSEL | ;READ LOWER VLC SW. (I/02) |
| 0484 | BC40 | 1407 | | MOV | R4,#01000000B | ;ALERT CODE |
| 0486 | BD6B | 1408 | | MOV | R5,#104 | ;MIN SETPOINT(104 VOLTS) |
| 0488 | B4E5 | 1409 | | CALL | VLCSW | ;DERIVE SW. VALUE (DEFAULT - 104V) |
| 048A | B938 | 1410 | | MOV | R1,#RB | |
| 048C | B823 | 1411 | | MOV | R0,#VSAVG | |
| 048E | D467 | 1412 | | CALL | COMPDB | ;IS VSAVG >= LOWER VLC ? |
| 0490 | E69B | 1413 | | JNC | LOPREV | ;YES, JMP |
| 0492 | 2301 | 1414 | | MOV | A,#00000001B | ;NO - RUNBACK |
| 0494 | 3C | 1415 | | MOVD | P4,A | ;TURN ON LOWER VLC LED |
| 0495 | 1499 | 1416 | | CALL | MRAISE | ;RAISE VOLTAGE |
| 0497 | 14A9 | 1417 VLCACT: | CALL | BCLEAR | ;CLEAR BAND INDICATOR & TIMER | |
| 0499 | A470 | 1418 | | JMP | POLOG | |
| | | 1419 | | | | |
| 049B | B805 | 1420 LOPREV: | MOV | R0,#REG5 | | |
| 049D | BD10 | 1421 | | MOV | R5,#16 | ;"R6-R5" = +1.0 VOLT |
| 049F | BE00 | 1422 | | MOV | R6,#00 | |
| 04A1 | D474 | 1423 | | CALL | ADDDB | ;"RB" = [LOWER VLC + 1.0 VOLT] |
| 04A3 | B823 | 1424 | | MOV | R0,#VSAVG | |
| 04A5 | B938 | 1425 | | MOV | R1,#RB | |
| 04A7 | D467 | 1426 | | CALL | COMPDB | ;IS VSAVG >= LOWER VLC + 1.0 VOLT ? |
| 04A9 | E6B3 | 1427 | | JNC | REGULT | ;YES, JMP |
| 04AB | B82D | 1428 | | MOV | R0,#STATUS | |
| 04AD | 2301 | 1429 | | MOV | A,#00000001B | |
| 04AF | 3C | 1430 | | MOVD | P4,A | ;TURN ON LOWER VLC LED |
| 04B0 | E7 | 1431 | | RL | A | ;SETUP LOWER VLC FLAG MASK |
| 04B1 | 40 | 1432 | | ORL | A,@R0 | ;SET LOWER VLC FLAG(1 -> STATUS,BIT1) |
| 04B2 | A0 | 1433 | | MOV | @R0,A | |
| | | 1434 | | | | |
| | | 1435 | | | | |
| 04B3 | B82E | 1436 REGULT: | MOV | R0,#PFSTAT | | |
| 04B5 | F0 | 1437 | | MOV | A,@R0 | |
| 04B6 | B82B | 1438 | | MOV | R0,#VC | ;SELECT "VC" AS "VIN" (FPF) |
| 04B8 | F7 | 1439 | | RLC | A | ;IN "RPF" MODE ? |
| 04B9 | E68D | 1440 | | JNC | VREGX | ;NO, JMP |
| 04BB | B823 | 1441 | | MOV | R0,#VSAVG | ;YES, SELECT "VS" AS "VIN" (VR=VX=0) |
| | | 1442 | | | | |
| 04BD | B936 | 1443 VREGX: | MOV | R1,#RA | ;COMPUTE ABS VAL(VREG - VIN) -> "RA" | |
| 04BF | D485 | 1444 | | CALL | SUBDB | ;IS "VIN" > "VREG" ? |
| 04C1 | B92D | 1445 | | MOV | R1,#STATUS | |
| 04C3 | 14A0 | 1446 | | CALL | MLOWER | ;ANTICIPATE LOWERING VOLTAGE |
| 04C5 | 2302 | 1447 | | MOV | A,#00000010B | ;LOWER VLC FLAG MASK |
| 04C7 | F6CD | 1448 | | JC | PVLC | ;YES, JMP - LOWER VOLTAGE |
| 04C9 | 1499 | 1449 | | CALL | MRAISE | ;NO, RAISE VOLTAGE |
| 4CB | 2304 | 1450 | | MOV | A,#00000100B | ;UPPER VLC FLAG MASK |
| | | 1451 | | | | |
| 04CD | 51 | 1452 PVLC: | ANL | A,@R1 | ;PREVAILING VLC ? | |
| 04CE | C6D4 | 1453 | | JZ | RBAND | ;NO, JMP |
| 04D0 | 27 | 1454 | | CLR | A | |
| 04D1 | B834 | 1455 | | MOV | R0,#TAPCMD | ;INHIBIT AUTO TAPCHANGES (0-> TAPCMD) |
| 04D3 | A0 | 1456 | | MOV | @R0,A | |
| | | 1457 | | | | |
| 04D4 | BA88 | 1458 RBAND: | MOV | R2,#VBAND | | |
| 04D6 | 14C5 | 1459 | | CALL | IOSEL | ;READ BANDWIDTH SW. |
| 04D8 | B90B | 1460 | | MOV | R1,#11 | ;LEGAL LIMIT(11 POSITIONS) |
| 04DA | BC04 | 1461 | | MOV | R4,#00000100B | ;ALERT CODE |
| 04DC | BA04 | 1462 | | MOV | R2,#04 | ;STEP WEIGHT/2(8 BITS/VOLT) |
| 04DE | BD08 | 1463 | | MOV | R5,#08 | ;MIN SETPOINT/2 |

| LOC | OBJ | LINE | | SOURCE STATEMENT | | |
|---|---|---|---|---|---|---|
| 04E0 | 14E2 | 1464 | | CALL | SWCODE | ;VBW/2 -> "R5" ; "R6" CLEARED (DEFAULT - 1.0V) |
| 04E2 | B805 | 1465 | | MOV | R0,#REG5 | |
| 04E4 | B936 | 1466 | | MOV | R1,#RA | |
| 04E6 | D467 | 1467 | | CALL | COMPDB | ;IS ABS VAL(VSP - VIN) > VBW/2 ? |
| 04E8 | B830 | 1468 | | MOV | R0,#PORT0 | |
| 04EA | F0 | 1469 | | MOV | A,@R0 | |
| 04EB | E6EF | 1470 | | JNC | INBAND | ;PAGE BOUNDRY |
| 04ED | A41D | 1471 | | JMP | OUTOFB | ;YES, JMP - OUT OF BAND |
| 04EF | 53D7 | 1472 | INBAND: | ANL | A,#11010111B | ;TURN OFF HIGH/LOW BAND LEDS |
| 04F1 | 4310 | 1473 | | ORL | A,#00010000B | ;TURN ON "IN" LED |
| 04F3 | A0 | 1474 | | MOV | @R0,A | |
| 04F4 | FD | 1475 | | MOV | A,R5 | |
| 04F5 | E7 | 1476 | | RL | A | ;2**4(2)(VBW/2) -> "A" |
| 04F6 | 6D | 1477 | | ADD | A,R5 | ;2**4(3)(VBW/2) -> "A" |
| 04F7 | 97 | 1478 | | CLR | C | ;DIVIDE |
| 04F8 | 67 | 1479 | | RRC | A | ; BY |
| 04F9 | 97 | 1480 | | CLR | C | ; 4 |
| 04FA | 67 | 1481 | | RRC | A | |
| 04FB | 2D | 1482 | | XCH | A,R5 | ;2**4(3/4)(VBW/2) -> "R5" ; "R6" CLEAR |
| 04FC | B805 | 1483 | | MOV | R0,#REG5 | |
| 04FE | B936 | 1484 | | MOV | R1,#RA | |
| 0500 | D467 | 1485 | | CALL | COMPDB | ;IS ABS VAL(VSP - VIN) > 0.75(VIN/2)? |
| 0502 | B82D | 1486 | | MOV | R0,#STATUS | |
| 0504 | F0 | 1487 | | MOV | A,@R0 | |
| 0505 | E60B | 1488 | | JNC | TDEC | ;NO, JMP |
| 0507 | 5310 | 1489 | | ANL | A,#00010000B | ;TIMER INCREMENTING ? |
| 0509 | 963E | 1490 | | JNZ | TINC | ;YES, JMP |
| 050B | F0 | 1491 | TDEC: | MOV | A,@R0 | ;SET TIMER TO DECREMENT |
| 050C | 53EF | 1492 | | ANL | A,#11101111B | |
| 050E | A0 | 1493 | | MOV | @R0,A | ; 0 -> STATUS,BIT4 |
| 050F | BD03 | 1494 | | MOV | R5,#03 | ; 3 -> "R6-R5" (WARNING: R6 = 0) |
| 0511 | B805 | 1495 | | MOV | R0,#REG5 | |
| 0513 | B93D | 1496 | | MOV | R1,#TIMER | |
| 0515 | D4A4 | 1497 | | CALL | SUBD2S | ;(TIMER - 3) -> TIMER |
| 0517 | E678 | 1498 | | JNC | MSTOP | ;JMP, TIMER >= ZERO (NOT NEGATIVE) |
| 0519 | 14AF | 1499 | TNEG: | CALL | TCLEAR | ;CLEAR TIMER |
| 051B | A478 | 1500 | | JMP | MSTOP | |
| 051D | 67 | 1501 | OUTOFB: | RRC | A | ;VOLTAGE TOO HIGH ? |
| 051E | F0 | 1502 | | MOV | A,@R0 | |
| 051F | F627 | 1503 | | JC | HIBAND | ;YES, JMP |
| 0521 | 53E7 | 1504 | LOBAND: | ANL | A,#11100111B | ;TURN OFF "HI & IN" LEDS |
| 0523 | 4320 | 1505 | | ORL | A,#00100000B | ;TURN ON "LOW" LED |
| 0525 | A42B | 1506 | | JMP | BSAVE | |
| 0527 | 53CF | 1507 | HIBAND: | ANL | A,#11001111B | ;TURN OFF "LOW & IN" LEDS |
| 0529 | 4308 | 1508 | | ORL | A,#00001000B | ;TURN OF "HI" LED |
| 052B | A0 | 1509 | BSAVE: | MOV | @R0,A | ;UPDATE PORT0 STATUS |
| 052C | B92D | 1510 | | MOV | R1,#STATUS | |
| 052E | D1 | 1511 | | XRL | A,@R1 | |
| 052F | 67 | 1512 | | RRC | A | ;BAND EXCURSION (STATUS,BIT0 /= PORT0,BIT0)? |
| 0530 | E63A | 1513 | | JNC | STINC | ;NO, JMP (BITS SAME) |
| 0532 | F0 | 1514 | | MOV | A,@R0 | ;LOAD "PORT0" |
| 0533 | 67 | 1515 | | RRC | A | ;SAVE CURRENT BAND STATE IN "C" |
| 0534 | F1 | 1516 | | MOV | A,@R1 | ;LOAD "STATUS" |
| 0535 | 77 | 1517 | | RR | A | |
| 0536 | F7 | 1518 | | RLC | A | ;UPDATE BAND HIGH/LOW HISTORY BIT |
| 0537 | A1 | 1519 | | MOV | @R1,A | ;UPDATE "STATUS" WORD |
| 0538 | 14AF | 1520 | | CALL | TCLEAR | ;CLEAR TIMER ("R1" SAVED) |
| 053A | F1 | 1521 | STINC: | MOV | A,@R1 | |
| 053B | 4310 | 1522 | | ORL | A,#00010000B | ; 1 -> (STATUS,BIT4) |
| 053D | A1 | 1523 | | MOV | @R1,A | ;SET TIMER TO INCREMENT |
| 053E | BD04 | 1524 | TINC: | MOV | R5,#04 | ;4 -> "R6-R5" (WARNING: R6 = 0) |
| 0540 | B805 | 1525 | | MOV | R0,#REG5 | |
| 0542 | B93D | 1526 | | MOV | R1,#TIMER | |
| 0544 | D474 | 1527 | | CALL | ADDDB | ;(TIMER + 4) -> TIMER |
| 0546 | 8AB4 | 1528 | | MOV | R2,#TDELAY | |
| 0548 | 14C5 | 1529 | | CALL | IOSEL | ;READ TIME DELAY SW. |
| 054A | B90F | 1530 | | MOV | R1,#15 | ;LEGAL LIMIT(15 POSITIONS) |
| 054C | BC02 | 1531 | | MOV | R4,#00000010B | ;ALERT CODE |
| 054E | BA07 | 1532 | | MOV | R2,#07 | ;STEP WEIGHT(0.7 BITS/SEC) |
| 0550 | BD07 | 1533 | | MOV | R5,#07 | ;MIN SETPOINT(10 SEC) |
| 0552 | 14E2 | 1534 | | CALL | SWCODE | ;DERIVE "TDELAY" (DEFAULT - 10 SEC) |
| 0554 | BC0A | 1535 | | MOV | R4,#10 | |
| 0556 | B805 | 1536 | | MOV | R0,#REG5 | |
| 0558 | B904 | 1537 | | MOV | R1,#REG4 | |
| 055A | D4B1 | 1538 | | CALL | MPY8X8 | ;SCALE TO 7 BITS/SEC (4/ 573.3MSEC) |
| 055C | AE | 1539 | | MOV | R6,A | ;MOVE |

```
.LOC  OBJ          LINE           SOURCE STATEMENT

055D  FA           1540           MOV     A,R2           ;  "TDELAY"
055E  AD           1541           MOV     R5,A           ;    -> "R6-R5"
055F  B83D         1542           MOV     R0,#TIMER
0561  B905         1543           MOV     R1,#REG5
0563  D467         1544           CALL    COMPDC         ;IS TIMER >= TDELAY(OVERFLOW) ?
0565  E66E         1545           JNC     TLIMIT         ;YES, JMP
0567  B935         1546           MOV     R1,#VRCFLG
0569  F1           1547           MOV     A,@R1
056A  67           1548           RRC     A              ;HAS VRC BEEN ACTIVATED
                   1549                                  ;SINCE LAST PASS ?
056B  E678         1550           JNC     MSTOP          ;NO, JMP - STOP MOTOR
056D  11           1551           INC     @R1            ;YES - RESPOND IMMEDIATELY (2 -> VRCFLG)
056E  D4EC         1552  TLIMIT:  CALL    TR65RX         ;SET/LIMIT TIMER TO TDELAY
                   1553
0570  B830         1554  POLOG:   MOV     R0,#PORT0
0572  B934         1555           MOV     R1,#TAPCMD
0574  F1           1556           MOV     A,@R1          ;AUTO TAPCHANGE INHIBIT ?
0575  967E         1557           JNZ     POLOGX         ;NO, JMP
0577  11           1558           INC     @R1            ;YES, ENABLE TAPCHANGE CMD (1-> TAPCMD)
0578  8830         1559  MSTOP:   MOV     R0,#PORT0
057A  F0           1560           MOV     A,@R0
057B  53FC         1561           ANL     A,#11111100B   ; STOP MOTOR !!! (0 -> PORT0,BITS 0-1)
                   1562                                  ; * TURN MOTOR RELAYS OFF *
057D  A0           1563           MOV     @R0,A          ;UPDATE "PORT0" STATUS
057E  B92E         1564  POLOGX:  MOV     R1,#PFSTAT     ;NOTE: R0 POINTS TO PORT0
0580  F1           1565           MOV     A,@R1
0581  F7           1566           RLC     A              ;SAVE "RPF" STATUS IN "C" (PFSTAT,BIT7)
0582  F0           1567           MOV     A,@R0
0583  53BF         1568           ANL     A,#10111111B   ;TURN OFF "RPF" LED (PORT0,BIT6)
0585  4304         1569           ORL     A,#00000100B   ;SELECT "P2" SOURCE (PORT0,BIT2)
0587  E68B         1570           JNC     POLOG1         ;JMP, FPF DETECTED
0589  D345         1571           XRL     A,#01000101B   ;RPF - TURN ON "RPF" LED (PORT0,BIT6)
                   1572                                  ;SELECT "U2" SOURCE (PORT0,BIT2) AND
                   1573                                  ;COMPLEMENT MOTOR DIRECTION (PORT0,BIT0)
058B  A0           1574  POLOG1:  MOV     @R0,A          ;UPDATE "PORT0" STATUS
058C  B931         1575           MOV     R1,#IDCODE
058E  F1           1576           MOV     A,@R1          ;READ I.D. SW CODE
058F  67           1577           RRC     A              ;INVERTED REG. DESIGN ?
0590  F0           1578           MOV     A,@R0
0591  E696         1579           JNC     P0OUT          ;NO, JMP
0593  D304         1580           XRL     A,#00000100B   ;YES, COMPLEMENT P.1. SOURCE CMD (PORT0,BIT2)
0595  A0           1581           MOV     @R0,A          ;UPDATE "PORT0" STATUS
0596  90           1582  P0OUT:   OUTL    P0,A           ;OUTPUT DATA TO "P0"
                   1583
                   1584  $EJECT
                   1585
                   1586  ;*********************************************
                   1587  ;*
                   1588  ;*    DATA/PAK OUTPUT BUFFER TRANSMIT ROUTINE :
                   1589  ;*
                   1590  ;*    NOTE:  5 MSEC EXECUTION TIME
                   1591  ;*
                   1592  ;*
                   1593  ;*********************************************
                   1594
0597  BA40         1595  DXMIT:   MOV     R2,#DIXMIT
0599  14C5         1596           CALL    IOSEL          ;GENERATE DATA/PAK INTERRUPT
059B  B818         1597           MOV     R0,#PAKBUF
059D  B91E         1598           MOV     R1,#30
059F  27           1599           CLR     A
05A0  60           1600  CKSUM:   ADD     A,@R0          ;COMPUTE CHECKSUM
05A1  18           1601           INC     R0
05A2  E9A0         1602           DJNZ    R1,CKSUM
05A4  A0           1603           MOV     @R0,A          ;STORE CHECKSUM IN "SYNC" (RA)
05A5  B818         1604           MOV     R0,#PAKBUF     ;INITIALIZE BUFFER POINTER
05A7  B93E         1605           MOV     R1,#62         ;INITIALIZE STROBE COUNT
05A9  F9           1606  XMIT:    MOV     A,R1
05AA  67           1607           RRC     A
05AB  F0           1608           MOV     A,@R0          ;LOAD DATA WORD
05AC  E6B0         1609           JNC     OUTPUT         ;SELECT ODD/EVEN NIBBLE (LSN FIRST)
05AE  18           1610           INC     R0             ;POINT TO NEXT DATA WORD
05AF  47           1611           SWAP    A
05B0  3C           1612  OUTPUT:  MOVD    P4,A           ;OUTPUT DATA NIBBLE
05B1  E9A9         1613           DJNZ    R1,XMIT        ;JMP - XMIT NOT COMPLETE
05B3  BA00         1614           MOV     R2,#00H
05B5  14C5         1615           CALL    IOSEL          ;DISABLE DATA/PAK INTERRUPT
                   1616
```

```
LOC  OBJ        LINE      SOURCE STATEMENT
                1617 ;***********************************************
                1618 ;*
                1619 ;*    CLEAR RESETABLE FLAGS :
                1620 ;*
                1621 ;***********************************************
                1622
05B7 BB2D       1623 CFLAG: MOV    R0,#STATUS      ; CLEAR FOLLOWING FLAGS-
05B9 F0         1624        MOV    A,@R0           ;     1. C.T. OVER/UNDER LIMIT
05BA 53F1       1625        ANL    A,#11110001B    ;     2. UPPER VLC PREVAILING
05BC A0         1626        MOV    @R0,A           ;     3. LOWER VLC PREVAILING
                1627
                1628
05BD 043D       1629 XPATHG: JMP   FINISH          ;EXIT PATH "G"
                1630
                1631 $EJECT
                1632
                1633
                1634
                1635 ;***********************************************
                1636 ;*
                1637 ;*    READ LINE-DROP COMPENSATION SWITCH :
                1638 ;*
                1639 ;*        THIS ROUTINE READS THE SELECTED LINE-DROP COMPENSATION
                1640 ;*        SWITCH ("RC" OR "XC"), THEN MULTIPLYS THE SWITCH VALUE
                1641 ;*        TIMES THE SENSED CURRENT (IS).
                1642 ;*
                1643 ;*        ENTRY CONDITION(S):
                1644 ;*              "R2" = SELECTED SW. I/O ADDRESS
                1645 ;*              "R3" = SELECTED SW. ALERT NO.
                1646 ;*              "A"  = ZERO    (R COMP. SW. SELECTED)
                1647 ;*                   = NOT ZERO(X COMP. SW. SELECTED)
                1648 ;*
                1649 ;*        EXIT CONDITION(S):
                1650 ;*              "VRCOMP" = 2**8(IS*RC)     16 BIT RESULT
                1651 ;*              "VXCOMP" = 2**8(IS*XC)     16 BIT RESULT
                1652 ;*              "RA" IS DESTROYED
                1653 ;*              "RD" IS DESTROYED
                1654 ;*
                1655 ;***********************************************
                1656
05BF BB3A       1657 LDCSW: MOV    R0,#RD
05C1 A0         1658        MOV    @R0,A           ;SET SWITCH FLAG
05C2 14C5       1659        CALL   IOSEL           ;READ SELECTED LDC SW.
05C4 2B         1660        XCH    A,R3
05C5 AC         1661        MOV    R4,A            ;MOVE ALERT NO. TO "R4"
05C6 2B         1662        XCH    A,R3            ; A = SWITCH POSITION CODE
05C7 B919       1663        MOV    R1,#25          ;LEGAL LIMIT(25 POSITIONS)
05C9 BA05       1664        MOV    R2,#05          ;STEP WEIGHT(5BITS/VOLT OR 1 BIT/OHM)
05CB BD00       1665        MOV    R5,#00          ;MIN SETPOINT(0 VOLTS)
05CD 14E2       1666        CALL   SWCODE          ;DERIVE SW. VALUE (DEFAULT - 0.0 VOLTS)
05CF B804       1667        MOV    R0,#04          ;SHIFT 4 TIMES TO LEFT
05D1 D458       1668        CALL   LSHIFT          ;MULTIPLY 2**4(SW. VALUE)
05D3 D4EA       1669        CALL   TR65RA          ;TRANSFER "R6-R5" TO "RA"
05D5 B926       1670        MOV    R1,#ISAVG+1
05D7 D4C5       1671        CALL   MPY2X2          ;MULTIPLY 2**4(SW. VALUE)2**12(IS)/256 ->"R6-R5"
05D9 B93A       1672        MOV    R1,#RD
05DB B81E       1673        MOV    R0,#VRCOMP      ;POINT TO (IS*RC) STORAGE
05DD F1         1674        MOV    A,@R1           ;RCOMP SW. SELECTED ?
05DE C6E2       1675        JZ     SAVESW          ;YES, JMP
05E0 B820       1676        MOV    R0,#VXCOMP      ;NO, POINT TO (IS*XC) STORAGE
05E2 D4EC       1677 SAVESW: CALL  TR65RX          ;SAVE SELECTED SWITCH VALUE
05E4 83         1678 XLDCSW: RET
                1679 $EJECT
                1680
                1681 ;***********************************************
                1682 ;*
                1683 ;*    READ VLC SWITCH :
                1684 ;*
                1685 ;*        THIS ROUTINE READS THE SELECTED VLC SWITCH
                1686 ;*        AND THEN ENABLES THE VLC STATE LATCH.
                1687 ;*
                1688 ;*        ENTRY CONDITION(S):
                1689 ;*              "R4" = ALERT CODE
                1690 ;*              "R5" = MIN SETPOINT
                1691 ;*
                1692 ;*        EXIT CONDITION(S):
                1693 ;*              "RB" = 2**4(SW. VALUE)
                1694 ;*
                1695 ;***********************************************
```

```
LOC   OBJ        LINE        SOURCE STATEMENT
                 1696
05E5  B911       1697 VLCSW:  MOV   R1,#17              ;LEGAL LIMIT (17 POSITIONS)
05E7  BA01       1698         MOV   R2,#01              ;STEP WEIGHT (1 BIT/VOLT)
05E9  14E2       1699         CALL  SWCODE
05EB  B804       1700         MOV   R0,#04
05ED  D458       1701         CALL  LSHIFT              ;SCALE 2**4(SW. VALUE) -> "R6-R5"
05EF  B838       1702         MOV   R0,#RB
05F1  D4EC       1703         CALL  TR65RX              ;SAVE VLC VALUE -> "RB"
05F3  BA4C       1704         MOV   R2,#VLCOPT
05F5  14C5       1705         CALL  IOSEL               ;ENABLE VLC STATE LATCH (I/03)
05F7  83         1706         RET
                 1707
                 1708 $EJECT
0099             1709         ORG   XPNULL+1            ;PAGE 0
                 1710
                 1711 ;************************************************
                 1712 ;*
                 1713 ;*   RAISE / LOWER REGULATOR VOLTAGE :
                 1714 ;*
                 1715 ;*      THESE ROUTINES SET MOTOR DIRECTION TO EITHER
                 1716 ;*      RAISE OR LOWER REGULATOR VOLTAGE.
                 1717 ;*
                 1718 ;*      ENTRY CONDITION(S):   NONE
                 1719 ;*
                 1720 ;*      EXIT  CONDITION(S):
                 1721 ;*              "CARRY" IN = "CARRY" OUT
                 1722 ;*              "R0" OUT = POINTS TO "PORT0" STATUS WORD
                 1723 ;*              "R1" OUT = "R1" IN
                 1724 ;*
                 1725 ;************************************************
                 1726
0099  B830       1727 MRAISE: MOV   R0,#PORT0
009B  23FE       1728         MOV   A,#11111110B        ;SELECT "J" CONTACT
009D  50         1729         ANL   A,@R0
009E  04A5       1730         JMP   MENBLE
                 1731
00A0  B830       1732 MLOWER: MOV   R0,#PORT0
00A2  2301       1733         MOV   A,#00000001B        ;SELECT "K" CONTACT
00A4  40         1734         ORL   A,@R0
                 1735
00A5  4302       1736 MENBLE: ORL   A,#00000010B        ;ENABLE AUTO MOTOR CONTROL
00A7  A0         1737         MOV   @R0,A               ;UPDATE "PORT0" STATUS
00A8  83         1738 XMOTOR: RET
                 1739
                 1740
                 1741 $EJECT
                 1742
                 1743
                 1744
                 1745 ;************************************************
                 1746 ;*
                 1747 ;*   CLEAR BAND INDICATOR AND TIMER :
                 1748 ;*
                 1749 ;*      ENTRY CONDITION(S):   NONE
                 1750 ;*
                 1751 ;*      EXIT  CONDITION(S):
                 1752 ;*              "R1" OUT = "R1" IN
                 1753 ;*
                 1754 ;*
                 1755 ;************************************************
                 1756
00A9  B830       1757 BCLEAR: MOV   R0,#PORT0           ;CLEAR
00AB  F0         1758         MOV   A,@R0               ; BAND
00AC  53C7       1759         ANL   A,#11000111B        ;  INDICATORS
00AE  A0         1760         MOV   @R0,A               ;   0 -> (PORT0,BITS 5,4,3)
                 1761
00AF  27         1762 TCLEAR: CLR   A
00B0  B83D       1763         MOV   R0,#TIMER           ;CLEAR
00B2  A0         1764         MOV   @R0,A
00B3  18         1765         INC   R0                  ; TIMER
00B4  A0         1766         MOV   @R0,A
00B5  83         1767 XCLEAR: RET
                 1768
                 1769 $EJECT
```

```
LOC   OBJ          LINE        SOURCE STATEMENT
                   1770
                   1771 ;*************************************************
                   1772 ;*
                   1773 ;*
                   1774 ;*                  UTILITY ROUTINES :
                   1775 ;*
                   1776 ;*
                   1777 ;*        THE FOLLOWING REGISTER DESIGNATIONS ARE USED
                   1778 ;*
                   1779 ;*        XA       EQU      R2
                   1780 ;*        COUNT    EQU      R3
                   1781 ;*        ICNT     EQU      R4
                   1782 ;*        DEV      EQU      R5
                   1783 ;*        ANGLE    EQU      RC
                   1784 ;*        SQ       EQU      RD
                   1785 ;*
                   1786 ;*************************************************
                   1787
                   1788
                   1789
                   1790
                   1791 ;*************************************************
                   1792 ;*
                   1793 ;*   FAST 8 X 8 SQUARE :
                   1794 ;*
                   1795 ;*     THIS ROUTINE PROVIDES AN 8 X 8 UNSIGNED SQUARE
                   1796 ;*     WITH A FIXED EXECUTION TIME OF 55 CYCLES.
                   1797 ;*
                   1798 ;*     ENTRY CONDITION(S):
                   1799 ;*          "A" = CONTAINS NO. TO SQUARED
                   1800 ;*
                   1801 ;*     EXIT CONDITION(S):
                   1802 ;*          "R2" = LSD OF NO. SQUARED
                   1803 ;*          "R3" = MSD OF NO. SQUARED
                   1804 ;*          "R4" IS DESTROYED
                   1805 ;*          "RD" IS DESTROYED
                   1806 ;*
                   1807 ;*     NOTE:  ASSEMBLER MUST BE "ORGED" TO BEGINNING OF
                   1808 ;*            PAGE FOR FOLLOWING CODE TO EXECUTE PROPERLY.
                   1809 ;*            THE SQUARE PRODUCTS TABLE (SQTAB) MUST NOT
                   1810 ;*            BE DISTURBED OR MOVED FROM BEGINNING OF PAGE!!!
                   1811 ;*
                   1812 ;*************************************************
                   1813
                   1814
0600               1815         ORG      600H
                   1816
0600 00            1817 SQTAB:  DB       0
0601 01            1818         DB       1
0602 04            1819         DB       4
0603 09            1820         DB       9
0604 10            1821         DB       16
0605 19            1822         DB       25
0606 24            1823         DB       36
0607 31            1824         DB       49
0608 40            1825         DB       64
0609 51            1826         DB       81
060A 64            1827         DB       100
060B 79            1828         DB       121
060C 90            1829         DB       144
060D A9            1830         DB       169
060E C4            1831         DB       196
060F E1            1832         DB       225
                   1833
0610 BB04          1834 SQUARE: MOV      RD,#REG4      ;LOOP COUNT & REGISTER POINTER
0612 8000          1835         MOV      @RD,#0        ;ZERO TEMPORARY HOLDING REG.
0614 30            1836         XCHD     A,@RD         ;MSD NO. IN "A" - LSD NO. IN "R4"
0615 AA            1837         MOV      R2,A          ;SAVE MSD NO. IN "R2"
0616 47            1838         SWAP     A             ;MOVE MSD TO LSD IN "A"
0617 A3            1839         MOVP     A,@A          ;LOOKUP MSD SQUARED IN TABLE
0618 2B            1840         XCH      A,R3          ;STORE MSD**2 IN MSD REG.
0619 FC            1841         MOV      A,R4          ;LOAD LSD NO.
061A A3            1842         MOVP     A,@A          ;LOOKUP LSD SQUARED IN TABLE
061B 2A            1843         XCH      A,R2          ;STORE LSD**2 IN LSD REG.-RESTORE MSD IN "A"
061C 97            1844         CLR      C
061D F7            1845 SQB:    RLC      A             ;IS BIT OF MSD = 1 ?
061E E62F          1846         JNC      SQAX          ;NO, JUMP
```

```
LOC   OBJ        LINE           SOURCE STATEMENT 0620  00         1847              NOP                      ;EQUALIZE LOOPS
0621  6C         1848              ADD      A,R4            ;YES, ADD LSD
0622  E81D       1849  SQA:        DJNZ     R0,SQB          ;THIS LOOP DOES LSD*MSD
0624  47         1850              SWAP     A               ;THIS
0625  30         1851              XCHD     A,@R0           ;  ANSWER
0626  F7         1852              RLC      A               ;    MUST
0627  28         1853              XCH      A,R0            ;      BE
0628  F7         1854              RLC      A               ;        MULYIPLIED
0629  2A         1855              XCH      A,R2            ;          BY 32
062A  68         1856              ADD      A,R0            ;NOW ADD
062B  2A         1857              XCH      A,R2            ;  THIS
062C  7B         1858              ADDC     A,R3            ;    PRODUCT(2A*B)
062D  2B         1859              XCH      A,R3            ;      TO (A**2) + (B**2)
062E  83         1860              RET                      ;EXIT
062F  C422       1861  SQAX:       JMP      SQA             ;EQUALIZE LOOPS
                 1862
                 1863  ;************************************************
                 1864  ;*
                 1865  ;*    15 X 15 DIVIDE :
                 1866  ;*
                 1867  ;*       THIS ROUTINE PROVIDES A 15 BY 15 UNSIGNED
                 1868  ;*       DIVIDE WITH RESULT SCALED BY 2**15.
                 1869  ;*
                 1870  ;*       ENTRY CONDITION(S):
                 1871  ;*               "R0" = POINTS TO LSD OF 15 BIT DIVISOR
                 1872  ;*               "R7-R6" = 15 BIT DIVIDEND
                 1873  ;*
                 1874  ;*               NOTE:   ([R1]/[R0]) MUST BE < 2
                 1875  ;*
                 1876  ;*       EXIT CONDITION(S):
                 1877  ;*               "R6-R5" = 2**15([R1]/[R0])   16 BIT RESULT  (R6 = MSD, R5 = LSD)
                 1878  ;*
                 1879  ;*       TIME:   10 MSEC (TYP)
                 1880  ;*
                 1881  ;************************************************
                 1882
0631  B906       1883  DIV2X2:     MOV      R1,WREG6        ;POINT TO 15 BIT DIVIDEND
0633  BB02       1884              MOV      R3,#02
0635  BC08       1885  HENC1:      MOV      R4,#08
0637  27         1886              CLR      A
0638  2D         1887              XCH      A,R5            ;CLEAR "R5"
0639  2A         1888              XCH      A,R2            ;SAVE TEMP RESULT IN "R2"
063A  D444       1889  HENCE:      CALL     SUBD2S          ;SUB DIVISOR FROM DIVIDEND
063C  E83E       1890              DJNZ     R0,N1
063E  E940       1891  N1:         DJNZ     R1,N2
0640  E648       1892  N2:         JNC      HENC2           ;NO CARRY - CONTINUE
0642  D474       1893              CALL     ADDDB           ;CARRY ADD DIVISOR BACK
0644  E846       1894              DJNZ     R0,N1X
0646  E948       1895  N1X:        DJNZ     R1,HENC2
0648  A7         1896  HENC2:      CPL      C               ;COMPLEMENT CARRY FOR BIT RESULT
0649  F8         1897              MOV      A,R0            ;SAVE "R0"
064A  B801       1898              MOV      R0,#01
064C  D459       1899              CALL     ROTQD           ;ROTATE DIVIDEND AND TEMP RESULT
064E  28         1900              XCH      A,R0
064F  EC3A       1901              DJNZ     R4,HENCE        ;CONTINUE FOR R4 BITS
0651  EB35       1902              DJNZ     R3,HENC1        ;LOOP TWICE
0653  FA         1903              MOV      A,R2            ;XFER ANSWER TO "R6-R5"
0654  AE         1904              MOV      R6,A
0655  83         1905  XDIV:       RET
                 1906
00B6             1907              ORG      XCLEAR+1        ;PAGE 0
                 1908
                 1909
                 1910  ;************************************************
                 1911  ;*
                 1912  ;*    TRIPLE PRECISION RIGHT SHIFT :
                 1913  ;*
                 1914  ;*       THIS ROUTINE PROVIDES A 24 BIT RIGHT SHIFT
                 1915  ;*       FUNCTION AND IS TYPICALLY CALLED IMMEDIATELY
                 1916  ;*       FOLLOWING A "MPY2X2" CALL.
                 1917  ;*
                 1918  ;*       ENTRY CONDITION(S):
                 1919  ;*               "R0" = NO. OF SHIFTS TO BE PERFORMED
                 1920  ;*               "R5" = LOWER 8 BITS OF 24 BIT WORD
                 1921  ;*               "R6" = MIDDLE 8 BITS OF 24 BIT WORD
                 1922  ;*               "R7" = UPPER 8 BITS OF 24 BIT WORD
                 1923  ;*
```

| LOC OBJ | LINE | SOURCE STATEMENT |
|---|---|---|
| | 1924 ;* | EXIT CONDITION(S): |
| | 1925 ;* | "R7-R6-R5" = CONTAINS SHIFTED RESULT |
| | 1926 ;* | |
| | 1927 ;*********************************************** | |
| | 1928 | |
| 00B6 B807 | 1929 RSFT07: | MOV R0,#07 ;SHIFT 7 TIMES |
| 00B8 97 | 1930 RSHIFT: | CLR C |
| 00B9 FF | 1931 | MOV A,R7 |
| 00BA 67 | 1932 | RRC A ;SHIFT UPPER 8 BITS |
| 00BB AF | 1933 | MOV R7,A |
| 00BC FE | 1934 | MOV A,R6 |
| 00BD 67 | 1935 | RRC A ;SHIFT MIDDLE 8 BITS |
| 00BE AE | 1936 | MOV R6,A |
| 00BF FD | 1937 | MOV A,R5 |
| 00C0 67 | 1938 | RRC A ;SHIFT LOWER 8 BITS |
| 00C1 AD | 1939 | MOV R5,A |
| 00C2 EBB8 | 1940 | DJNZ R0,RSHIFT ;SHIFTS COMPLETED ? |
| 00C4 83 | 1941 XRSFT: | RET ;YES, EXIT |
| | 1942 | |
| 0656 | 1943 | ORG XDIV+1 ;PAGE 6 |
| | 1944 | |
| | 1945 | |
| | 1946 ;*********************************************** | |
| | 1947 ;* | |
| | 1948 ;* | TRIPLE PRECISION LEFT SHIFT : |
| | 1949 ;* | |
| | 1950 ;* | THIS ROUTINE PROVIDES A 24 BIT ARITHMATIC |
| | 1951 ;* | SHIFT LEFT FUNCTION. |
| | 1952 ;* | |
| | 1953 ;* | ENTRY CONDITION(S): |
| | 1954 ;* | "R0" = NO. OF SHIFTS TO BE PERFORMED |
| | 1955 ;* | "R5" = LOWER 8 BITS OF 24 BIT WORD |
| | 1956 ;* | "R6" = MIDDLE 8 BITS OF 24 BIT WORD |
| | 1957 ;* | "R7" = UPPER 8 BITS OF 24 BIT WORD |
| | 1958 ;* | |
| | 1959 ;* | EXIT CONDITION(S): |
| | 1960 ;* | "R7-R6-R5" = CONTAINS SHIFTED RESULT |
| | 1961 ;* | |
| | 1962 ;* | CARRY SET = OVERFLOW (ROUTINE EXITS) |
| | 1963 ;* | |
| | 1964 ;* | |
| | 1965 ;* | "A" IS SAVED |
| | 1966 ;* | |
| | 1967 ;*********************************************** | |
| | 1968 | |
| 0656 B802 | 1969 LSHFT2: | MOV R0,#02 |
| 0658 97 | 1970 LSHIFT: | CLR C |
| 0659 2D | 1971 ROTQD: | XCH A,R5 |
| 065A F7 | 1972 | RLC A ;SHIFT LOWER 8 BITS |
| 065B 2D | 1973 | XCH A,R5 |
| 065C 2E | 1974 | XCH A,R6 |
| 065D F7 | 1975 | RLC A ;SHIFT MIDDLE 8 BITS |
| 065E 2E | 1976 | XCH A,R6 |
| 065F 2F | 1977 | XCH A,R7 |
| 0660 F7 | 1978 | RLC A ;SHIFT UPPER 8 BITS |
| 0661 2F | 1979 | XCH A,R7 |
| 0662 F666 | 1980 | JC XLSHFT ;EXIT IF OVERFLOW ! |
| 0664 E858 | 1981 | DJNZ R0,LSHIFT ;SHIFTS COMPLETED ? |
| 0666 83 | 1982 XLSHFT: | RET ;YES, EXIT |
| | 1983 | |
| | 1984 | |
| | 1985 | |
| | 1986 ;*********************************************** | |
| | 1987 ;* | |
| | 1988 ;* | DOUBLE PRECISION UNSIGNED COMPARE : |
| | 1989 ;* | |
| | 1990 ;* | ENTRY CONDITION(S): |
| | 1991 ;* | "R0" = POINTS TO 1ST 16 BIT WORD LSD TO BE COMPARED |
| | 1992 ;* | "R1" = POINTS TO 2ND 16 BIT WORD LSD TO BE COMPARED |
| | 1993 ;* | |
| | 1994 ;* | EXIT CONDITION(S): |
| | 1995 ;* | "R0" = POINTS TO 1ST 16 BIT WORD LSD |
| | 1996 ;* | "R1" = POINTS TO 2ND 16 BIT WORD LSD |
| | 1997 ;* | CARRY CLEARED - [R1] <= [R0] |
| | 1998 ;* | CARRY SET - [R1] > [R0] |
| | 1999 ;* | [R1] OUT = [R1] IN |
| | 2000 ;* | [R0] OUT = [R0] IN |

```
LOC   OBJ        LINE        SOURCE STATEMENT

2001 ;*
                 2002 ;******************************************
                 2003
0667 F0          2004 COMPDB: MOV   A,@R0
0668 37          2005         CPL   A        ;TAKE 1'S COMPLEMENT OF LSD
0669 61          2006         ADD   A,@R1    ;ADD LSD'S
066A 18          2007         INC   R0
066B 19          2008         INC   R1
066C F0          2009         MOV   A,@R0
066D 37          2010         CPL   A        ;TAKE 1'S COMPLEMENT OF MSD
066E 71          2011         ADDC  A,@R1    ;ADD MSD'S + LSD BORROW
066F E871        2012         DJNZ  R0,$+2   ;POINT TO LSD'S
0671 E973        2013         DJNZ  R1,$+2
0673 83          2014         RET
                 2015
                 2016
                 2017 ;******************************************
                 2018 ;*
                 2019 ;*    DOUBLE PRECISION ADDITION :
                 2020 ;*
                 2021 ;*        THIS ROUTINE PROVIDES A 16 BY 16  ADDITION .
                 2022 ;*
                 2023 ;*        ENTRY CONDITON(S):
                 2024 ;*             "R0" = POINTS TO LSD OF 1ST 16 BIT WORD
                 2025 ;*             "R1" = POINTS TO LSD OF 2ND 16 BIT WORD
                 2026 ;*
                 2027 ;*        EXIT  CONDITION(S):
                 2028 ;*             "R0" = POINTS TO MSD OF 1ST 16 BIT WORD
                 2029 ;*             "R1" = POINTS TO MSD OF 16 BIT RESULT
                 2030 ;*             [R1] OUT = [R1] IN + [R0] IN
                 2031 ;*             [R0] OUT = [R0] IN
                 2032 ;*
                 2033 ;*        NOTE: CARRY IS SET IF ADDITION RESULTS IN OVERFLOW,
                 2034 ;*              OTHERWISE CLEARED FOR UNSIGNED ADDITION.
                 2035 ;*
                 2036 ;******************************************
                 2037
0674 F0          2038 ADDDB:  MOV   A,@R0
0675 61          2039         ADD   A,@R1    ;ADD LSD'S
0676 A1          2040         MOV   @R1,A    ;STORE LSD RESULT
0677 18          2041         INC   R0
0678 19          2042         INC   R1
0679 F0          2043         MOV   A,@R0
067A 71          2044         ADDC  A,@R1    ;ADD MSD'S + LSD CARRY
067B A1          2045         MOV   @R1,A    ;STORE MSD RESULT
067C 83          2046         RET
                 2047
                 2048
                 2049 ;******************************************
                 2050 ;*
                 2051 ;*    TRIPLE PRECISION ADDITION :
                 2052 ;*
                 2053 ;*        THIS ROUTINE PROVIDES A 24 BY 24 UNSIGNED ADDITION.
                 2054 ;*
                 2055 ;*        ENTRY CONDITION(S):
                 2056 ;*             "R0" = POINTS TO LSD OF 1ST 24 BIT WORD
                 2057 ;*             "R1" = POINTS TO LSD OF 2ND 24 BIT WORD
                 2058 ;*
                 2059 ;*        EXIT  CONDITION(S):
                 2060 ;*             "R1" = POINTS TO MSD OF 24 BIT RESULT
                 2061 ;*             [R1]OUT = [R1]IN + [R0]IN
                 2062 ;*             [R0]OUT = [R0]IN
                 2063 ;*
                 2064 ;*        NOTE: CARRY IS SET IF ADDITION RESULTS IN
                 2065 ;*              OVERFLOW, OTHERWISE CLEARED.
                 2066 ;*
                 2067 ;******************************************
                 2068
067D D474        2069 ADDTRI: CALL  ADDDB    ;ADD LOWER 16 BITS
067F 18          2070         INC   R0       ;POINT TO 1ST WORD MSD
0680 19          2071         INC   R1       ;POINT TO 2ND WORD MSD
0681 F0          2072         MOV   A,@R0
0682 71          2073         ADDC  A,@R1    ;ADD MSD'S + LSD'S CARRY
0683 A1          2074         MOV   @R1,A    ;STORE MSD RESULT
0684 83          2075         RET
                 2076
                 2077
```

| LOC OBJ | LINE | SOURCE STATEMENT |

```
                2078 ;************************************************
                2079 ;*
                2080 ;*   DOUBLE PRECISION ABSOLUTE VALUE UNSIGNED SUBTRACTION :
                2081 ;*
                2082 ;*       THIS ROUTINE PROVIDES THE ABSOLUTE VALUE OF A
                2083 ;*       16 BY 16 UNSIGNED SUBTRACTION.
                2084 ;*
                2085 ;*       ENTRY CONDITION(S):
                2086 ;*               "R0" = POINTS TO UNSIGNED 16 BIT SUBTRAHEND LSD
                2087 ;*               "R1" = POINTS TO UNSIGNED 16 BIT MINUEND LSD
                2088 ;*
                2089 ;*       EXIT CONDITION(S):
                2090 ;*               "R1" = POINTS TO MSD OF 16 BIT RESULT
                2091 ;*               CARRY SET     = RESULT IS NEGATIVE
                2092 ;*               CARRY CLEARED = RESULT IS POSITIVE OR ZERO
                2093 ;*               [R1]OUT = [R1]IN - [R0]IN   ; ABSOLUTE VALUE OF RESULT
                2094 ;*               [R0]OUT = [R0]IN
                2095 ;*
                2096 ;************************************************
                2097
0685 D464       2098 SUBDB:  CALL    SUBD2S  ;2'S COMPLEMENT SUBTRACT
0687 E68F       2099         JNC     XSUBDB  ;EXIT IF RESULT POSITIVE
0689 E98B       2100         DJNZ    R1,SUBNEG
068B F4A6       2101 SUBNEG: CALL    CMP2S   ;2'S COMPLEMENT NEG. RESULT
068D 97         2102         CLR     C       ;FLAG NEGATIVE RESULT
068E A7         2103         CPL     C
068F 83         2104 XSUBDB: RET
                2105
                2106
                2107 ;************************************************
                2108 ;*
                2109 ;*   TRIPLE PRECISION 2'S COMPLEMENT SUBTRACTION :
                2110 ;*
                2111 ;*       THIS ROUTINE PROVIDES A 24 BY 24 SIGNED
                2112 ;*       SUBTRACTION.
                2113 ;*
                2114 ;*       ENTRY CONDITION(S):
                2115 ;*               "R0" = POINTS TO UNSIGNED 24 BIT SUBTRAHEND
                2116 ;*               "R1" = POINTS TO UNSIGNED 24 BIT MINUEND
                2117 ;*
                2118 ;*       EXIT CONDITION(S):
                2119 ;*               [R1]OUT = [R1]IN - [R0]IN
                2120 ;*               [R0]OUT = [R0]IN
                2121 ;*
                2122 ;*       NOTE:   IF USED AS AN UNSIGNED SUBTRACT THEN-
                2123 ;*
                2124 ;*               CARRY SET     = RESULT IS NEGATIVE
                2125 ;*               CARRY CLEARED = RESULT IS POSITIVE OR ZERO
                2126 ;*
                2127 ;************************************************
                2128
0690 D464       2129 SUBTRI: CALL    SUBD2S  ;SUBTRACT LOWER 2 BYTES
0692 18         2130         INC     R0
0693 19         2131         INC     R1
0694 21         2132         XCH     A,@R1
0695 37         2133         CPL     A
0696 70         2134         ADDC    A,@R0   ;SUBTRACT MSD'S - LSD BORROW
0697 37         2135         CPL     A
0698 21         2136         XCH     A,@R1   ;SAVE MSD RESULT
0699 83         2137         RET
                2138
                2139
                2140
                2141 ;************************************************
                2142 ;*
                2143 ;*   DOUBLE PRECISION INCREMENT :
                2144 ;*
                2145 ;*       ENTRY CONDITION(S):
                2146 ;*               "R0" = POINTS TO 16 BIT WORD TO BE INCREMENTED
                2147 ;*
                2148 ;*       EXIT CONDITION(S):
                2149 ;*               "A" IS DESTROYED
                2150 ;*
                2151 ;************************************************
                2152
069A 97         2153 INCDB:  CLR     C
069B A7         2154         CPL     C       ;SET CARRY
```

```
LOC  OBJ        LINE         SOURCE STATEMENT
069C 27         2155         CLR    A
069D 70         2156         ADDC   A,@R0      ;ADD 1 TO DOUBLE WORD LSD
069E A0         2157         MOV    @R0,A      ;SAVE LSD
069F 18         2158         INC    R0         ;POINT TO MSD
06A0 27         2159         CLR    A
06A1 70         2160         ADDC   A,@R0      ;ADD LSD OVERFLOW TO MSD
06A2 A0         2161         MOV    @R0,A      ;SAVE MSD
06A3 83         2162         RET
                2163
                2164
                2165 ;****************************************
                2166 ;*
                2167 ;*    DOUBLE PRECISION 2'S COMPLEMENT SUBTRACTION :
                2168 ;*
                2169 ;*        THIS ROUTINE PROVIDES A 15 BY 15 SIGNED
                2170 ;*        SUBTRACTION.
                2171 ;*
                2172 ;*        ENTRY CONDITION(S):
                2173 ;*                "R0" = POINTS TO 2'S COMPLEMENT 16 BIT SUBTRAHEND
                2174 ;*                "R1" = POINTS TO 2'S COMPLEMENT 16 BIT MINUEND
                2175 ;*
                2176 ;*        EXIT  CONDITION(S):
                2177 ;*                "R1" = POINTS TO MSD OF 16 BIT RESULT
                2178 ;*                [R1] OUT = [R1] IN - [R0] IN = -([R0]IN - [R1]IN)
                2179 ;*                [R0] OUT = [R0] IN
                2180 ;*
                2181 ;*                "A" IS SAVED
                2182 ;*
                2183 ;*        NOTE:  IF USED AS AN 16 BY 16  UNSIGNED SUBTRACT THEN-
                2184 ;*
                2185 ;*                CARRY SET     = RESULT IS NEGATIVE
                2186 ;*                CARRY CLEARED = RESULT IS POSITIVE OR ZERO
                2187 ;*
                2188 ;****************************************
                2189
06A4 21         2190 SUBD2S: XCH    A,@R1      ;LOAD MINUEND LSD
06A5 37         2191         CPL    A
06A6 60         2192         ADD    A,@R0      ;SUB SUBTRAHEND LSD W/O CARRY
06A7 37         2193         CPL    A
06A8 18         2194         INC    R0
06A9 21         2195         XCH    A,@R1      ;STORE RESULT LSD
06AA 19         2196         INC    R1
06AB 21         2197         XCH    A,@R1      ;LOAD MINUEND MSD
06AC 37         2198         CPL    A
06AD 70         2199         ADDC   A,@R0      ;SUB SUBTRAHEND MSD WITH CARRY (BORROW)
06AE 37         2200         CPL    A
06AF 21         2201         XCH    A,@R1      ;STORE RESULT MSD & RESTORE "A"
06B0 83         2202         RET
                2203
                2204
                2205 ;****************************************
                2206 ;*
                2207 ;*    8 X 8 MULTIPLY :
                2208 ;*
                2209 ;*        THIS ROUTINE PROVIDES AN 8 BY 8 UNSIGNED
                2210 ;*        MULTIPLY.
                2211 ;*
                2212 ;*        ENTRY CONDITION(S):
                2213 ;*                "R0" = POINTS TO MULTIPLIER
                2214 ;*                "R1" = POINTS TO MULTIPLICAND
                2215 ;*
                2216 ;*        EXIT  CONDITION(S):
                2217 ;*                "A"  = UPPER 8 BITS OF PRODUCT
                2218 ;*                "R2" = LOWER 8 BITS OF PRODUCT-(XA)
                2219 ;*                "R0" IS SAME
                2220 ;*                "R1" IS SAME
                2221 ;*                "R3" IS DESTROYED
                2222 ;*
                2223 ;****************************************
                2224
06B1 BB08       2225 MPY8X8: MOV    R3,#8      ;8 LOOPS
06B3 F0         2226         MOV    A,@R0      ;LOAD MULTIPLIER
06B4 2A         2227         XCH    A,XA       ;STORE IN EXTENDED A REG
06B5 97         2228         CLR    C          ;CLEAR CARRY
06B6 27         2229         CLR    A          ;CLEAR MSD OF RESULT
06B7 67         2230 BMP1:   RRC    A          ;ROTATE ACCUMULATOR
```

| LOC | OBJ | LINE | | SOURCE STATEMENT | | |
|---|---|---|---|---|---|---|
| 06B8 | 2A | 2231 | | XCH | A,XA | ;ROTATE |
| 06B9 | 67 | 2232 | | RRC | A | ; EXTENDED ACCUMALATOR |
| 06BA | 2A | 2233 | | XCH | A,XA | ;EXCHANGE MSD IN CARRY |
| 06BB | E6BE | 2234 | | JNC | BMP3 | ;IS MSD ONE ? (CARRY SET) |
| 06BD | 61 | 2235 | | ADD | A,@R1 | ;YES, ADD MULTIPLICAND |
| 06BE | EBB7 | 2236 | BMP3: | DJNZ | R3,BMP1 | ;LOOP FINIISH |
| 06C0 | 67 | 2237 | | RRC | A | ;YES |
| 06C1 | 2A | 2238 | | XCH | A,XA | ;ROTATE |
| 06C2 | 67 | 2239 | | RRC | A | ; ONCE |
| 06C3 | 2A | 2240 | | XCH | A,XA | ; MORE |
| 06C4 | 83 | 2241 | | RET | | ;THEN EXIT |
| | | 2242 | | | | |
| | | 2243 | | | | |
| | | 2244 | ;************************************************ | | | |
| | | 2245 | ;* | | | |
| | | 2246 | ;* | 16 X 16 MULTIPLY : | | | |
| | | 2247 | ;* | | | |
| | | 2248 | ;* | THIS ROUTINE PROVIDES A 16 BY 16 UNSIGNED | | | |
| | | 2249 | ;* | MULTIPLY WITH THE RESULT DIVIDED BY 256. | | | |
| | | 2250 | ;* | | | |
| | | 2251 | ;* | ENTRY CONDITION(S): | | | |
| | | 2252 | ;* | "R0" = POINTS TO MULTIPLIER MSD | | | |
| | | 2253 | ;* | "R1" = POINTS TO MULTIPLICAND MSD | | | |
| | | 2254 | ;* | | | |
| | | 2255 | ;* | EXIT CONDITION(S): | | | |
| | | 2256 | ;* | "R7" = UPPER 8 BITS OF PRODUCT | | | |
| | | 2257 | ;* | "R6" = MIDDLE 8 BITS OF PRODUCT | | | |
| | | 2258 | ;* | "R5" = LOWER 8 BITS OF PRODUCT | | | |
| | | 2259 | ;* | "R3" IS DESTROYED | | | |
| | | 2260 | ;* | "R2" IS DESTROYED-(XA) | | | |
| | | 2261 | ;* | | | |
| | | 2262 | ;* | "R4" IS NOT DESTROYED | | | |
| | | 2263 | ;* | | | |
| | | 2264 | ;************************************************ | | | |
| | | 2265 | | | | |
| 06C5 | D4B1 | 2266 | MPY2X2: | CALL | MPY8X8 | ;MPY MSD1 X MSD2 |
| 06C7 | 2F | 2267 | | XCH | A,R7 | ;THIS |
| 06C8 | 2A | 2268 | | XCH | A,XA | ; PRODUCT |
| 06C9 | 2E | 2269 | | XCH | A,R6 | ; IS PLACED |
| 06CA | 28 | 2270 | | XCH | A,R0 | ; IN THE 2 MSD DIGITS |
| 06CB | 07 | 2271 | | DEC | A | ;POINT |
| 06CC | 29 | 2272 | | XCH | A,R1 | ; TO |
| 06CD | 07 | 2273 | | DEC | A | ; THE |
| 06CE | 28 | 2274 | | XCH | A,R0 | ; LSDS |
| 06CF | D4B1 | 2275 | | CALL | MPY8X8 | ;MPY LSD1 X LSD2 |
| 06D1 | 2D | 2276 | | XCH | A,R5 | ;ONLY KEEP MSD OF THIS PRODUCT |
| 06D2 | 18 | 2277 | | INC | R0 | ;POINT TO MSD2 |
| 06D3 | D4B1 | 2278 | | CALL | MPY8X8 | ;MPY LSD1 X MSD2 |
| 06D5 | D4E0 | 2279 | | CALL | ADMPY | ;MLSD + LSD12 AND MMSD + MSD12 |
| 06D7 | 19 | 2280 | | INC | R1 | ;POINT TO MSD1 |
| 06D8 | 28 | 2281 | | XCH | A,R0 | ;POINT |
| 06D9 | 07 | 2282 | | DEC | A | ; TO |
| 06DA | 28 | 2283 | | XCH | A,R0 | ; LSD2 |
| 06DB | D4B1 | 2284 | | CALL | MPY8X8 | ;MPY LSD2 X MSD1 |
| 06DD | D4E0 | 2285 | | CALL | ADMPY | ;MLSD + LSD12 AND MMSD + MSD12 |
| 06DF | 83 | 2286 | | RET | | |
| | | 2287 | | | | |
| | | 2288 | | | | |
| | | 2289 | ;************************************************ | | | |
| | | 2290 | ;* | | | |
| | | 2291 | ;* | THIS ROUTINE ADDS INTERMEDIATE 8 BY 8 MSD AND LSD | | | |
| | | 2292 | ;* | PRODUCTS THAT RESULT IN THE 16 BY 16 MULTIPLY | | | |
| | | 2293 | ;* | ROUTINE. | | | |
| | | 2294 | ;* | | | |
| | | 2295 | ;* | ENTRY CONDITION(S): | | | |
| | | 2296 | ;* | "A" = MSD OF PRODUCT | | | |
| | | 2297 | ;* | "XA" = LSD OF PRODUCT | | | |
| | | 2298 | ;* | | | |
| | | 2299 | ;* | EXIT CONDITION(S): | | | |
| | | 2300 | ;* | "A" = "A" IN + "R6" | | | |
| | | 2301 | ;* | "XA" = "XA" IN + "R5" | | | |
| | | 2302 | ;* | "R7" = "R7" + CARRY | | | |
| | | 2303 | ;* | | | |
| | | 2304 | ;************************************************ | | | |
| | | 2305 | | | | |
| 06E0 | 2A | 2306 | ADMPY: | XCH | A,XA | ;LOAD LSD OF PRODUCT |
| 06E1 | 60 | 2307 | | ADD | A,R5 | ;ADD TO R5 |

```
LOC  OBJ        LINE      SOURCE STATEMENT

06E2 2D         2308           XCH    A,R5      ;STORE SUM
06E3 2A         2309           XCH    A,XA      ;LOAD MSD OF PRODUCT
06E4 7F         2310           ADDC   A,R6      ;ADD TO R6
06E5 2E         2311           XCH    A,R6      ;STORE SUM
06E6 27         2312           CLR    A         ;ADD
06E7 7F         2313           ADDC   A,R7      ; CARRY TO R7
06E8 2F         2314           XCH    A,R7      ;STORE R7 + CARRY
06E9 83         2315           RET              ;EXIT
                2316
                2317
                2318 ;************************************************
                2319 ;*
                2320 ;*    TRANSFER "R6-R5" TO "RA"/"RX" :
                2321 ;*
                2322 ;*        ENTRY CONDITION(S):
                2323 ;*                "R6-R5" = 16 BIT WORD TO BE TRANSFERRED
                2324 ;*
                2325 ;*        EXIT CONDITION(S):
                2326 ;*                "R0" = POINTS TO "RA+1"/"RX+1"
                2327 ;*
                2328 ;*        NOTE:  IF ROUTINE IS ENTERED AT "TR65RX", "R0"
                2329 ;*               MUST BE PRE-LOADED.
                2330 ;*
                2331 ;************************************************
                2332
06EA B836       2333 TR65RA: MOV    R0,#RA    ;TRANSFER
06EC F0         2334 TR65RX: MOV    A,R5
06ED A0         2335          MOV    @R0,A     ; "R6-R5" TO
06EE 18         2336          INC    R0
06EF FE         2337          MOV    A,R6      ;    REG "RA"/"RX"
06F0 A0         2338          MOV    @R0,A
06F1 83         2339 XTR65R: RET
                2340
                2341
                2342 $EJECT
                2343
                2344 ;************************************************
                2345 ;*
                2346 ;*    SIN/COS ROUTINE BY THE "CORDIC" ALGORITHM :
                2347 ;*
                2348 ;*        THIS ROUTINE COMPUTES BOTH THE SINE AND
                2349 ;*        COSINE FUNCTION OF AN ANGLE SPECIFIED
                2350 ;*        IN 2'S COMPLEMENT WITHIN THE RANGE OF
                2351 ;*        +/- 90 DEGREES.
                2352 ;*
                2353 ;*        ENTRY CONDITION(S):
                2354 ;*                RA = ANGLE = FRACTIONAL PART OF(PHASE DIFF/90 DEG)*(2**14)
                2355 ;*
                2356 ;*                        WHERE:  -90 DEG < PHASE DIFF < +90 DEG
                2357 ;*
                2358 ;*                        INPUT FORMAT:  +/-X.XXXXXX  XXXXXXXX  BIT 15 = 1(NEG)
                2359 ;*                                          MSD         LSD          = 0(POS)
                2360 ;*
                2361 ;*        EXIT CONDITION(S):
                2362 ;*                "R7-R6" = 2**14(COS OF ANGLE)  : 2'S COMPLEMENT
                2363 ;*                "R5-R4" = 2**14(SIN OF ANGLE)  : 2'S COMPLEMENT
                2364 ;*                "R0-R1-R2-R3" ARE DESTROYED
                2365 ;*
                2366 ;*        APPROX. EXECUTION TIME:  15 MSEC
                2367 ;*
                2368 ;*        NOTE:  ASSEMBLER MUST BE "ORGED" TO BEGINNING OF
                2369 ;*               PAGE FOR FOLLOWING CODE TO EXECUTE PROPERLY!!!
                2370 ;*
                2371 ;************************************************
                2372
0700            2373          ORG    0700H
                2374
0700 0000       2375 ARCTAN: DW     00000H    ; -0.0000 DEG   THIS
0702 D7FF       2376          DW     0D7FFH    ; -0.2238 DEG   TABLE
0704 AEFF       2377          DW     0AEFFH    ; -0.4480 DEG     IS
0706 5DFF       2378          DW     05DFFH    ; -0.8950 DEG      BYTE
0708 BAFE       2379          DW     0BAFEH    ; -1.7900 DEG       INVERTED -
070A 75FD       2380          DW     075FDH    ; -3.5760 DEG        LSD
070C EFFA       2381          DW     0EFFAH    ; -7.1250 DEG         THEN
070E 05F6       2382          DW     005F6H    ; -14.036 DEG          MSD
0710 1DED       2383          DW     01DEDH    ; -26.560 DEG
0712 00E0       2384          DW     000E0H    ; -45.000 DEG
```

| LOC OBJ | LINE | SOURCE STATEMENT | | | |
|---|---|---|---|---|---|
| | 2385 | | | | |
| | 2386 | | | | |
| 0714 B912 | 2387 | SINCOS: | MOV | R1,#18 | ;DATA POINTER & LOOP COUNT |
| 0716 B837 | 2388 | | MOV | R0,HRA+1 | |
| 0718 27 | 2389 | | CLR | A | |
| 0719 AD | 2390 | | MOV | R5,A | ; X = 0 |
| 071A AC | 2391 | | MOV | R4,A | |
| 071B BF26 | 2392 | | MOV | R7,#26H | ; Y = .6075364 |
| 071D BE2 | 2393 | | MOV | R6,#0E2H | |
| 071F F0 | 2394 | | MOV | A,@R0 | ;LOAD MSD OF ANGLE |
| 0720 F7 | 2395 | CSUB: | RLC | A | ;NEGATIVE |
| 0721 F64F | 2396 | | JC | ASUB | ;YES, ADD NEXT ANGLE |
| 0722 1482 | 2397 | | CALL | ISCNT | ;LOAD SHIFT COUNT (1 - 1) |
| 0725 FE | 2398 | | MOV | A,R6 | ; X = X(I-1) + Y(I-1)/(2**(I-1)) |
| 0726 2A | 2399 | | XCH | A,R2 | ;LOAD SHIFT REGISTER |
| 0727 FF | 2400 | | MOV | A,R7 | ; WITH Y VALUE |
| 0728 AB | 2401 | | MOV | R3,A | ; Y = R5-R4  SHFT REG = R3-R2 |
| 0729 F48A | 2402 | | CALL | SHFT | ; Y(I-1)/(2**(I-1)) |
| 072B F482 | 2403 | | CALL | ISCNT | ;RELOAD SHIFT COUNT |
| 072D FA | 2404 | | MOV | A,R2 | ;ADD |
| 072E 6C | 2405 | | ADD | A,R4 | ; LSD'S |
| 072F 2C | 2406 | | XCH | A,R4 | ; X = Y(I-1)/(2**(I-1)) |
| 0730 2A | 2407 | | XCH | A,R2 | ;MOVE LSD "X" INTO SHFT REG |
| 0731 2B | 2408 | | XCH | A,R3 | ;ADD |
| 0732 7D | 2409 | | ADDC | A,R5 | ; MSD'S |
| 0733 2D | 2410 | | XCH | A,R5 | ; X = Y(I-1)/(2**(I-1)) |
| 0734 AB | 2411 | | MOV | R3,A | ;MOVE MSD "X" INTO SHFT REG |
| 0735 F48A | 2412 | | CALL | SHFT | ;X(I-1)/(2**(I-1)) |
| 0737 97 | 2413 | | CLR | C | ;SET |
| 0738 A7 | 2414 | | CPL | C | ; CARRY FOR 2'S COMP. |
| 0739 FA | 2415 | | MOV | A,R2 | ;DO |
| 073A 37 | 2416 | | CPL | A | ; COMP. |
| 073B 7E | 2417 | | ADDC | A,R6 | ;SUBTRACT |
| 073C 2E | 2418 | | XCH | A,R6 | ; LSD'S |
| 073D 2B | 2419 | | XCH | A,R3 | ;LOAD AND |
| 073E 37 | 2420 | | CPL | A | ; 2'S COMPLEMENT |
| 073F 7F | 2421 | | ADDC | A,R7 | ;AND SUBTRACT MSD'S |
| 0740 2F | 2422 | | XCH | A,R7 | ; STORE MSD |
| 0741 8836 | 2423 | | MOV | R0,HRA | ;ANGLE = ANGLE + (-ARCTAN(1/2)**I) |
| 0743 F9 | 2424 | | MOV | A,R1 | ;LOAD ARC TAN POINTER |
| 0744 A3 | 2425 | | MOVP | A,@A | ;TABLE LOOK-UP |
| 0745 60 | 2426 | | ADD | A,@R0 | ;SUM ANGLES - LSD |
| 0746 20 | 2427 | | XCH | A,@R0 | ;REPLACE |
| 0747 18 | 2428 | | INC | R0 | ;POINT TO MSD ANGLE |
| 0748 F9 | 2429 | | MOV | A,R1 | |
| 0749 17 | 2430 | | INC | A | ;POINT TO MSD ARCTAN |
| 074A A3 | 2431 | | MOVP | A,@A | ;TABLE LOOK-UP |
| 074B 70 | 2432 | | ADDC | A,@R0 | ;SUM ANGLES - MSD |
| 074C A0 | 2433 | | MOV | @R0,A | ;MOVE MSD TO ANGLE / KEEP MSD IN "A" |
| 074D E47D | 2434 | | JMP | BSUB | |
| | 2435 | | | | |
| 074F F482 | 2436 | ASUB: | CALL | ISCNT | ;LOAD SHIFT COUNT |
| 0751 FC | 2437 | | MOV | A,R4 | ; Y = Y(I-1) + X(I-1)/(2**(I-1)) |
| 0752 2A | 2438 | | XCH | A,R2 | ;LOAD |
| 0753 FD | 2439 | | MOV | A,R5 | ; SHIFT REG |
| 0754 AB | 2440 | | MOV | R3,A | ; WITH X VALUE |
| 0755 F48A | 2441 | | CALL | SHFT | ; X(I-1)/(2**(I-1)) |
| 0757 F482 | 2442 | | CALL | ISCNT | ;RELOAD SHIFT COUNT |
| 0759 FA | 2443 | | MOV | A,R2 | ;ADD |
| 075A 6E | 2444 | | ADD | A,R6 | ; LSD'S |
| 075B 2E | 2445 | | XCH | A,R6 | ; Y = X(I-1)/(2**(I-1)) |
| 075C 2A | 2446 | | XCH | A,R2 | ;MOVE LSD Y INTO SHFT REG |
| 075D 2B | 2447 | | XCH | A,R3 | ;ADD |
| 075E 7F | 2448 | | ADDC | A,R7 | ; MSD'S |
| 075F 2F | 2449 | | XCH | A,R7 | ; Y + X(I-1)/(2**(I-1)) |
| 0760 AB | 2450 | | MOV | R3,A | ;MOVE MSD Y INTO SHFT REG |
| 0761 F48A | 2451 | | CALL | SHFT | ; Y(I-1)/(2**(I-1)) |
| 0763 97 | 2452 | | CLR | C | ;SET |
| 0764 A7 | 2453 | | CPL | C | ; CARRY FOR 2'S COMPLEMENT |
| 0765 FA | 2454 | | MOV | A,R2 | ;DO |
| 0766 37 | 2455 | | CPL | A | ; COMPLEMENT |
| 0767 7C | 2456 | | ADDC | A,R4 | ;SUBTRACT |
| 0768 2C | 2457 | | XCH | A,R4 | ; LSD'S |
| 0769 2B | 2458 | | XCH | A,R3 | ;LOAD AND |
| 076A 37 | 2459 | | CPL | A | ; 2'S COMPLEMENT |
| 076B 7D | 2460 | | ADDC | A,R5 | ;AND SUBTRACT MSD'S |
| 076C 2D | 2461 | | XCH | A,R5 | ;STORE MSD |

```
LOC   OBJ      LINE       SOURCE STATEMENT
760 BB36       2462           MOV    R0,#RA    ;ANGLE = ANGLE - (-ARCTAN(1/2)**I)
076F F9        2463           MOV    A,R1      ;LOAD ARCTAN POINTER
0770 A3        2464           MOVP   A,@A      ;TABLE LOOK-UP
0771 97        2465           CLR    C         ;SUM
0772 A7        2466           CPL    C         ;  ANGLES
0773 37        2467           CPL    A         ;   LSD
0774 70        2468           ADDC   A,@R0     ;    OF ANGLE
0775 20        2469           XCH    A,@R0     ;REPLACE
0776 18        2470           INC    R0        ;POINT TO MSD
0777 F9        2471           MOV    A,R1
0778 17        2472           INC    A         ;POINT TO MSD ARCTAN
0779 A3        2473           MOVP   A,@A      ;TABLE LOOK-UP
077A 37        2474           CPL    A         ;COMPLEMENT ANGLE
077B 70        2475           ADDC   A,@R0     ;SUM ANGLES - MSD
077C A0        2476           MOV    @R0,A     ;MOVE MSD TO ANGLE / KEEP MSD IN "A"
               2477
077D E97F      2478 BSUB:     DJNZ   R1,NEXT   ;INCREMENT
077F E920      2479 NEXT:     DJNZ   R1,CSUB   ;ANGLE POINTER
0781 83        2480           RET
               2481
0782 F9        2482 ISCNT:    MOV    A,R1      ;-R1/2 + 8 = R0 = I
0783 97        2483           CLR    C         ;"A"
0784 67        2484           RRC    A         ;  EQUALS -R1/2
0785 03F5      2485           ADD    A,#0F5H   ;ADD
0787 37        2486           CPL    A         ;  EIGHT
0788 A8        2487           MOV    R0,A      ;MOVE TO R0
0789 83        2488           RET
               2489
078A F7        2490 SHFT:     RLC    A         ;EXTEND
078B 27        2491           CLR    A         ;  THE SIGN
078C E699      2492           JNC    SHFT1     ;SIGN NEGATIVE ?
078E 23FF      2493           MOV    A,#0FFH   ;YES,SET UP "A"
0790 E499      2494           JMP    SHFT1
0792 67        2495 SHFT2:    RRC    A         ;THREE
0793 2B        2496           XCH    A,R3      ;  WORD
0794 67        2497           RRC    A         ;   RIGHT
0795 2A        2498           XCH    A,R2      ;    SHIFT
0796 67        2499           RRC    A         ;     A-R3-R2
0797 2A        2500           XCH    A,R2
0798 2B        2501           XCH    A,R3
0799 E892      2502 SHFT1:    DJNZ   R0,SHFT2  ; I = (I-1)
079B 83        2503           RET
               2504
               2505
               2506 ;************************************************
               2507 ;*
               2508 ;*   MOVE DATA ROUTINE :
               2509 ;*
               2510 ;*       ENTRY CONDITION(S):
               2511 ;*             "R0" = POINTS TO DATA TO BE MOVED
               2512 ;*             "R1" = POINTS TO WHERE DATA IS TO BE MOVED
               2513 ;*             "R3" = NO. OF BYTES TO BE MOVED
               2514 ;*
               2515 ;*       EXIT CONDITION(S):
               2516 ;*             "A" IS SAVED
               2517 ;*             "R1" = POINTS TO LAST STORED LOCATION + 1
               2518 ;*
               2519 ;************************************************
               2520
079C BB02      2521 MOVE2:    MOV    R3,#02    ;MOVE 2 BYTES ONLY
079E 21        2522 MOVE:     XCH    A,@R1     ;SAVE "A"
079F F0        2523           MOV    A,@R0     ;LOAD DATA TO BE MOVED
07A0 21        2524           XCH    A,@R1     ;MOVE DATA & RESTORE "A"
07A1 18        2525           INC    R0        ;INC DATA POINTER
07A2 19        2526           INC    R1        ;INC STORAGE POINTER
07A3 EB9E      2527           DJNZ   R3,MOVE   ;REPEAT UNTIL FINISHED
07A5 83        2528           RET
               2529
               2530
               2531 ;************************************************
               2532 ;*
               2533 ;*   DOUBLE PRECISION 2'S COMPLEMENT :
               2534 ;*
               2535 ;*       ENTRY CONDITION(S):
               2536 ;*             "R1" = POINTS TO LSD OF 16 BIT WORD TO
               2537 ;*                    BE 2'S COMPLEMENTED.
               2538 ;*
```

```
LOC  OBJ        LINE        SOURCE STATEMENT
                2539 ;*        EXIT  CONDITION(S):
                2540 ;*              "R1" = POINTS TO MSD OF 16 BIT WORD'S
                2541 ;*                     2'S COMPLEMENT.
                2542 ;*              "R0" IN = "R0" OUT
                2543 ;*
                2544 ;***********************************************
                2545
07A6 F1         2546 CMP2S:  MOV    A,@R1         ;LOAD LSD
07A7 37         2547        CPL    A             ;COMPLEMENT LSD
07A8 0301       2548        ADD    A,#01         ;ADD + 1
07AA A1         2549        MOV    @R1,A         ;STORE 2'S COMPLEMENT OF LSD
07AB 19         2550        INC    R1            ;POINT TO MSD
07AC F1         2551        MOV    A,@R1         ;LOAD MSD
07AD 37         2552        CPL    A             ;COMPLEMENT MSD
07AE 1300       2553        ADDC   A,#00         ;ADD CARRY TO COMPLEMENTED MSD
07B0 A1         2554        MOV    @R1,A         ;STORE MSD OF 2'S COMPLEMENT
07B1 83         2555        RET
                2556
                2557
                2558
                2559 ;***********************************************
                2560 ;*
                2561 ;*   24 BIT SQUARE ROOT :
                2562 ;*
                2563 ;*      THIS ROUTINE PROVIDES A 24 BIT SQUARE ROOT
                2564 ;*      AND RETURNS WITH A 16 BIT RESULT.
                2565 ;*
                2566 ;*              NOTE:  THIS ROUTINE MAY TAKE OVER 20MSEC
                2567 ;*                     TO EXECUTE!!!
                2568 ;*
                2569 ;*      ENTRY CONDITION(S):
                2570 ;*              "SQ" = 24 BIT NO. TO BE ROOTED (R0-LSD)
                2571 ;*
                2572 ;*      EXIT  CONDITION(S):
                2573 ;*              "RA" = 12 BIT SQUARE ROOT RESULT
                2574 ;*              "RB" IS DESTROYED (16 BITS)
                2575 ;*              "DEV" IS DESTROYED (16 BITS)
                2576 ;*              "R3" IS DESTROYED
                2577 ;*              "R4" IS DESTROYED (ICNT)
                2578 ;*
                2579 ;***********************************************
                2580
07B2 BC0C       2581 SQRT:   MOV    ICNT,#12      ;12 BITS OF RESOLUTION
07B4 27         2582        CLR    A
07B5 BB36       2583        MOV    R0,#RA        ;POINT TO "RA" LSD
07B7 A0         2584        MOV    @R0,A         ;CLEAR "RA" LSD
07B8 18         2585        INC    R0
07B9 A0         2586        MOV    @R0,A         ;CLEAR "RA" MSD
07BA 18         2587        INC    R0
07BB A0         2588        MOV    @R0,A         ;CLEAR "RB" LSD
07BC 18         2589        INC    R0
07BD A0         2590        MOV    @R0,A         ;CLEAR "RB" MSD
07BE 97         2591        CLR    C
07BF F4EC       2592 SQRT1:  CALL   RLSQRB        ;ROLL "SQ" & "RB" LEFT ONCE
07C1 F4EC       2593        CALL   RLSQRB        ;ROLL "SQ" & "RB" LEFT ONCE
07C3 B936       2594        MOV    R1,#RA
07C5 97         2595        CLR    C             ;SET UP FOR SHIFT
07C6 F4F8       2596        CALL   ROLDB         ;SHIFT "RC" LEFT ONCE
07C8 BB36       2597        MOV    R0,#RA
07CA B905       2598        MOV    R1,#DEV
07CC F49C       2599        CALL   MOVE2         ;STORE "RA" IN "DEV"
07CE B905       2600        MOV    R1,#DEV
07D0 97         2601        CLR    C             ;SET UP FOR SHIFT
07D1 F4F8       2602        CALL   ROLDB         ;SHIFT "DEV" LEFT ONCE
07D3 B805       2603        MOV    R0,#DEV
07D5 B938       2604        MOV    R1,#RB
07D7 D467       2605        CALL   COMPDB        ; [RB] <= [DEV] ?
07D9 E6F9       2606        JNC    SQRT2         ;YES, JUMP
07DB B836       2607        MOV    R0,#RA
07DD D49A       2608        CALL   INCDB         ;INCREMENT "RA"
07DF B805       2609        MOV    R0,#DEV
07E1 D49A       2610        CALL   INCDB         ;INCREMENT "DEV"
07E3 B805       2611        MOV    R0,#DEV
07E5 B938       2612        MOV    R1,#RB
07E7 D4A4       2613        CALL   SUBD2S        ; [RB] = [RB] - [DEV] ; RESULT ALWAYS POSITIVE
07E9 ECBF       2614 SQRT2:  DJNZ   ICNT,SQRT1    ;REPEAT 12 TIMES
07EB 83         2615        RET
                2616
                2617
```

```
LOC   OBJ        LINE      SOURCE STATEMENT
                 2618  ;*******************************************
                 2619  ;*
                 2620  ;*    ROLL LEFT ONCE/SHIFT LEFT ONCE :
                 2621  ;*
                 2622  ;*       1.  ENTRY AT "RLSQRB" WILL ROLL "SQ" AND "RB"
                 2623  ;*           LEFT ONCE WITH THE M.S. BIT OF "SQ" BEING
                 2624  ;*           ROLLED INTO "RB".
                 2625  ;*
                 2626  ;*           ENTRY CONDITION(S):  NONE
                 2627  ;*
                 2628  ;*       2.  ENTRY AT "ROLDB" WILL ROLL THE DOUBLE WORD
                 2629  ;*           LOCATION POINTED TO BY "R1" TO THE LEFT ONCE.
                 2630  ;*
                 2631  ;*           ENTRY CONDITION(S):
                 2632  ;*               "R1" = POINTS TO 16 BIT WORD TO BE SHIFTED
                 2633  ;*
                 2634  ;*       NOTE:  IF CARRY BIT IS CLEARED PRIOR TO CALLING
                 2635  ;*              "ROLDB", AN ARITHMATIC SHIFT LEFT ONCE IS
                 2636  ;*              EFFECTIVELY PERFORMED.
                 2637  ;*
                 2638  ;*******************************************
                 2639
07EC B938        2640  RLSQRB:  MOV    R1,#RB     ;POINT TO "RB"
07EE B83A        2641           MOV    R0,#SQ     ;POINT TO "SQ"
07F0 BB03        2642           MOV    R3,#3      ;"SQ" = 3 BYTES
07F2 20          2643  ROLSQ:   XCH    A,@R0      ;LOAD "SQ"
07F3 F7          2644           RLC    A          ;ROLL LEFT ONCE
07F4 20          2645           XCH    A,@R0      ;STORE "SQ"
07F5 18          2646           INC    R0         ;POINT TO NEXT "SQ" BYTE
07F6 EBF2        2647           DJNZ   R3,ROLSQ              ;REPEAT 3 TIMES
                 2648
07F8 21          2649  ROLDB:   XCH    A,@R1      ;POINT TO 16 BIT WORD LSD
07F9 F7          2650           RLC    A          ;ROLL LSD ONCE
07FA 21          2651           XCH    A,@R1      ;REPLACE
07FB 19          2652           INC    R1         ;POINT TO MSD
07FC 21          2653           XCH    A,@R1
07FD F7          2654           RLC    A          ;ROLL MSD ONCE
07FE 21          2655           XCH    A,@R1      ;REPLACE
07FF 83          2656           RET
                 2657
                 2658
                 2659  $EJECT
                 2660
00C5             2661           ORG    XRSFT+1            ;PAGE 0
                 2662
                 2663
                 2664  ;*******************************************
                 2665  ;*
                 2666  ;*    ENABLE SELECTED I/O DEVICE / READ SELECTED DEVICE CODE :
                 2667  ;*
                 2668  ;*       ENTRY CONDITION(S):
                 2669  ;*           "R2" = SELECTED DEVICE ADDRESS (BITS 2,3,4,6,7)
                 2670  ;*
                 2671  ;*       EXIT CONDITION(S):
                 2672  ;*           "A" = SELECTED DEVICE CODE
                 2673  ;*           "R2" IS SAVED
                 2674  ;*           "R5-R3" NOT USED
                 2675  ;*
                 2676  ;*
                 2677  ;*******************************************
                 2678
00C5 09          2679  IOSEL:   IN     A,P1
00C6 5323        2680           ANL    A,#00100011B
00C8 43C0        2681           ORL    A,#11000000B
00CA 39          2682           OUTL   P1,A       ;DISABLE ALL I/O DEVICES
00CB 27          2683           CLR    A
00CC 37          2684           CPL    A
00CD 3A          2685           OUTL   P2,A       ;SET PORT 2 OUTPUT LATCHES HIGH
00CE 14F5        2686           CALL   P2TEST
00D0 09          2687           IN     A,P1
00D1 0A          2688           XRL    A,R2
00D2 39          2689           OUTL   P1,A       ;ENABLE SELECTED I/O DEVICE
00D3 14EF        2690           CALL   P1TEST
00D5 0A          2691           IN     A,P2       ;READ SELECTED DEVICE CODE
00D6 83          2692           RET
                 2693
```

```
LOC   OBJ       LINE       SOURCE STATEMENT
                2694 ;*************************************************
                2695 ;*
                2696 ;*    TEST SELECTED SWITCH POSITION CODE :
                2697 ;*
                2698 ;*        ENTRY CONDITION(S):
                2699 ;*                "A"  = SWITCH POSITION CODE
                2700 ;*                "R1" = SWITCH LEGAL LIMIT(COMPLEMENT + 1)
                2701 ;*                "R4" = SWITCH ALERT CODE
                2702 ;*
                2703 ;*        EXIT CONDITION(S):
                2704 ;*                "A"  = LEGAL SWITCH POSITION CODE = "R3"
                2705 ;*                "R0-R1-R6-R7" ARE DESTROYED
                2706 ;*
                2707 ;*************************************************
                2708
00D7 AB         2709 SWTEST: MOV     R3,A        ;SAVE "A"
00D8 69         2710         ADD     A,R1        ;LEGAL SW. CODE ?
00D9 F6E0       2711         JC      LEGAL       ;YES, JMP
00DB D4F2       2712         CALL    ALERT0      ;NO, CODE ALERT
00DD 27         2713         CLR     A
00DE 37         2714         CPL     A           ;LOAD DEFAULT CODE (MIN SW. POS)
00DF AB         2715         MOV     R3,A
00E0 FB         2716 LEGAL:  MOV     A,R3        ;RESTORE "A"
00E1 83         2717         RET
                2718
                2719 ;*************************************************
                2720 ;*
                2721 ;*    ENCODE SWITCH POSITION VALUE :
                2722 ;*
                2723 ;*        ENTRY CONDITION(S):
                2724 ;*                "A"  = LEGAL POSITION CODE
                2725 ;*                "R1" = SWITCH LEGAL LIMIT (COMPLEMENT + 1)
                2726 ;*                "R2" = NO. BITS/STEP (STEP WEIGHT)
                2727 ;*                "R4" = SWITCH ALERT NO.
                2728 ;*                "R5" = BASE VALUE OF SELECTED SWITCH
                2729 ;*                       FUNCTION (MIN SETPOINT)
                2730 ;*
                2731 ;*        EXIT CONDITION(S):
                2732 ;*                "R7-R6-R5" = SELECTED SWITCH POSITION VALUE
                2733 ;*
                2734 ;*                "R3" IS SAVED FOR "SWCODX" ENTRY ONLY
                2735 ;*
                2736 ;*************************************************
                2737
00E2 14D7       2738 SWCODE: CALL    SWTEST      ;TEST VALID POS. CODE
00E4 17         2739 SWCODX: INC     A           ;SELECTED SW. POSITION REACHED ?
00E5 C6EC       2740         JZ      SWCTRI      ;YES, EXIT (A = 0)
00E7 2D         2741         XCH     A,R5
00E8 6A         2742         ADD     A,R2        ;INCREMENT SW. VALUE TO NEXT POSITION
00E9 2D         2743         XCH     A,R5
00EA 04E4       2744         JMP     SWCODX
00EC AE         2745 SWCTRI: MOV     R6,A        ;SET UP FOR CALL
00ED AF         2746         MOV     R7,A        ;  TO "LSHIFT"
00EE 83         2747 XSWCOD: RET
                2748
06F2            2749         ORG     XTR65R+1    ;PAGE 6
                2750
                2751 ;*************************************************
                2752 ;*
                2753 ;*    SET SELECTED ALERT CODE BIT & SYSTEM ALERT BIT :
                2754 ;*
                2755 ;*        ENTRY CONDITION(S):
                2756 ;*                "R4" = ALERT CODE
                2757 ;*
                2758 ;*        EXIT CONDITION(S):
                2759 ;*                "R0" = POINTS TO "TALERT" STATUS
                2760 ;*                "R0-R1-R6-R7" ARE DESTROYED
                2761 ;*
                2762 ;*************************************************
                2763
                2764
06F2 B832       2765 ALERT0: MOV     R0,#ALERT   ;POINT TO ALERT WORD LSD
06F4 C4F8       2766         JMP     CALERT
                2767
06F6 B833       2768 ALERT1: MOV     R0,#ALERT+1 ;POINT TO ALERT WORD MSD
06F8 F0         2769 CALERT: MOV     A,@R0
```

```
LOC  OBJ      LINE         SOURCE STATEMENT

06F9 4C       2770         ORL     A,R4
06FA A0       2771         MOV     @R0,A           ;UPDATE ALERT WORD
06FB B82F     2772         MOV     R0,#TALERT
06FD B087     2773         MOV     @R0,#10000111B  ;TRIGGER SYSTEM ALERT TIMER
              2774                                 ;(LATCHES "ALERT" LED ON FOR 7 PASSES)
06FF 83       2775         RET
              2776
00EF          2777         ORG     XSWCOD+1        ;PAGE 0
              2778
              2779 ;*********************************************
              2780 ;*
              2781 ;*   PORT 1 AND PORT 2 OUTPUT STATUS TESTS :
              2782 ;*
              2783 ;*      ONE OF THE FOLLOWING TWO ROUTINES IS CALLED IMMEDIATELY
              2784 ;*      FOLLOWING AN "OUTL" TO P1 OR P2 TO VERIFY THE LATCHED
              2785 ;*      OUTPUT STATUS OF THESE PORTS.
              2786 ;*
              2787 ;*   ENTRY CONDITON(S):
              2788 ;*            "A" = DESIRED PORT OUTPUT STATUS
              2789 ;*
              2790 ;*   EXIT CONDITION(S):
              2791 ;*            "R0-R1-R4-R6-R7" ARE DESTROYED
              2792 ;*
              2793 ;*********************************************
              2794
00EF A8       2795 P1TEST: MOV     R0,A
00F0 09       2796         IN      A,P1            ;READ LATCHED PORT 1 STATUS
00F1 BC02     2797         MOV     R4,#00000010B   ;ALERT PORT 1 CODE
00F3 04F9     2798         JMP     PTEST
              2799
00F5 A8       2800 P2TEST: MOV     R0,A
00F6 0A       2801         IN      A,P2            ;READ LATCHED PORT 2 STATUS
00F7 BC04     2802         MOV     R4,#00000100B   ;ALERT PORT 2 CODE
              2803
00F9 D8       2804 PTEST:  XRL     A,R0
00FA C6FE     2805         JZ      POK             ;YES, JMP
00FC D4F6     2806         CALL    ALERT1          ;NO, SET ALERT BIT & ENABLE ALERT LITE
00FE 83       2807 POK:    RET
              2808
              2809         END
```

What is claimed is:

1. A method for monitoring instantaneous electrical parameters being present in a circuit of a power distribution system under load, the method utilizing digital control means adapted to be connected to said circuit and including the steps of:
   (a) sensing the present load condition of the circuit and deriving an equivalent analog signal constituting one electrical characteristic of the electromotive power present in said circuit;
   (b) rating down said analog signal to a range suitable for processing by an integrated electronic circuit;
   (c) converting the rated analog signal into a binary coded digital signal comprising a value of n digits;
   (d) sampling a plurality of subsequent binary digital signals during a sampling period;
   (e) deriving from each of the sampled digital signals a respective squared value with a format of 2n digits and accumulating each respective squared value obtained during one sampling period of a sum value composed of 2n+m digits;
   (f) forming a square root value of said sum value, said square root value comprising n+k digits; and
   (g) rescaling said square root value to a true root means square value by performing k left shifts on the square root value and storing said true root mean square value,
whereby the rescaled value represents an accurate measurement of said electrical characteristic.

2. The method as recited in claim 1, wherein said electrical characteristic comprises the magnitude of the potential being present at said electrical circuit.

3. The method as recited in claim 2, wherein a second electrical characteristic comprises the magnitude of the electrical load current present on said electrical circuit and the series of steps (a) through (g) is alternatively executed with respect to a respective one of these characteristics.

4. The method as recited in claim 3, wherein said digital signal is provided in a format of an 8 bit word and accordingly the values derived therefrom are based on an 8 bit format with variable n equaling the number 8 and variables k and m being integers smaller than n and wherein said method further comprises the step of extending the sum value obtained by step (e) to a full word format by means of multiplying the sum value to result in an extended sum value with variable m equaling the number 8 and correspondingly variable k of said square root value obtained in step (f) performed thereafter comprises the number 4.

5. The method as recited in claim 4, after executing steps (a) through (g) further comprising the step of:
   (h) deriving a digital encoded offset signal being equivalent to an analog zero value; adding said offset signal with the appropriate sign to the stored true root mean square value and restoring the resulting corrected root means square value.

6. The method as recited in claim 5, after executing steps (a) through (h) further comprising the step of:

(i) obtaining a refined true root mean square value by forming an average value of said corrected root mean square value obtained during sampling period and of the respective corrected root mean square value obtained during a previous sampling period.

7. The method as recited in claim 6, for use with monitoring load conditions of a power line wherein the series of steps (a) through (i) is continuously repeated in subsequent sampling periods for obtaining the corrected average value of at least one electrical characteristic; updating the respective corrected average value by storing the latest result; and selectively retrieving the respective stored value for display.

8. The method as recited in claim 6, for use with voltage regulating means of a power distribution system wherein said electrical circuit includes a voltage regulator having inputs connected to a power line, outputs connected to a distribution line and control inputs for receiving control signals for readjusting a predetermined magnitude of the output voltage in dependence upon the present actual magnitude of the output voltage, said method further comprising the steps of:

comparing the stored value constituting the instantaneous magnitude of the output voltage with a predetermined nominal output voltage value; and deriving respective controls signals for stepwise lowering the magnitude of the output voltage if the actual output voltage is above said nominal value and for stepwise raising the magnitude of the output voltage, respectively if the actual output voltage is below said nominal value.

9. The method as recited in claim 8, wherein said control signals become effective only if the magnitude of the actual output voltage lies outside of the predetermined small bandwidth centered around the nominal value.

10. An electronic device for monitoring instantaneous electrical parameters being present in an electrical circuit of a power distribution system under load and being adapted to be connected to the electrical circuit for sensing the present load condition of the same, said monitoring device comprising:

means for sensing the present load condition of the electrical circuit and deriving an equivalent analog signal constituting one electrical characteristic of the electro-motive power present in the electrical circuit;

conditioning means for converting said analog signal into a rated analog signal of a range suitable for use with electronic solid state components;

means for converting the rated analog signal into a binary coded digital signal comprising a value of n digits;

means for sampling a plurality of subsequent binary digital signals during a sampling period;

means for deriving from each of the sampled digital signals a respective squared value having a format of 2n digits and for accumulating each respective squared value obtained during one sampling period to a sum value composed of 2n+m digits;

means for forming a square root value of said sum value, said square root value comprising n+K digits; and means for rescaling said square root value to a true root means square value by performing k left shifts on the square root value and storing the true root means square value, whereby the rescaled value represents an accurate measurement of said electrical characteristic.

11. The monitoring device as recited in claim 10, wherein said means for converting the rated analog signal, said sampling means, said means for deriving squared values and for accumulating squared values to a sum value, said means for forming a square root value and said means for rescaling the squared root value comprise an 8 bit microcomputer having an analog input and outputs, said analog input being connected to receive said rated analog signal, and wherein converting means comprise an analog to digital converter being integrated into said microcomputer.

12. The monitoring device as recited in claim 11, wherein said sensing means further comprise a scaling potential transformer connected in parallel to said electrical circuit for sensing the magnitude of the voltage present at the parallel connection, and a scaling current transformer connected series with said electrical circuit for sensing the current flowing through said electrical circuit; and wherein said conditioning means include a voltage signal conditioning circuit and a current signal conditioning circuit each having inputs connected to a respective one of said scaling transformers and having outputs.

13. The monitoring device as recited in claim 12, wherein said micrcomputer includes two alternatively selectable analog signal inputs each designed for selectively through connecting a respective one of the outputs of said conditioning circuits to said analog to digital converter having internal converter outputs;

an 8-bit internal bus and three input/output ports, said internal bus being connected to said input/output ports and said converter outputs; and an internal timer designed to initiate timer interrupts defining a task interval between subsequent interrupts;

whereby the microcomputer is controlled to successively execute different tasks during subsequent task intervals.

14. The monitoring device as recited in claim 13 further comprising a watch dog circuit connected to receive a refresh signal periodically issued by the microcomputer during normal operation, said watch dog circuit being designed to generate a reset signal furnished to the microcomputer after lapse of the normal time period between two subsequent refresh signals whereby a disruption of the normal operating condition of the microcomputer is indicated.

15. The monitoring device as recited in claim 14 further comprising a power supply network including a rectifier bridge having inputs connected to respective outputs of one of said scaling transformers and having an output furnishing an unregulated direct current supply voltage, a regulating circuit having an input connected to said rectifier bridge output and an output furnishing a regulated direct current voltage; and filter capacitors arranged between ground and said input and said output, respectively of said regulating circuit.

16. The monitoring device as recited in claim 15, wherein said conditioning means comprise:

a precision full bridge rectifier having inputs connected to receive said equivalent analog signal and having an output;

a resistor arranged between said precision rectifier output and the analog input of the microcomputer; and a clamping network including a pair of clamping diodes each connected with opposite polarity between said analog input and ground and regulated supply voltage, respectively.

17. The monitoring device as recited in claim 16, wherein said precision full bridge rectifier of said conditioning means comprises:
   an operational amplifier having a postive input connected to ground, a negative input connected to said scaling potential transformer, and an output;
   a further diode connected between said amplifier output and said position rectifier output; and
   a feedback network including a first precision resistor arranged between said precision rectifier output and said negative amplifier input and including a further precision resistor arrangement connected between said precision rectifier output and ground.

18. The monitoring device as recited in claim 17, wherein said microcomputer further includes a test input and an internal alternate current zero cross detection unit connected thereto, and said conditioning means further comprise a zero cross converter network having an input connected to a respective one of said scaling transformers and an output connected to said microcomputer test input.

19. The monitoring device as recited in claim 18, wherein said zero cross converter network comprises:
   a further operational amplifier having a negative input, a positive input and an output forming the output of said zero cross converter network;
   a further resistor arranged between the input of said zero cross converter network and said negative input of said further operational amplifier;
   a further pair of clamping diodes arranged in anti-parallel between said negative input of said further operational amplifier and ground;
   a bias resistor network connected to said positive input of said further operational amplifier and including a feedback resistor connected to said operational amplifier output and a further resistor connected to ground; and
   a load resistor arranged between said output of said further operational amplifier and positive regulated supply voltage.

20. The monitoring device as reicted in claim 19, suitable for use as a control unit of a step-voltage regulator designed for maintaining predetermined characteristics of a distribution line of a power distribution system independent from changing load conditions, said monitoring device further comprising a control parameter switch arrangement including a series of parameter switches designed as multi-stage switches each having an input and binary coded outputs and each designed to be independently set to a specific step value within a predetermined range, said parameter switches determining selected values of a group of control parameters, wherein each of said switches is separately activated by said microcomputer by selecting the respective switch input, and the outputs of said parameter switches are connectred in parallel to one input/output port of the microcomputer.

21. The monitoring device as recited in claim 20, further comprising a parameter selector unit in form of a binary decoder having coded inputs connected to respective lines of one of the input/output ports of the microcomputer and outputs each connected to a respective one of said parameters switch inputs.

22. The monitoring device as recited in claim 21, wherein said output means being connected to said first input/output port of the microcomputer further comprise:
   a multiple driver unit including individual driver stages each having an input connected to a respective line of the first input/output port and an output providing a power output signal;
   a display section having indicator elements each connected to a respective driver output for displaying in-range and out-off-range conditions on the distribution line in dependence upon said measured electrical characteristics; and
   control elements providing steering signals for the step voltage regulator, each of said control elements being connected to a respective one of said driver outputs and being selectively activated thereby by means of a respective power output signal.

23. The monitoring device as recited in claim 22, wherein the second input/output port of the microcomputer besides being associated with the parameter selector unit is utilized as an external bus suitable for connection with an add-on unit designed for displaying numerical values of said measured electrical characteristics and derived from said characteristics, respectively.

* * * * *